United States Patent
Itakura et al.

(10) Patent No.: US 9,787,284 B2
(45) Date of Patent: Oct. 10, 2017

(54) WAVEFORM SHAPING FILTER AND RADIATION DETECTION DEVICE

(71) Applicant: KABUSHIKI KAISHA TOSHIBA, Tokyo (JP)

(72) Inventors: Tetsuro Itakura, Tokyo (JP); Masanori Furuta, Kanagawa (JP); Shunsuke Kimura, Kanagawa (JP); Hideyuki Funaki, Tokyo (JP); Go Kawata, Kanagawa (JP); Hirokatsu Shirahama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/000,479

(22) Filed: Jan. 19, 2016

(65) Prior Publication Data
US 2016/0211830 A1    Jul. 21, 2016

(30) Foreign Application Priority Data

Jan. 20, 2015  (JP) .................................. 2015-008729
Sep. 15, 2015  (JP) .................................. 2015-182030

(51) Int. Cl.
| H03H 11/12 | (2006.01) |
| G01T 1/208 | (2006.01) |
| G01T 1/20  | (2006.01) |

(52) U.S. Cl.
CPC ......... *H03H 11/1213* (2013.01); *G01T 1/208* (2013.01); *G01T 1/2018* (2013.01)

(58) Field of Classification Search
USPC ................. 327/310–311, 313, 551–553, 558
See application file for complete search history.

(56) References Cited

U.S. PATENT DOCUMENTS

| 4,877,979 A * | 10/1989 | Sempel .................. H03H 11/34 327/555 |
| 5,900,765 A * | 5/1999 | Kawasaki ............... H03F 1/301 327/362 |

(Continued)

FOREIGN PATENT DOCUMENTS

| JP | 9-139638   | 5/1997  |
| JP | 2001-274641 | 10/2001 |

(Continued)

OTHER PUBLICATIONS

Kandasamy, A., et al., "A Monolithic Preamplifier-Shaper for Measurement of Energy Loss and Transition Radiation" IEEE Transaction on Nuclear Science, vol. 46, No. 3, pp. 150-155 (Jun. 1999).

(Continued)

*Primary Examiner* — An Luu
(74) *Attorney, Agent, or Firm* — Finnegan, Henderson, Farabow, Garrett & Dunner, L.L.P.

(57) ABSTRACT

A waveform shaping filter according to one embodiment includes a first resistor, a first transistor, a first capacitor, and a first amplifier. The first resistor includes one end to which a signal current is input and the other end. The first transistor includes a first terminal connected to the other end of the first resistor, a second terminal, and a control terminal. The first capacitor includes one end connected to the other end of the first resistor and the other end. The first amplifier includes an input terminal connected to the one end of the first resistor and an output terminal connected to the control terminal of the first transistor.

31 Claims, 46 Drawing Sheets

(56) References Cited

U.S. PATENT DOCUMENTS

| | | | |
|---|---|---|---|
| 5,986,507 A | 11/1999 | Itakura et al. | |
| 6,225,859 B1 * | 5/2001 | Irvine | H03H 11/04 327/552 |
| 6,552,611 B2 | 4/2003 | Yamamoto | |
| 6,593,797 B1 * | 7/2003 | Sowlati | H03F 3/19 327/310 |
| 7,425,870 B2 | 9/2008 | Niki et al. | |
| 8,278,963 B2 * | 10/2012 | Rabjohn | G01R 21/12 324/123 R |
| 2015/0263679 A1 | 9/2015 | Itakura et al. | |
| 2015/0270840 A1 | 9/2015 | Itakura et al. | |

FOREIGN PATENT DOCUMENTS

| | | |
|---|---|---|
| JP | 2006-254118 | 9/2006 |
| JP | 2015-177193 | 10/2015 |
| JP | 2015-194457 | 10/2015 |

OTHER PUBLICATIONS

Boie, R.A., et al., "Signal Shaping and Tall Cancellation for Gas Proportional Detectors at High Counting Rates", IEEE Transaction on Nuclear Science, vol. NS-28, No. 1, pp. 603-809 (Feb. 1981).

Cristen, T., "A 15-bit 140μ W Scalabie-Bandwidth Inverter-Based ΔΣ Modulator for a MEMS Microphone With Digital Output", IEEE JSSC, vol. 48, No. 7, pp. 1605-1614 (Jul. 2013).

Peluso, V., et el., "A 900-mV Low-Power ΔΣ A/D Converter with 77-dB Dynamic Range", IEEE JSSC, vol. 33, No. 12, pp. 1887-1897 (Dec. 1998).

* cited by examiner

WAVEFORM SHAPING FILTER AND RADIATION DETECTION DEVICE

CROSS REFERENCE TO RELATED APPLICATIONS

This application is based upon and claims the benefit of priority from the prior Japanese Patent Application No. 2015-008729, filed on Jan. 20, 2015, and the prior Japanese Patent Application No. 2015-182030, filed on Sep. 15, 2015, the entire contents all of which are incorporated herein by reference.

FIELD

Embodiments described herein relate generally to a waveform shaping filter and a radiation detection device.

BACKGROUND

Generally, a radiation detector has a low-pass characteristic. For this reason, a signal pulse that is dulled is output from such a radiation detector. Thus, conventionally, in order to suppress the dulling of a signal pulse output from such a radiation detector, a waveform shaping filter is used.

DETAILED DESCRIPTION

Embodiments will now be explained with reference to the accompanying drawings. The present invention is not limited to the embodiments.

A waveform shaping filter according to one embodiment includes: a first resistor; a first transistor; a first capacitor; and a first amplifier. The first resistor includes one end to which a signal current is input and the other end. The first transistor includes: a first terminal connected to the other end of the first resistor; a second terminal; and a control terminal. The first capacitor includes one end connected to the other end of the first resistor and the other end. The first amplifier includes: an input terminal connected to the one end of the first resistor; and an output terminal connected to the control terminal of the first transistor.

First Embodiment

Figure 1:
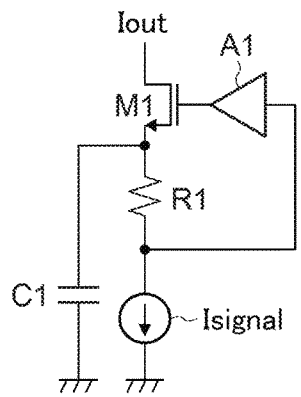
FIG. 1 is a diagram that illustrates a waveform shaping filter according to a first embodiment.

A waveform shaping filter according to a first embodiment will be described with reference to FIGS. 1 to 4. FIG. 1 is a diagram that illustrates the waveform shaping filter according to this embodiment. As illustrated in FIG. 1, the waveform shaping filter according to this embodiment includes: a resistor R1; a transistor M1; a capacitor C1; and an amplifier A1. A current source Isignal illustrated in FIG. 1 is a current source that inputs a signal current Isignal to the waveform shaping filter.

The resistor R1 (first resistor) includes one end and the other end. The one end of the resistor R1 is connected to an input terminal of the amplifier A1 and the current source Isignal. Accordingly, an input current Isignal is input to the resistor R1 from the one end. The other end of the resistor R1 is connected to a source terminal of the transistor M1 and one end of the capacitor C1.

The transistor M1 (first transistor) is an N-channel MOS transistor (hereinafter, referred to as "NMOS") and includes a source terminal (first terminal), a gate terminal (control terminal), and a drain terminal (second terminal). The source terminal is connected to the other end of the resistor R1 and the one end of the capacitor C1. The gate terminal is connected to an output terminal of the amplifier A1. The transistor M1 outputs an output current Iout from a drain terminal.

The capacitor C1 (first capacitor) includes the one end and the other end. The one end of the capacitor C1 is connected to the other end of the resistor R1 and the source terminal of the transistor M1. The other end of the capacitor C1 is grounded. Here, being grounded represents being connected to a ground line (first reference voltage line).

The amplifier A1 (first amplifier) is an inverting amplifier and includes an input terminal and an output terminal. The input terminal is connected to the one end of the resistor R1 and the current source Isignal. Accordingly, the signal current Isignal or the terminal voltage of the one end of the resistor R1 is input to the amplifier A1 from the input terminal. The output terminal is connected to the gate terminal of the transistor M1.

Next, the operation of the waveform shaping filter according to this embodiment will be described.

As described above, the waveform shaping filter has a configuration in which the output of the amplifier A1 is fed back to the amplifier A1 through the transistor M1 and the resistor R1. For this reason, the input terminal of the amplifier A1 becomes a virtual grounding point, and a voltage thereof is approximately constant.

At this time, the input impedance of the waveform shaping filter seen from the current source Isignal is $(1+gm1 \times R1)/\{gm1(1+A1)\}$ in a case where the amplifier A1 is a voltage input type. Here, gm1 is the transconductance of the transistor M1, and A1 is the gain of the amplifier A1. Generally, since the gain of the amplifier A1 is very high, the input impedance of the waveform shaping filter is very low.

For this reason, when the signal current Isignal is input from the current source Isignal, the signal current Isignal flows through the resistor R1, and a voltage of Isignal×R1 is generated at the source terminal of the transistor M1. Here, Isignal is a current value of the signal current Isignal, and R1 is a resistance value of the resistor R1.

As the voltage is generated at the source terminal of the transistor M1, a current Isignal×R1×sC1 that is proportional to the time differentiation of the signal current Isignal flows through the capacitor C1. Here, s is a Laplace variable, and C1 is a capacitance value of the capacitor C1.

As a result, a current of Isignal×(1+sC1×R1) that is a sum of Isignal and Isignal×R1×sC1 flows through the transistor M1, and this current is output from the drain terminal as an output current Iout.

As described above, the waveform shaping filter according to this embodiment outputs a current acquired by superimposing a differentiation component of the signal current Isignal on the input signal current Isignal. Accordingly, a filter characteristic enhancing a high-frequency component of the signal current Isignal can be realized.

In this embodiment, the load of the amplifier A1 is only the gate of the transistor M1. The gate can be approximated as a small capacitive load. Accordingly, the current driving capacity of the amplifier A1 does not need to be raised, and the power consumption of the waveform shaping filter can be reduced.

It is preferable that the waveform shaping filter has the same time constant as the time constant of the low-pass characteristic of the signal current Isignal. In the case of this embodiment, the time constant of the waveform shaping filter is C1×R1. In this way, by eliminating the low-pass characteristic from the signal current Isignal, the pulse width can be narrowed.

First Example

Figure 2:
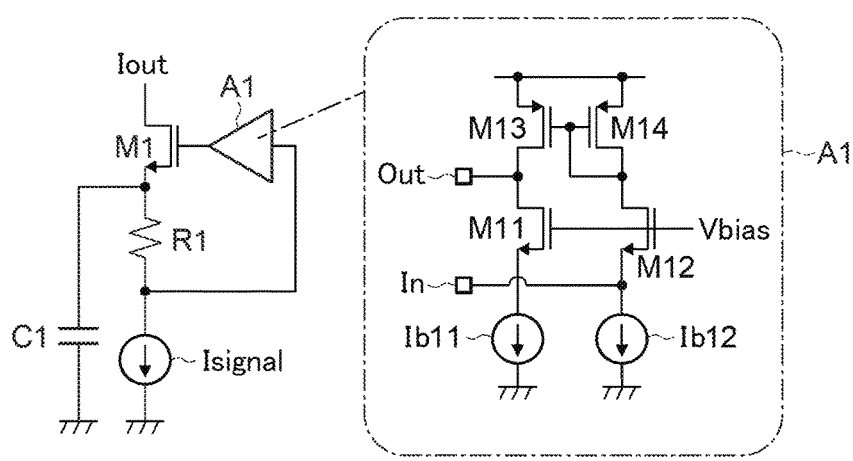
FIG. 2 is a diagram that illustrates a first example of the waveform shaping filter illustrated in FIG. 1.

FIG. 2 is a diagram that illustrates a first example of the waveform shaping filter according to this embodiment. In this example, an amplifier A1 is an amplifier of a current input type. As illustrated in FIG. 2, the amplifier A1 includes transistors M11, M12, M13, and M14 and current sources Ib11 and Ib12.

The transistor M11 is an NMOS that includes a source terminal, a gate terminal, and a drain terminal. The source terminal of the transistor M11 is connected to the current source Ib11, the drain terminal is connected to a drain terminal of the transistor M13 and an output terminal Out of the amplifier A1, and the gate terminal is applied with a predetermined bias voltage Vbias.

The transistor M12 is an NMOS that includes a source terminal, a gate terminal, and a drain terminal. The source terminal of the transistor M12 is connected to the current source Ib12 and an input terminal In of the amplifier A1, the drain terminal is connected to a drain terminal of the transistor M14 and gate terminals of the transistors M13 and M14, and the gate terminal is applied with a predetermined bias voltage Vbias.

The transistor M13 is a P-channel MOS transistor (hereinafter, referred to as a "PMOS") that includes a source terminal, a gate terminal, and a drain terminal. The source terminal of the transistor M13 is connected to a power source, the drain terminal is connected to a drain terminal of the transistor M11 and the output terminal Out of the amplifier A1, and the gate terminal is connected to a gate terminal and the drain terminal of the transistor M14 and a drain terminal of the transistor M12.

The transistor M14 is a PMOS that includes a source terminal, a gate terminal, and a drain terminal. The source terminal of the transistor M14 is connected to a power source, the drain terminal is connected to gate terminals of the transistors M13 and M14 and the drain of the transistor M12, and the gate terminal is connected to the gate terminal of the transistor M13 and the drain terminal of the transistor M14.

The current source Ib11 supplies a predetermined bias current Ib11 to the transistor M11. The current source Ib12 supplies a predetermined bias current Ib12 to the transistor M12.

Next, the operation of this amplifier A1 will be described. Hereinafter, it is assumed that the sizes of the transistors M11 and M12 are the same, the sizes of the transistors M13 and M14 are the same, and the current values of the bias currents Ib11 and Ib12 are the same as Ib1 (Ib11=Ib12=Ib1).

When a current $\Delta I$ is supplied from the input terminal In of the amplifier A1, a current of $\Delta I + Ib1$ flows through the transistors M12 and M14. This current is turned back by a current mirror circuit that is configured by the transistors M13 and M14. Accordingly, a current of $\Delta I + Ib1$ flows through the transistor M13.

In contrast to this, only the bias current Ib1 supplied from the current source Ib11 flows through the transistor M11.

In a case where $\Delta I > 0$, in other words, in a case where the voltage of the input terminal In of the amplifier A1 decreases, and a current flows from the input terminal In to the one end side of the resistor R1, a current supplied from the drain terminal of the transistor M13 becomes higher than a current drawn from the drain terminal of the transistor M11, and accordingly, the gate voltage of the transistor M1 connected to the output terminal Out increases.

In a case where the gate voltage of the transistor M1 increases, the source voltage of the transistor M1 increases, and the voltage (the voltage of the input terminal In of the amplifier A1) of one end of the resistor R1 increases. Accordingly, feedback is applied such that the current $\Delta I$ becomes zero, and the source voltage (the voltage of the input terminal In of the amplifier A1) of the transistor M12 is approximately the same as the source voltage of the transistor M11.

On the other hand, in a case where $\Delta I < 0$, in other words, in a case where the voltage of the input terminal In of the amplifier A1 increases, and a current flows from one end of the resistor R1 to the input terminal In side, a current supplied from the drain terminal of the transistor M13 becomes lower than a current drawn from the drain terminal of the transistor M11, and accordingly, the gate voltage of the transistor M1 connected to the output terminal Out decreases.

When the gate voltage of the transistor M1 decreases, the source voltage of the transistor M1 decreases, and the voltage (the voltage of the input terminal In of the amplifier A1) of one end of the resistor R1 decreases. Accordingly, feedback is applied such that the current $\Delta I$ becomes zero, and the source voltage (the voltage of the input terminal In of the amplifier A1) of the transistor M12 becomes approximately the same as the source voltage of the transistor M11.

Accordingly, the input terminal In of the amplifier A1, as described above, becomes the virtual grounding point, and the voltage is approximately constant. Thus, the waveform shaping filter can be operated as described above.

As described above, as the amplifier A1, an amplifier of the current input type may be used. In a case where the amplifier A1 of the current input type is used, the input impedance of the single body of the amplifier A1 is 1/gm12, and the input impedance of the waveform shaping filter seen from the current source Isignal is $(1+gm1 \times R1)/\{gm1(1+A1)+gm12(1+gm1 \times R1)\}$. Here, gm12 is the transconductance of the transistor M12.

Thus, by using the amplifier A1 of the current input type, the input impedance of the waveform shaping filter is less than that of a case where an amplifier A1 of a voltage input type is used, and variations in the voltage of the input terminal In of the amplifier A1 can be suppressed. Accordingly, an error in the output current Iout due to variations in the input voltage of the waveform shaping filter can be decreased.

Second Example

Figure 3:
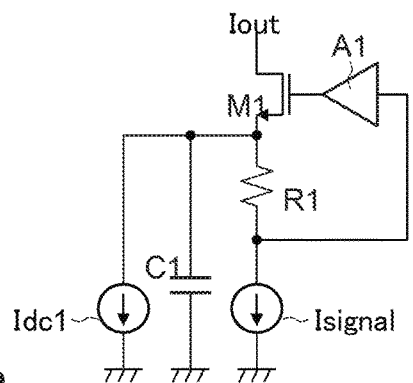
FIG. 3 is a diagram that illustrates a second example of the waveform shaping filter illustrated in FIG. 1.

FIG. 3 is a diagram that illustrates a second example of the waveform shaping filter according to this embodiment. In this example, the waveform shaping filter further includes a current source Idc1. The other configurations are similar to those illustrated in FIG. 1.

The current source Idc1 (first current source) is a DC current source that includes one end and the other end. The one end of the current source Idc1 is connected to the other end of the resistor R1, the source terminal of the transistor M1, and one end of the capacitor C1. In the configuration illustrated in FIG. 3, while the other end of the current source Idc1 is grounded, it may be connected to a power source. The current source Idc1 supplies an arbitrary DC current Idc1 that causes the transistor M1 to be in the On state.

By employing such a configuration, according to this example, the response speed of a case where a pulse signal current Isignal is input to the waveform shaping filter is input can be improved. The reason for this is as follows.

The pulse signal current Isignal is a current acquired by superimposing a pulse input signal (high-frequency component) on a bias current. Thus, in a case where no incoming input signal, only the bias current is input to the waveform shaping filter as the signal current Isignal. For this reason, in a case where the bias current is low, there is concern that the transistor M1 is not sufficiently on until there is an incoming input signal. When an input signal arrives at such a transistor M1, the response is delayed.

However, like this example, by causing the transistor M1 to be in the On state in advance by using the current source Idc1, the delay described above is suppressed, and the response speed for an input signal can be improved.

Third Example

Figure 4:
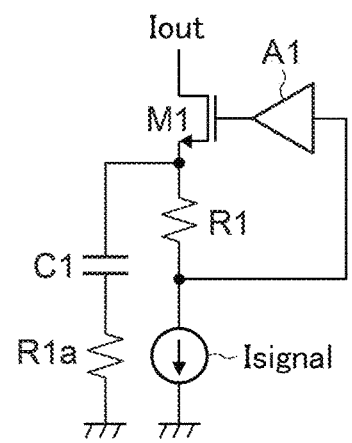
FIG. 4 is a diagram that illustrates a third example of the waveform shaping filter illustrated in FIG. 1.

FIG. 4 is a diagram that illustrates a third example of the waveform shaping filter according to this embodiment. In this example, the waveform shaping filter further includes a resistor R1$a$. The other configurations are similar to those illustrated in FIG. 1.

The resistor R1$a$ (second resistor) includes one end and the other end. One end of the resistor R1$a$ is connected to the other end of the capacitor C1, and the other end of the resistor R1$a$ is grounded.

By employing such a configuration, in this example, the filter characteristic of the waveform shaping filter is $\{1+sC1(R1+R1a)\}/(1+sC1\times R1a)$. In other words, when a signal current Isignal is input to the waveform shaping filter, Isignal$\times\{1+sC1(R1+R1a)\}/(1+sC1\times R1a)$ is output as an output current Iout. A filter characteristic (hereinafter, referred to as an "enhancement characteristic") enhancing a high-frequency component of the signal current Isignal is realized by "$1+sC1(R1+R1a)$".

Thus, by configuring the capacitance values C1 illustrated in FIGS. 1 and 4 to be the same and configuring the resistance value R1 illustrated in FIG. 1 and the resistance value R1+R1$a$ illustrated in FIG. 4 to be the same, the enhancement characteristics illustrated in FIGS. 1 and 4 can be configured to coincide with each other. In other words, according to the waveform shaping filter of this example, the resistance value R1 used for acquiring a predetermined enhancement characteristic can be configured to be less than that of the waveform shaping filter illustrated in FIG. 1 by the resistance value R1$a$.

By decreasing the resistance value R1, a voltage applied to the resistor R1 decreases, and the source voltage of the transistor M1 decreases. Thus, by decreasing the power source voltage of the waveform shaping filter, the power consumption can be reduced.

Here, a case will be described in which the signal current Isignal has a low-pass characteristic having two time constants will be reviewed. At this time, the current value of the signal current Isignal is represented as Isignal=Is$\{a/(1+s\tau_1)+b/(1+s\tau_2)\}$ (here, $\tau_1 > \tau_2$). Here, $\tau_1$ and $\tau_2$ are time constants.

The equation described above can be transformed into Isignal=$(a+b)\{1+s(a\tau_2+b\tau_1)/(a+b)\}/\{(1+s\tau_1)\times(1+s\tau_2)\}$. Here, by selecting C1, R1, and R1$a$ such that $\tau_1$=C1(R1+R1$a$), and $(a\tau_2+b\tau_1)/(a+b)$=C1$\times$R1$a$, the output current Iout is a current that is proportional to $1/(1+s\tau_1)$.

By inputting this output current Iout to a waveform shaping filter having a filter characteristic of "$1+s\tau_2$", a low-pass characteristic can be eliminated from the signal current Isignal. The waveform shaping filter having the filter characteristic of "$1+s\tau_2$" can be realized by the waveform shaping filter according to this embodiment. For example, C1 and R1 of the waveform shaping filter illustrated in FIG. 1 may be selected such that $\tau_2$=C1$\times$R1, or C1, R1, and R1$a$ of the waveform shaping filter illustrated in FIG. 4 may be selected such that $\tau_2$=C1$\times$(R1+R1$a$).

As described above, by adjusting the capacitance values and the resistance values, the waveform shaping filter according to this embodiment can eliminate a low-pass characteristic from the signal current Isignal having a low-pass characteristic of the case of one time constant or two time constants.

Second Embodiment

Figure 5:
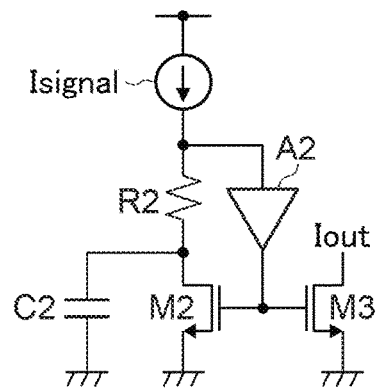
FIG. 5 is a diagram that illustrates a waveform shaping filter according to a second embodiment.

A waveform shaping filter according to a second embodiment will be described with reference to FIGS. 5 to 8. FIG. 5 is a diagram that illustrates the waveform shaping filter according to this embodiment. As illustrated in FIG. 5, the waveform shaping filter according to this embodiment includes: a resistor R2; transistors M2 and M3; a capacitor C2; and an amplifier A2. A current source Isignal illustrated in FIG. 5 is a current source that inputs a signal current Isignal to the waveform shaping filter.

The resistor R2 (first resistor) includes one end and the other end. The one end of the resistor R2 is connected to an input terminal of the amplifier A2 and a current source Isignal. Accordingly, an input current Isignal is input to the resistor R2 from the one end. The other end of the resistor R2 is connected to a drain terminal of the transistor M2 and one end of the capacitor C1.

The transistor M2 (first transistor) is an NMOS and includes a drain terminal (first terminal), a gate terminal (control terminal), and a source terminal (second terminal). The drain terminal is connected to the other end of the resistor R2 and one end of the capacitor C2. The gate terminal is connected to an output terminal of the amplifier A2. The source terminal is grounded.

The transistor M3 (second transistor) is an NMOS and includes a drain terminal (first terminal), a gate terminal (control terminal), and a source terminal (second terminal). The gate terminal is connected to a gate terminal of the transistor M2 and an output terminal of the amplifier A2. The source terminal is grounded. The transistor M3 outputs an output current Iout from the drain terminal.

The capacitor C2 (first capacitor) includes one end and the other end. The one end of the capacitor C2 is connected to the other end of the resistor R2 and the drain terminal of the transistor M2. The other end of the capacitor C2 is grounded.

The amplifier A2 (first amplifier) is a non-inverting amplifier and includes an input terminal and an output terminal. The input terminal is connected to the one end of the resistor R2 and the current source Isignal. Accordingly, the signal current Isignal or the terminal voltage of the one end of the resistor R2 is input to the amplifier A2 from the input terminal. The output terminal is connected to the gate terminals of the transistors M2 and M3.

Next, the operation of the waveform shaping filter according to this embodiment will be described.

As described above, the waveform shaping filter has a configuration in which the output of the amplifier A2 is fed back to the amplifier A2 through the transistor M2 and the resistor R2. For this reason, the input terminal of the amplifier A2 becomes a virtual grounding point, and a voltage thereof is approximately constant.

At this time, the input impedance of the waveform shaping filter seen from the current source Isignal is (1/gm2)/A2 in a case where the amplifier A2 is the voltage input type. Here, gm2 is the transconductance of the transistor M2, and A2 is the gain of the amplifier A2. Generally, since the gain of the amplifier A2 is very high, the input impedance of the waveform shaping filter is very low.

For this reason, when the signal current Isignal is input from the current source Isignal, the signal current Isignal flows through the resistor R2, and a voltage of Isignal×R2 is generated at the drain terminal of the transistor M2. Here, R2 is a resistance value of the resistor R2.

As the voltage is generated at the drain terminal of the transistor M2, a current Isignal×R2×sC2 that is proportional to the time differentiation of the signal current Isignal flows through the capacitor C2. Here, C2 is a capacitance value of the capacitor C2.

As a result, a current of Isignal×(1+sC2×R2) that is a sum of Isignal and Isignal×R2×sC2 flows through the transistor M2.

In this embodiment, since the gate voltages and the source voltages of the transistors M2 and M3 are the same, a current that is "device size ratio" times of a current flowing through the transistor M2 flows through the transistor M3. Thus, in a case where the sizes of the transistors M2 and M3 are the same, a current of Isignal×(1+sC2×R2) is output from the drain terminal of the transistor M3 as an output current Iout.

As described above, the waveform shaping filter according to this embodiment, similarly to the first embodiment, outputs a current acquired by superimposing a differentiation component of the signal current Isignal on the input signal current Isignal. Accordingly, a filter characteristic enhancing a high-frequency component of the signal current Isignal can be realized.

In this embodiment, in this embodiment, the load of the amplifier A2 is only the gate of the transistor M2. The gate can be approximated as a small capacitive load. Accordingly, the current driving capacity of the amplifier A2 does not need to be raised, and the power consumption of the waveform shaping filter can be reduced.

First Example

Figure 6:
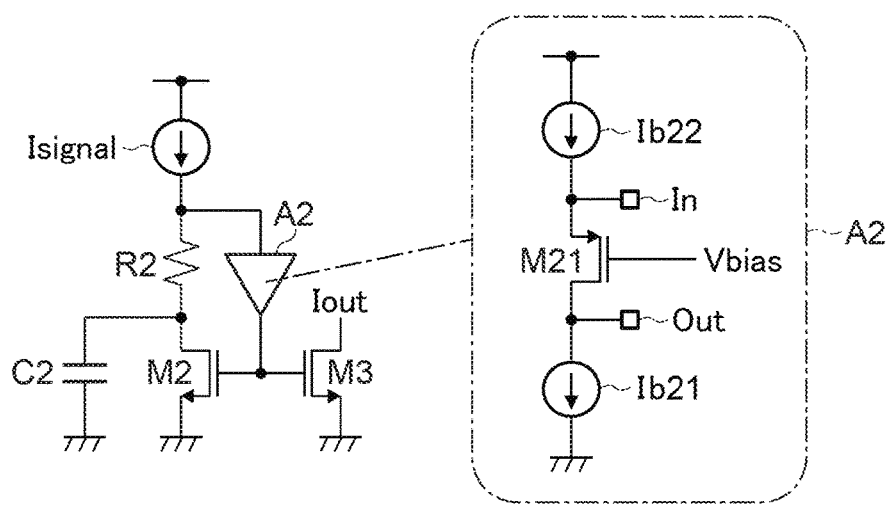
FIG. 6 is a diagram that illustrates a first example of the waveform shaping filter illustrated in FIG. 5.

FIG. 6 is a diagram that illustrates a first example of the waveform shaping filter according to this embodiment. In this example, the amplifier A2 is an amplifier of the current input type. As illustrated in FIG. 6, the amplifier A2 includes a transistor M21 and current sources Ib21 and Ib22.

The transistor M21 is a PMOS that includes a source terminal, a gate terminal, and a drain terminal. The drain terminal of the transistor M21 is connected to the current source Ib21 and the output terminal Out of the amplifier A2, the source terminal is connected to the current source Ib22 and the input terminal In of the amplifier A2, and a predetermined bias voltage Vbias is applied to the gate terminal.

The current sources Ib21 and Ib22 respectively supply bias currents Ib21 and Ib22 to the transistor M21.

Next, the operation of this amplifier A2 will be described. Hereinafter, it is assumed that the current values of the bias currents Ib21 and Ib22 are the same as Ib2 (Ib21=Ib22=Ib2).

When a current ΔI is supplied from the input terminal In of the amplifier A2, a current of ΔI+Ib2 flows through the transistor M21. In contrast to this, the bias current Ib2 is supplied to the transistor M21 by the current sources Ib21 and Ib22.

In a case where ΔI>0, in other words, in a case where the voltage of the input terminal In of the amplifier A2 increases, and a current flows from one end of the resistor R2 to the input terminal In side, a current supplied from the drain terminal of the transistor M21 becomes higher than the current Ib2 drawn by the current source Ib21, and accordingly, the gate voltages of the transistors M2 and M3 connected to the output terminal Out increase.

In a case where the gate voltage of the transistor M2 increases, the drain voltage of the transistor M2 decreases, and the voltage (the voltage of the input terminal In of the amplifier A2) of one end of the resistor R2 decreases. Accordingly, feedback is applied such that the current ΔI becomes zero. In other words, the source voltage (the voltage of the input terminal In of the amplifier A2) of the transistor M21 is approximately the same as a voltage acquired by increasing the bias voltage Vbias by a gate-to-source voltage Vgs21 at the time of causing the bias current Ib2 to flow through the transistor M21.

On the other hand, in a case where ΔI<0, in other words, in a case where the voltage of the input terminal In of the amplifier A2 decreases, and a current flows from the input terminal In to the one end side of the resistor R2, a current supplied from the drain terminal of the transistor M21 becomes lower than the current Ib2 drawn from the current source Ib21, and accordingly, the gate voltages of the transistors M2 and M3 connected to the output terminal Out decrease.

When the gate voltage of the transistor M2 decreases, the drain voltage of the transistor M2 increases, and the voltage (the voltage of the input terminal In of the amplifier A2) of one end of the resistor R2 increases. Accordingly, feedback is applied such that the current ΔI becomes zero. In other words, the source voltage (the voltage of the input terminal In of the amplifier A2) of the transistor M21 becomes approximately the same as a voltage acquired by increasing the bias voltage Vbias by a gate-to-source voltage Vgs21 at the time of causing the bias current Ib2 to flow through the transistor M21.

Accordingly, the input terminal In of the amplifier A2, as described above, becomes the virtual grounding point, and the voltage is approximately constant. Thus, the waveform shaping filter can be operated similarly to the first embodiment.

As described above, as the amplifier A2, an amplifier of the current input type may be used. In a case where the amplifier A2 of the current input type is used, the input impedance of the single body of the amplifier A2 is 1/gm21, and the input impedance of the waveform shaping filter seen from the current source Isignal is 1/(A2×gm2+gm21). Here, gm21 is the transconductance of the transistor M21.

Thus, by using the amplifier A2 of the current input type, the input impedance of the waveform shaping filter is less than that of a case where an amplifier A2 of the voltage input type is used, and variations in the voltage of the input terminal In of the amplifier A2 can be suppressed. Accordingly, an error in the output current Iout due to variations in the input voltage of the waveform shaping filter can be decreased.

Second Example

Figure 7:
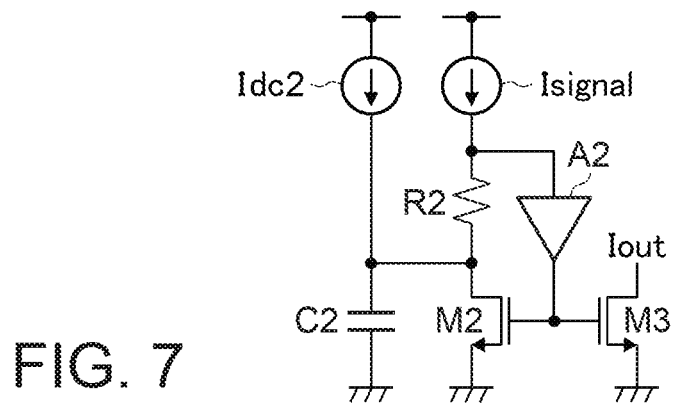
FIG. 7 is a diagram that illustrates a second example of the waveform shaping filter illustrated in FIG. 5.

FIG. 7 is a diagram that illustrates a second example of the waveform shaping filter according to this embodiment. In this example, the waveform shaping filter further includes a current source Idc2. The other configurations are similar to those illustrated in FIG. 5.

The current source Idc2 (first current source) is a DC current source that includes one end and the other end. The one end of the current source Idc2 is connected to the other end of the resistor R2, the drain terminal of the transistor M2, and one end of the capacitor C2. In the configuration illustrated in FIG. 7, while the other end of the current source Idc2 is connected to a power source, it may be grounded. The current source Idc2 supplies an arbitrary DC current Idc2 that causes the transistor M2 to be in the On state.

By employing such a configuration, according to this example, the response speed of a case where a pulse signal current Isignal is input to the waveform shaping filter is input can be improved. The reason for this is as described in the second example of the first embodiment.

Third Example

Figure 8:
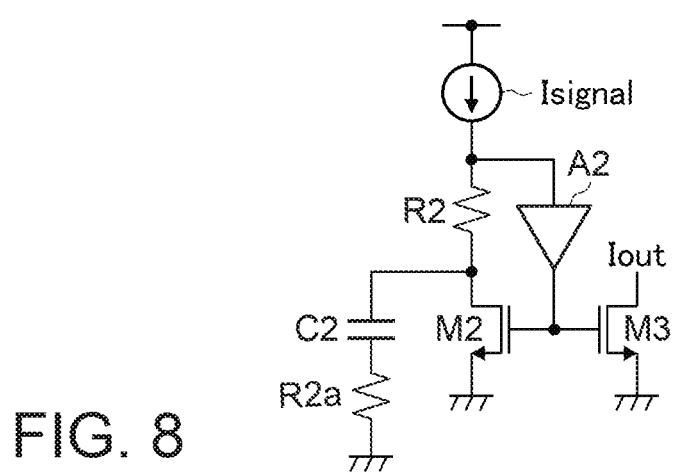
FIG. 8 is a diagram that illustrates a third example of the waveform shaping filter illustrated in FIG. 5.

FIG. 8 is a diagram that illustrates a third example of the waveform shaping filter according to this embodiment. In this example, the waveform shaping filter further includes a resistor R2a. The other configurations are similar to those illustrated in FIG. 5.

The resistor R2a (second resistor) includes one end and the other end. One end of the resistor R2a is connected to the other end of the capacitor C2, and the other end of the resistor R2a is grounded.

By employing such a configuration, in this example, the filter characteristic of the waveform shaping filter is {1+sC2(R2+R2a)}/(1+sC2×R2a). Accordingly, an effect similar to that of the third example of the first embodiment can be acquired. In other words, according to the waveform shaping filter of this example, the resistance value R2 used for acquiring a predetermined enhancement characteristic can be configured to be less than that of the waveform shaping filter illustrated in FIG. 5 by the resistance value R2a. Thus, by decreasing the power source voltage of the waveform shaping filter, the power consumption can be reduced.

Third Embodiment

Figure 9:
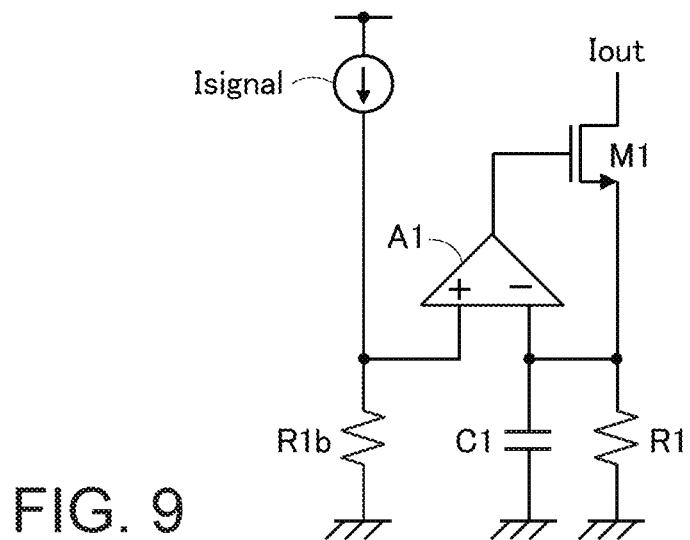
FIG. 9 is a diagram that illustrates a waveform shaping filter according to a third embodiment.

A waveform shaping filter according to a third embodiment will be described with reference to FIGS. 9 to 12. FIG. 9 is a diagram that illustrates the waveform shaping filter according to this embodiment. As illustrated in FIG. 9, the waveform shaping filter according to this embodiment includes: resistors R1 and R1b; a transistor M1; a capacitor C1; and an amplifier A1. A current source Isignal illustrated in FIG. 9 is a current source that inputs a signal current Isignal to the waveform shaping filter.

The resistor R1 (sixth resistor) includes one end and the other end. The one end of the resistor R1 is grounded, and the other end is connected to a negative input terminal of the amplifier A1, the other end of the capacitor C1, and the source terminal of the transistor M1.

The resistor R1b (fifth resistor) includes one end and the other end. The one end of the resistor R1b is grounded, and the other end is connected to a positive input terminal of the amplifier A1 and the current source Isignal. Accordingly, an input current Isignal is input to the resistor R1b from the other end.

The capacitor C1 (seventh capacitor) includes one end and the other end. The one end of the capacitor C1 is grounded, and the other end is connected to the other end of the resistor R1, the negative input terminal of the amplifier A1, and the source terminal of the transistor M1.

The transistor M1 (sixteenth transistor) is an NMOS and includes a source terminal (first terminal), a drain terminal (second terminal), and a gate terminal (control terminal). The gate terminal is connected to an output terminal of the amplifier A1. The source terminal is connected to a negative input terminal of the amplifier A1, the other end of the capacitor C1, and the other end of the resistor R1. The transistor M1 outputs an output current Iout from the drain terminal.

The amplifier A1 (fourth amplifier) is a differential amplifier and includes a positive input terminal (first input terminal), a negative input terminal (second input terminal), and an output terminal. The positive input terminal is connected to the other end of the resistor R1b and a current source Isignal. Accordingly, the terminal voltage of the other end of the resistor R1b is input to the amplifier A1 from the positive input terminal. The negative input terminal is connected to the other end of the capacitor C1, the other end of the resistor R1, and the source terminal of the transistor M1. The output terminal is connected to the gate terminal of the transistor M1.

Next, the operation of the waveform shaping filter according to this embodiment will be described.

As described above, the waveform shaping filter has a configuration in which the output of the amplifier A1 is fed back to the negative input terminal of the amplifier A1 through the transistor M1. According to such negative feedback, the positive input terminal and the negative input terminal of the amplifier A1 become virtual short, and the voltage of the negative input terminal is approximately the same as the voltage of the positive input terminal.

The signal current Isignal transmitted from the current source Isignal flows through the resistor R1b to be converted into a voltage. For this reason, the voltage of the positive input terminal of the amplifier A1 is Isignal×R1b. Since the voltages of the positive input terminal and the negative input terminal are approximately the same, the voltage of the negative input terminal is Isignal×R1b as well. Accordingly, a current of Isignal×R1b/R1 flows through the resistor R1, and a current of Isignal×R1b×sC1 flows through the capacitor C1. As a result, the transistor M1 outputs a current of Isignal×R1b×(1+sC1R1)/R1 that is a sum of Isignal×R1b/R1 and Isignal×R1b×sC1 as an output current Iout.

As described above, the waveform shaping filter according to this embodiment outputs a current acquired by superimposing a differentiation component of the signal current Isignal on a current that is proportional to the input signal current Isignal. Accordingly, a filter characteristic enhancing a high-frequency component of the signal current Isignal can be realized.

In this embodiment, the load of the amplifier A1 is only the gate of the transistor M1. The gate can be approximated as a small capacitive load. Accordingly, the current driving capacity of the amplifier A1 does not need to be raised, and the power consumption of the waveform shaping filter can be reduced.

First Example

Figure 10:
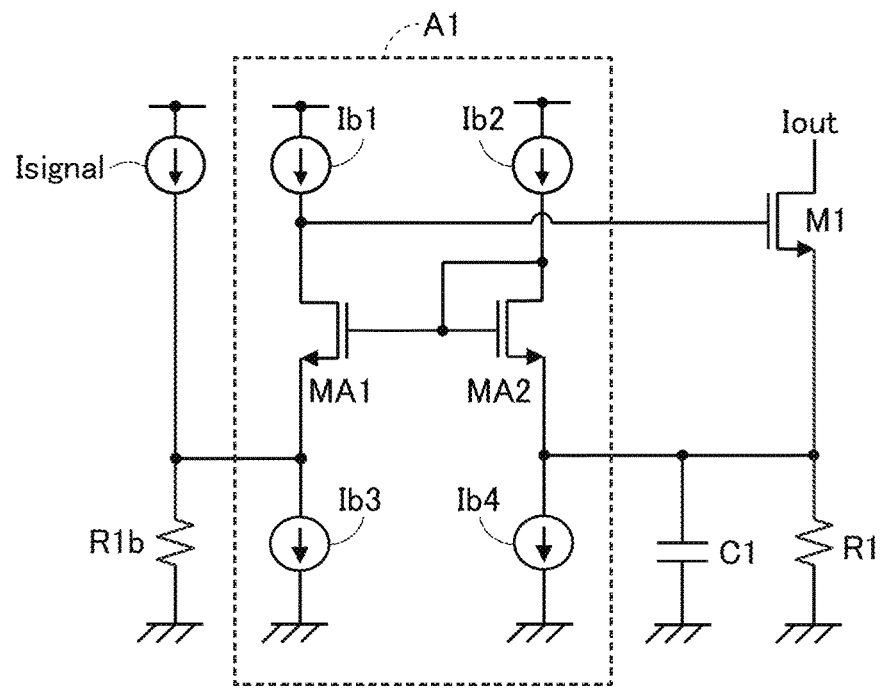
FIG. 10 is a diagram that illustrates a first example of the waveform shaping filter illustrated in FIG. 9.

FIG. 10 is a diagram that illustrates a first example of the waveform shaping filter according to this embodiment. In this example, an amplifier A1 is an amplifier of the current input type. As illustrated in FIG. 10, the amplifier A1 includes transistors MA1 and MA2 and current sources Ib1, Ib2, Ib3, and Ib4.

Each of the transistors MA1 and MA2 is an NMOS that includes a source terminal, a gate terminal, and a drain terminal.

The drain terminal of the transistor MA1 is an output terminal of the amplifier A1 and is connected to the current source Ib1 and the gate terminal of the transistor M1. The gate terminal of the transistor MA1 is connected to the gate terminal of the transistor MA2 and the current source Ib2. The source terminal of the transistor MA1 is a positive input terminal of the amplifier A1 and is connected to the current source Ib3 and the other end of the resistor R1$b$.

The drain terminal of the transistor MA2 is connected to the current source Ib2, the gate terminal of the transistor MA2, and the gate terminal of the transistor MA1. The gate terminal of the transistor MA2 is connected to the drain terminal of the transistor MA2, the gate terminal of the transistor MA1, and the current source Ib2. The source terminal of the transistor MA2 is a negative input terminal of the amplifier A1 and is connected to the current source Ib4, the other end of the resistor R1, the other end of the capacitor C1, and the source terminal of the transistor M1. In addition, the gate terminal and the drain terminal are connected to the transistor MA2.

The current sources Ib1, Ib2, Ib3, and Ib4 respectively supply predetermined bias currents Ib1, Ib2, Ib3, and Ib4 to the transistors MA1 and MA2.

Next, the operation of the amplifier A1 will be described. Hereinafter, it is assumed that the current values of the bias currents Ib1, Ib2, Ib3, and Ib4 are the same as Ib (Ib1=Ib2=Ib3=Ib4=Ib). In addition, the sizes of the transistors MA1 and MA2 are assumed to be the same. Furthermore, the resistance values of the resistors R1$b$ and R1 are the same (R1$b$=R1).

When the voltage of the other end of the resistor R1$b$ increases, in other words, when the voltage of the source terminal of the transistor MA1 increases, the gate-to-source voltage of the transistor MA1 decreases. Accordingly, a current flowing through the transistor MA1 decreases from Ib by $\Delta$I to be Ib−$\Delta$I. In other words, a current $\Delta$I flows from the other end of the resistor R1$b$ to the positive input terminal of the amplifier A1. Since Ib−$\Delta$I is lower than the current Ib supplied from the current source Ib1, the voltage of the terminal drain of the transistor MA1 that is the output terminal of the amplifier A1 increases. Accordingly, the voltage of the gate terminal of the transistor M1 increases.

In accordance with this, the voltage of the source terminal of the transistor M1, in other words, the voltage of the source terminal of the transistor MA2 increases. The current of Ib is supplied from the current source Ib2 to the transistor MA2, and thus, the gate-to-source voltage of the transistor MA2 is approximately constant. For this reason, when the voltage of the source terminal of the transistor MA2 increases, the voltage of the gate terminal of the transistor MA2 increases as well. Since the gate terminal of the transistor MA1 is connected to the gate terminal of the transistor MA2, the voltage of the gate terminal of the transistor MA1 increases as well, and the gate-to-source voltage of the transistor MA1 increases, whereby the bias current Ib operates to flow again.

Since the sizes of the transistors MA1 and MA2 are the same, and the bias current Ib flows therethrough, the gate-to-source voltages of the transistors MA1 and MA2 are approximately the same. As a result, the voltage of the source terminal of the transistor MA2 operates to be approximately the same as the voltage of the source terminal of the transistor MA1.

On the other hand, when the voltage of the other end of the resistor R1$b$ decreases, in other words, when the voltage of the source terminal of the transistor MA1 decreases, the gate-to-source voltage of the transistor MA1 increases. Accordingly, a current flowing through the transistor MA1 increases from Ib by $\Delta$I and becomes Ib+$\Delta$I. In other words, the current $\Delta$I flows from the positive input terminal of the amplifier A1 toward the other end of the resistor R1$b$. Since Ib+$\Delta$I is higher than the current Ib supplied from the current source Ib1, the voltage of the drain terminal of the transistor MA1 that is the output terminal of the amplifier A1 decreases. Accordingly, the voltage of the gate terminal of the transistor M1 decreases.

In accordance with this, the voltage of the source terminal of the transistor M1, in other words, the voltage of the source terminal of the transistor MA2 decreases as well. The current of Ib is supplied from the current source Ib2 to the transistor MA2, and thus, the gate-to-source voltage of the transistor MA2 is approximately constant. For this reason, when the voltage of the source terminal of the transistor MA2 decreases, the voltage of the gate terminal of the transistor MA2 decreases as well. Since the gate terminal of the transistor MA1 is connected to the gate terminal of the transistor MA2, the voltage of the gate terminal of the transistor MA1 decreases as well, and the gate-to-source voltage of the transistor MA1 decreases, whereby the bias current Ib operates to flow again.

Since the sizes of the transistors MA1 and MA2 are the same, and the bias current Ib flows therethrough, the gate-to-source voltages of the transistors MA1 and MA2 are approximately the same. As a result, the voltage of the source terminal of the transistor MA2 operates to be approximately the same as the voltage of the source terminal of the transistor MA1.

Accordingly, the voltage of the source terminal of the transistor MA2 that is the negative input terminal of the amplifier A1, as described above, is approximately the same as the voltage of the source terminal of the transistor MA1 that is the positive input terminal of the amplifier A1, and the positive input terminal and the negative input terminal of the amplifier A1 become virtual short. Therefore, the waveform shaping filter can be operated as described above.

Figure 11:
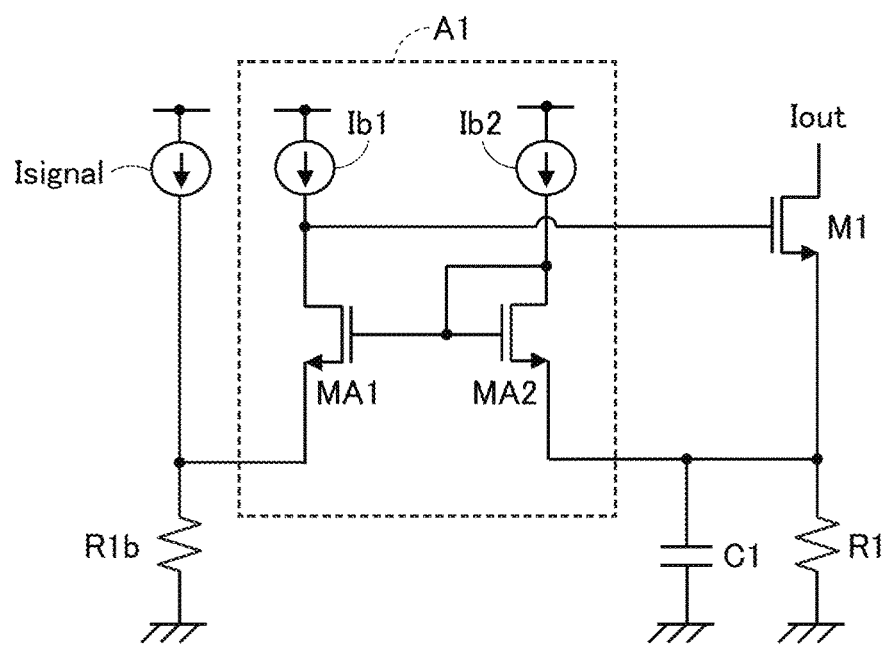
FIG. 11 is a diagram that illustrates a modified example of the waveform shaping filter illustrated in FIG. 10.

In the configuration illustrated in FIG. 10, while the current sources Ib3 and Ib4 drawing the bias currents from the source terminals of the transistors MA1 and MA2 are arranged, as illustrated in FIG. 11, a configuration may be employed in which the bias currents flowing through the transistors MA1 and MA2 are caused to respectively flow through the resistors R1$b$ and R1.

Second Example

Figure 12:
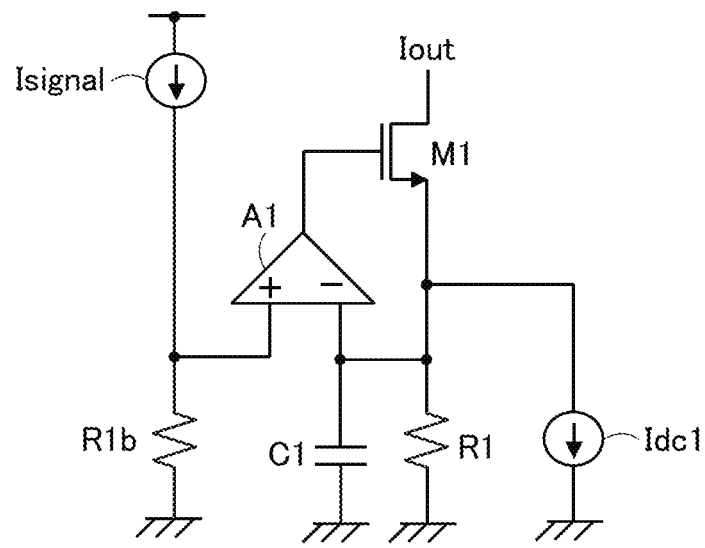
FIG. 12 is a diagram that illustrates a second example of the waveform shaping filter illustrated in FIG. 9.

FIG. 12 is a diagram that illustrates a second example of the waveform shaping filter according to this embodiment. In this example, the waveform shaping filter further includes a current source Idc1. The other configurations are similar to those illustrated in FIG. 9.

The current source Idc1 (sixth current source) is a DC current source that includes one end and the other end. The one end of the current source Idc1 is connected to the negative input terminal of the amplifier A1, the other end of the resistor R1, the source terminal of the transistor M1, and the other end of the capacitor C1. In the configuration illustrated in FIG. 12, while the other end of the current source Idc1 is grounded, it may be connected to a power source. The current source Idc1 supplies an arbitrary DC current Idc1 that causes the transistor M1 to be in the On state.

By employing such a configuration, according to this example, as described with reference to FIG. 3, the response speed of a case where a pulse signal current Isignal is input to the waveform shaping filter can be improved.

Third Example

Figure 13:
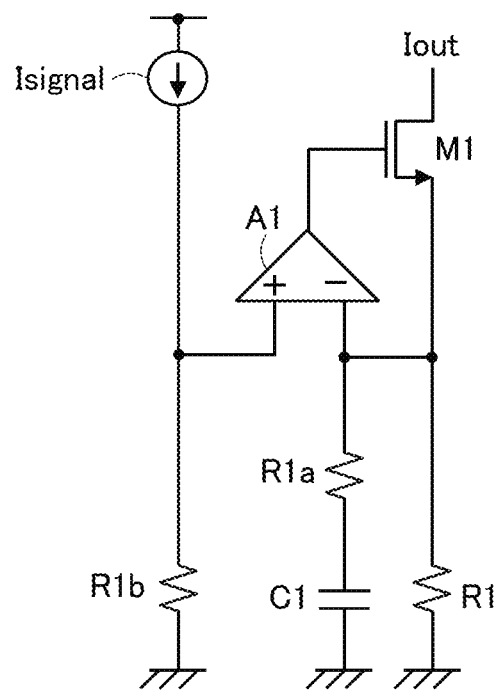
FIG. 13 is a diagram that illustrates a third example of the waveform shaping filter illustrated in FIG. 9.

FIG. 13 is a diagram that illustrates a third example of the waveform shaping filter according to this embodiment. In this example, the waveform shaping filter further includes a resistor R1a. The other configurations are similar to those illustrated in FIG. 9.

The resistor R1a (seventh resistor) includes one end and the other end. One end of the resistor R1a is connected to the other end of the capacitor C1, and the other end of the resistor R1a is connected to the negative input terminal of the amplifier A1.

By employing such a configuration, in this example, the filter characteristic of the waveform shaping filter is $R1b\{1+sC1(R1+R1a)\}/\{(1+sC1R1a)R1\}$. In other words, when a signal current Isignal is input to the waveform shaping filter, $Isignal \times R1b\{1+sC1(R1+R1a)\}/\{(1+sC1R1a)R1\}$ is output as the output current Iout. The enhancement characteristic enhancing a high-frequency component of the signal current Isignal is realized by "$1+sC1(R1+R1a)$".

Thus, by configuring the capacitance values C1 illustrated in FIGS. 9 and 13 to be the same and configuring the resistance value R1 illustrated in FIG. 9 and the resistance value R1+R1a illustrated in FIG. 13 to be the same, the enhancement characteristics illustrated in FIGS. 9 and 13 can be configured to coincide with each other. In other words, according to the waveform shaping filter of this example, the resistance value R1 used for acquiring a predetermined enhancement characteristic can be configured to be less than that of the waveform shaping filter illustrated in FIG. 9 by the resistance value R1a.

By decreasing the resistance value R1, a voltage applied to the resistor R1 decreases, and the source voltage of the transistor M1 decreases. Thus, by decreasing the power source voltage of the waveform shaping filter, the power consumption can be reduced.

Fourth Example

Figure 14:
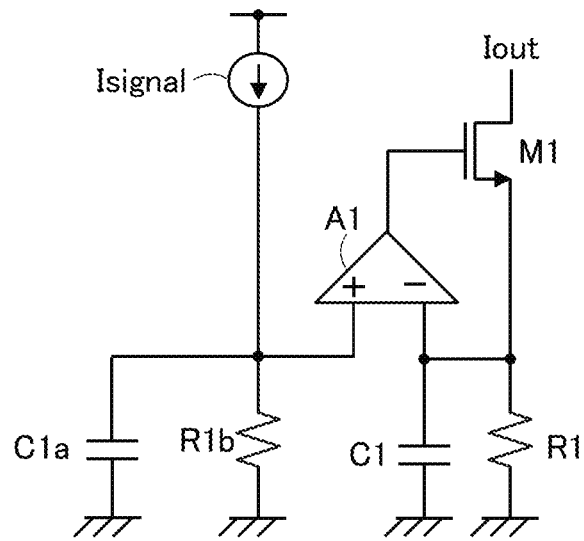
FIG. 14 is a diagram that illustrates a fourth example of the waveform shaping filter illustrated in FIG. 9.

FIG. 14 is a diagram that illustrates a fourth example of the waveform shaping filter according to this embodiment. In this example, the waveform shaping filter further includes a capacitor C1a. The other configurations are similar to those illustrated in FIG. 9.

The capacitor C1a (eighth capacitor) includes one end and the other end. One end of the capacitor C1a is grounded, and the other end thereof is connected to the other end of the resistor R1b, the current source Isignal, and the positive input terminal of the amplifier A1.

By employing such a configuration, according to this example, a low-pass characteristic is realized by the resistor R1b and the capacitor C1a. The cut-off frequency of the low pass filter is $1/(2\pi \times R1b \times C1a)$. By setting the capacitance value C1a such that the cut-off frequency is higher than a high-frequency component desired to be enhanced, an unnecessary high-frequency noise that is superimposed on the signal current Isignal can be eliminated.

Fourth Embodiment

Figure 15:
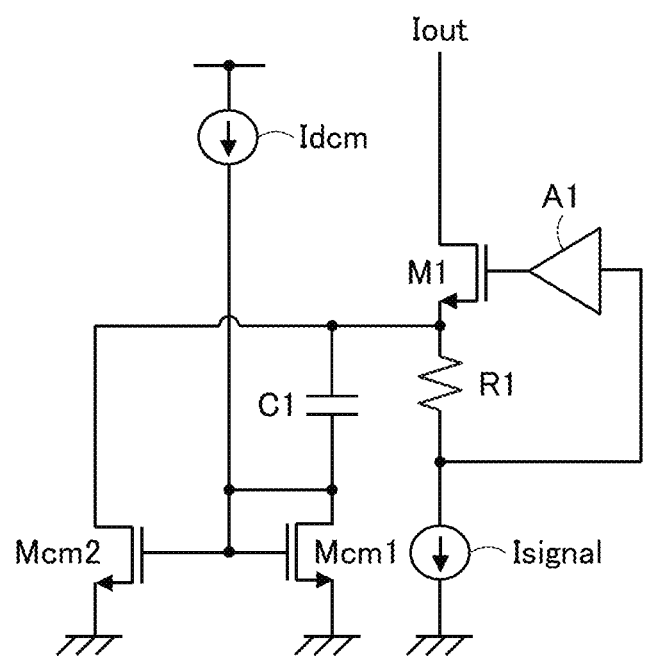
FIG. 15 is a diagram that illustrates a waveform shaping filter according to a fourth embodiment.

A waveform shaping filter according to a fourth embodiment will be described with reference to FIGS. 15 to 18. FIG. 15 is a diagram that illustrates the waveform shaping filter according to this embodiment. As illustrated in FIG. 15, the waveform shaping filter according to this embodiment is a modified example of the first embodiment and further includes transistors Mcm1 and Mcm2 and a current source Idcm. Hereinafter, differences from the first embodiment will be focused in the description.

The transistor Mcm1 is an NMOS and has a source terminal being grounded, a drain terminal being connected to one end of the capacitor C1, and a gate terminal being connected to the current source Idcm and a gate terminal of the transistor Mcm2. In addition, in the transistor Mcm1, the gate terminal and the drain terminal are connected to each other.

The transistor Mcm2 is an NMOS and has a source terminal being grounded, a gate terminal being connected to the current source Idcm and the gate terminal of the transistor Mcm1, and a drain terminal being connected to the other end of the capacitor C1, the other end of the resistor R1, and the source terminal of the transistor M1.

The transistors Mcm1 and Mcm2 configure a current mirror circuit (first current mirror circuit). An input terminal of the current mirror circuit is a drain terminal of the transistor Mcm1, and an output terminal thereof is the drain terminal of the transistor Mcm2. In a case where the sizes of the transistors Mcm1 and Mcm2 are the same, a current flowing through the transistor Mcm1 and a current flowing through the transistor Mcm2 are the same.

The current source Idcm supplies a bias current Idcm used for operating the current mirror circuit that configures the transistors Mcm1 and Mcm2.

In this embodiment, the capacitor C1 has one end being connected to the drain and gate terminals of the transistor Mcm1, the gate terminal of the transistor Mcm2, and the current source Idcm and the other end being connected to the other end of the resistor R1, the source terminal of the transistor M1, and the drain terminal of the transistor Mcm2.

By employing such a configuration, in a case where the sizes of the transistors Mcm1 and Mcm2 are the same, a current flowing through the transistor M1 is $Isignal \times (1+2sC1R1)$ that is a sum of the signal current Isignal, a current $Isignal \times R1 \times sC1$ flowing through the capacitor C1, and a current $Isignal \times R1 \times sC1$ that is acquired by turning back (inverting the polarity of) the current flowing through the capacitor C1 using the current mirror circuit.

As can be understood from the equation described above, according to this embodiment, the capacitance value C1 can be decreased to be a half of that of the first embodiment. In other words, a time constant similar to that of the first embodiment can be realized by using the capacitance value C1 that is a half of that according to the first embodiment.

In the description presented above, while a case in which the sizes of the transistors Mcm1 and Mcm2 are the same has been described as an example, in this embodiment, the sizes of the transistors Mcm1 and Mcm2 may be different from each other. By configuring the channel width of the transistor Mcm2 to be k times of the channel width of the transistor Mcm1, the capacitance value C1 can be configured to be $1/(1+k)$ times of that according to the first embodiment. In this way, by decreasing the capacitance value C1 of the capacitor C1, the circuit area can be decreased.

In the example illustrated in FIG. 15, while the other end of the capacitor C1 is connected to the current mirror circuit, a configuration may be employed in which the capacitor C1 is divided, and only a part thereof is connected to the current mirror circuit.

In addition, as the bias current of the current mirror circuit, the current Idcm supplied by the current source Idcm also flows through the transistor M1. Thus, the current source Idcm, as described with reference to FIG. 3, may be used also as a DC current used for improving the response speed of a case where the pulse signal current Isignal is input to the waveform shaping filter.

Figure 16:
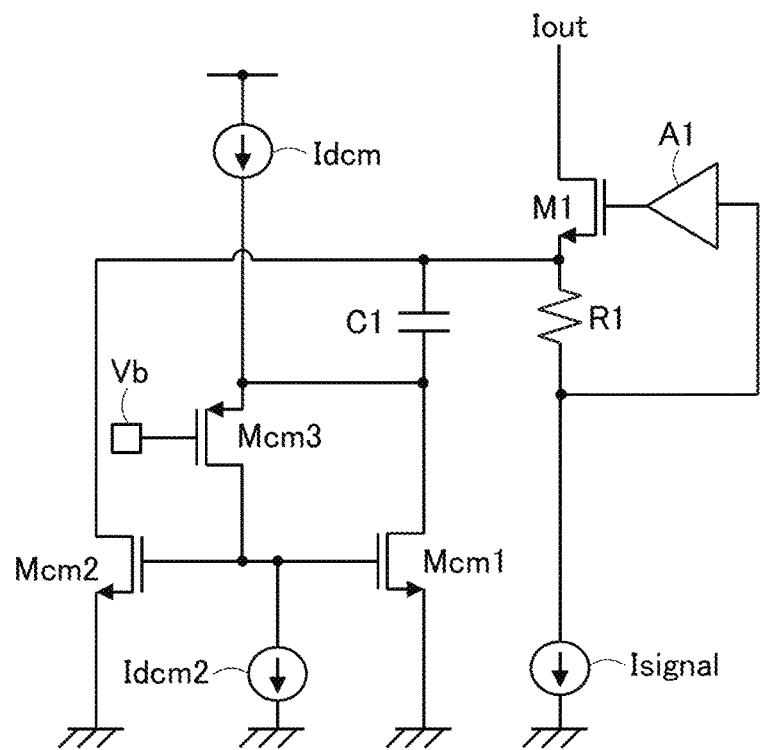
FIG. 16 is a diagram that illustrates a modified example of the waveform shaping filter illustrated in FIG. 15.

In addition, the input impedance of the current mirror circuit is the inverse of the transconductance of the transistor Mcm1, and, in a case where the input impedance is high, it has an influence on the time constant of the filter. Thus, as illustrated in FIG. 16, a transistor Mcm3 and a current source Idcm2 may be added to the current mirror circuit.

The transistor Mcm3 is a PMOS and has a gate terminal being applied with a bias voltage Vb, a source terminal being connected to the current source Idcm, one end of the capacitor C1, and the drain terminal of the transistor Mcm1, and a drain terminal being connected to the gate terminals of the transistors Mcm1 and Mcm2, and the current source Idcm2. The current source Idcm2 supplies a bias current Idcm2 used for operating the transistor Mcm3.

By employing such a configuration, a change in the voltage of the drain terminal of the transistor Mcm1 can be amplified and be added to the gate terminal of the transistor Mcm1. In this way, by decreasing the input impedance of the current mirror circuit, the influence thereof on the time constant of the filter can be reduced.

Fifth Embodiment

Figure 17:
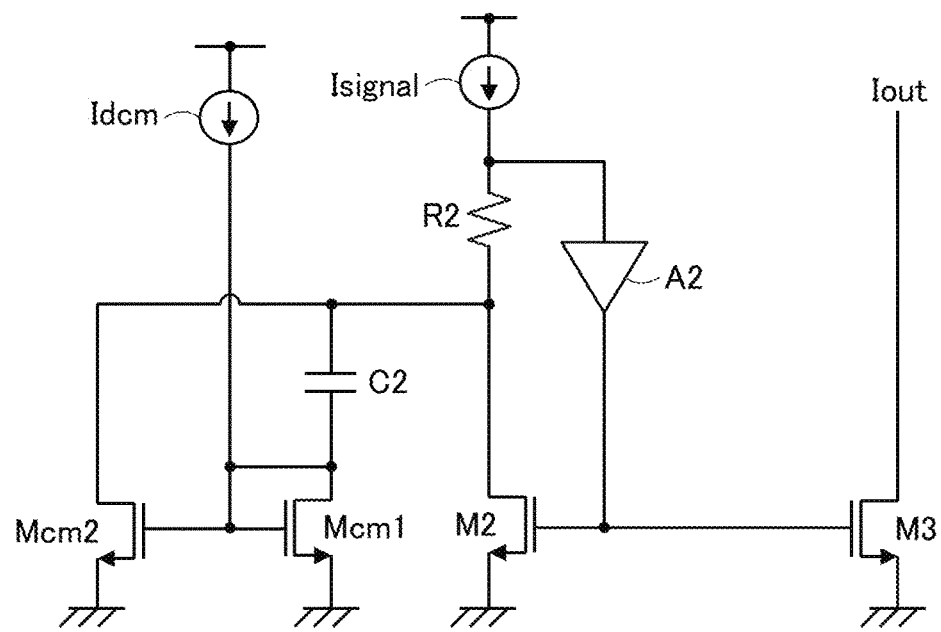
FIG. 17 is a diagram that illustrates a waveform shaping filter according to a fifth embodiment.

A waveform shaping filter according to a fifth embodiment will be described with reference to FIG. 17. FIG. 17 is a diagram that illustrates the waveform shaping filter according to this embodiment. As illustrated in FIG. 17, the waveform shaping filter according to this embodiment is a modified example of the second embodiment and further includes transistors Mcm1 and Mcm2 and a current source Idcm. The other configurations are similar to those illustrated in FIG. 5. The configuration of a current mirror circuit (first current mirror circuit) configured by the transistors Mcm1 and Mcm2 and the current source Idcm is similar to that illustrated in FIG. 15. A capacitor C2 according to this embodiment corresponds to the capacitor C1 illustrated in FIG. 15.

By employing such a configuration, according to this embodiment, the capacitance value C2 can be decreased to be a half of that of the second embodiment. In other words, a time constant similar to that of the second embodiment can be realized by using a capacitance value C2 that is a half of that according to the second embodiment.

Sixth Embodiment

Figure 18:
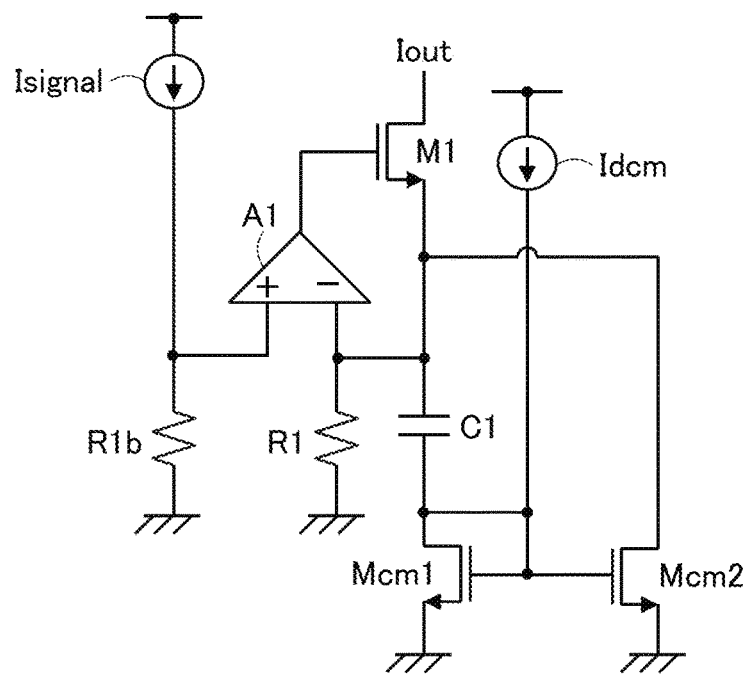
FIG. 18 is a diagram that illustrates a waveform shaping filter according to a sixth embodiment.

A waveform shaping filter according to a sixth embodiment will be described with reference to FIG. 18. FIG. 18 is a diagram that illustrates the waveform shaping filter according to this embodiment. As illustrated in FIG. 18, the waveform shaping filter according to this embodiment is a modified example of the third embodiment and further includes transistors Mcm1 and Mcm2 and a current source Idcm. The other configurations are similar to those illustrated in FIG. 9. The configuration of a current mirror circuit (third current mirror circuit) configured by the transistors Mcm1 and Mcm2 and the current source Idcm is similar to that illustrated in FIG. 15.

By employing such a configuration, according to this embodiment, the capacitance value C1 can be decreased to be a half of that of the third embodiment. In other words, a time constant similar to that of the third embodiment can be realized by using a capacitance value C1 that is a half of that according to the third embodiment.

Seventh Embodiment

Figure 19:
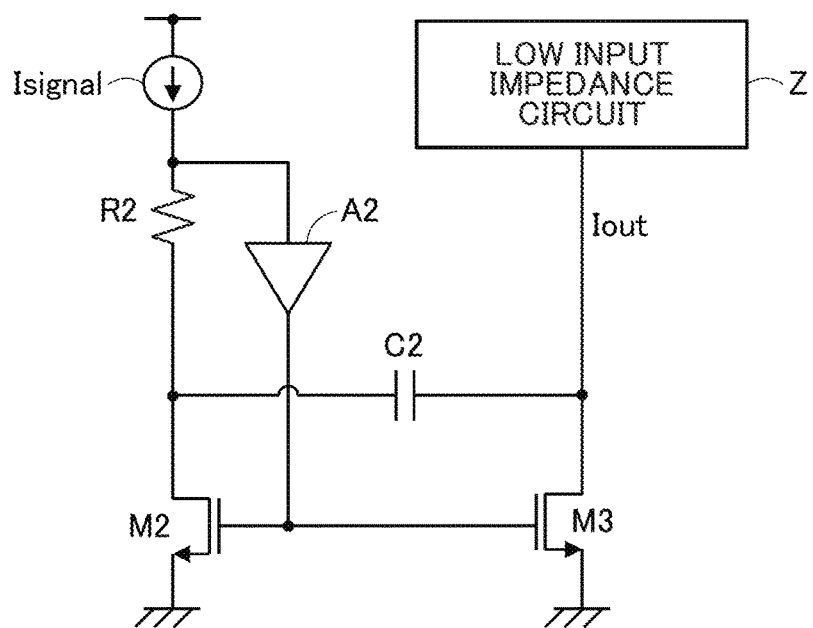
FIG. 19 is a diagram that illustrates a waveform shaping filter according to a seventh embodiment.

A waveform shaping filter according to a seventh embodiment will be described with reference to FIGS. 19 to 22. FIG. 19 is a diagram that illustrates the waveform shaping filter according to this embodiment. As illustrated in FIG. 19, the waveform shaping filter according to this embodiment is a modified example of the second embodiment and further includes a low input impedance circuit Z. Hereinafter, differences from the second embodiment will be focused in the description.

In this embodiment, the other end of the capacitor C2 is connected to the drain terminal of the transistor M3.

The low input impedance circuit Z is connected to the drain terminal of the transistor M3 and an end of the capacitor C2. The low input impedance circuit Z adds a current flowing from the other end of the capacitor C2 to an output current output from the drain terminal of the transistor M3.

By employing such a configuration, a current flowing through the low input impedance circuit Z is a sum of a current Isignal×(1+sC2R2) that is acquired by replicating a sum of a current Isignal×R2×sC2 flowing from one end of the capacitor C2 into the transistor M2 and the signal current Isignal and a current Isignal×R2×sC2 flowing from the other end of the capacitor C2 into the capacitor C2. In other words, a current of Isignal×(1+2sC2R2) flows through the low input impedance circuit Z as the output current of the waveform shaping filter.

As can be understood from the equation described above, according to this embodiment, the capacitance value C2 can be decreased to be a half of that of the second embodiment. In other words, a time constant similar to that of the second embodiment can be realized by using a capacitance value C2 that is a half of that according to the second embodiment.

In the example illustrated in FIG. 19, while the other end of the capacitor C2 is connected to the drain terminal of the transistor M3, a configuration may be employed in which the capacitor C2 is divided, and only a part thereof is connected to the drain terminal of the transistor M3.

First Example

Figure 20:
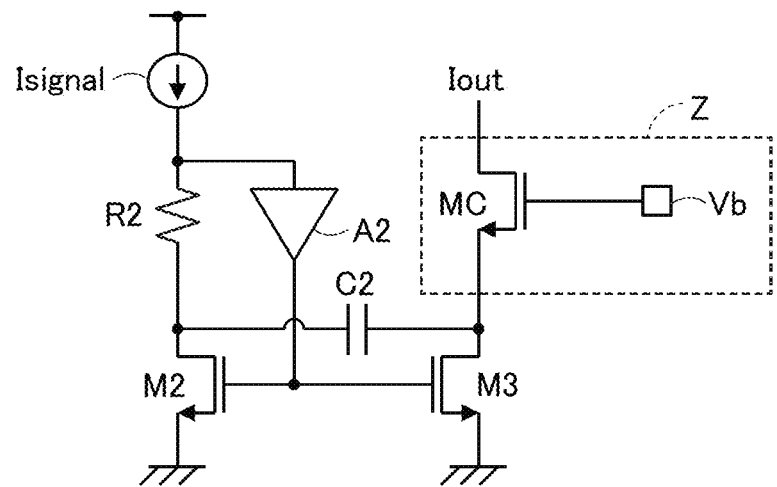
FIG. 20 is a diagram that illustrates a first example of the waveform shaping filter illustrated in FIG. 19.

FIG. 20 is a diagram that illustrates a first example of the waveform shaping filter illustrated in FIG. 19. In the example illustrated in FIG. 20, the low input impedance circuit Z is realized by a gate-grounded amplification circuit. The gate-grounded amplification circuit includes a transistor MC.

The transistor MC is an NMOS, has a gate terminal being applied with a bias voltage Vb and a source terminal being connected to the other end of the capacitor C2 and the other end of the transistor M3, and outputs the output current Iout from a drain terminal.

The input impedance of the gate-grounded amplification circuit is determined to be about the inverse of the transconductance of the transistor MC. Thus, by increasing the channel width/channel length of the transistor MC, the transconductance is increased, whereby the input impedance can be decreased.

Second Example

Figure 21:
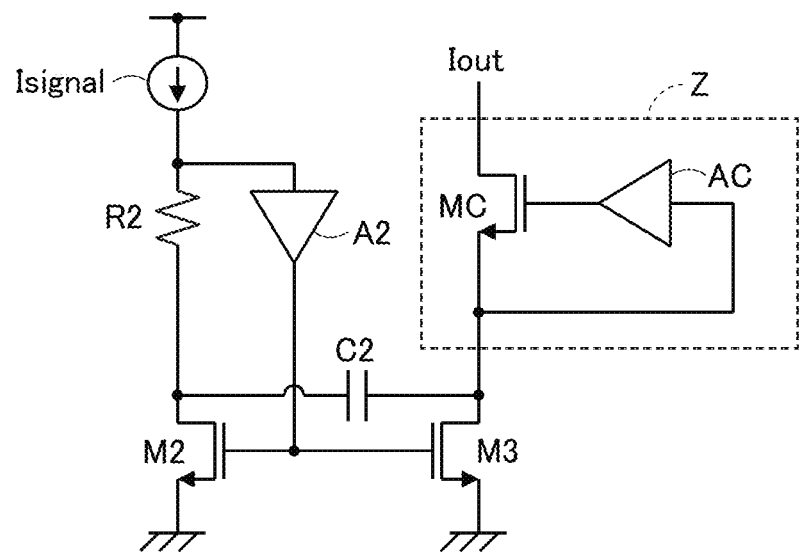
FIG. 21 is a diagram that illustrates a second example of the waveform shaping filter illustrated in FIG. 19.

FIG. 21 is a diagram that illustrates a second example of the waveform shaping filter illustrated in FIG. 19. In the example illustrated in FIG. 21, the low input impedance circuit Z is realized by a regulated cascode circuit. The regulated cascode circuit includes a transistor MC and an inverting amplifier AC.

The inverting amplifier AC has an input terminal being connected to the other end of the capacitor C2 and the drain terminal of the transistor M3 and an output terminal being connected to the gate terminal of the transistor MC. The inverting amplifier AC executes inversion amplification of the voltage of the source terminal of the transistor MC and applies a resultant voltage to the gate terminal of the transistor MC. The gain of the inverting amplifier AC is AC. The other configurations are similar to those illustrated in FIG. 20.

By employing such a configuration, the input impedance of the low input impedance circuit Z is the inverse of AC times of the transconductance of the transistor MC. In other words, in the example illustrated in FIG. 21, the input impedance of the low input impedance circuit Z can be configured to be 1/AC times of that illustrated in FIG. 20.

Third Example

Figure 22:
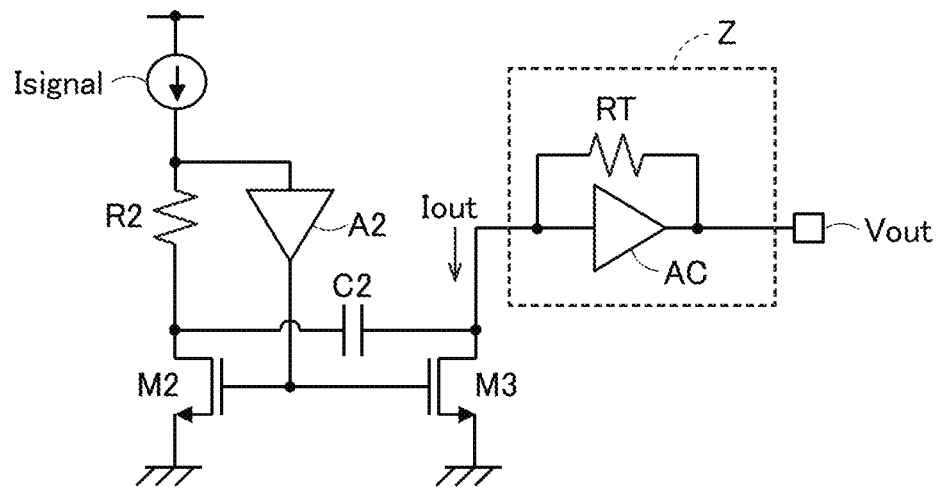
FIG. 22 is a diagram that illustrates a third example of the waveform shaping filter illustrated in FIG. 19.

FIG. 22 is a diagram that illustrates a third example of the waveform shaping filter illustrated in FIG. 19. In the example illustrated in FIG. 22, the low input impedance circuit Z is realized by a transimpedance circuit. The transimpedance circuit includes an inverting amplifier AC and a resistor RT.

The inverting amplifier AC has an input terminal being connected to the other end of the capacitor C2, the other end of the transistor M3, and one end of the resistor RT and the other end being connected to the other end of the resistor RT. In other words, the resistor RT is connected between the input terminal and the output terminal of the inverting amplifier AC. Also in such a configuration, the low input impedance circuit Z can be realized.

Eighth Embodiment

Figure 23:
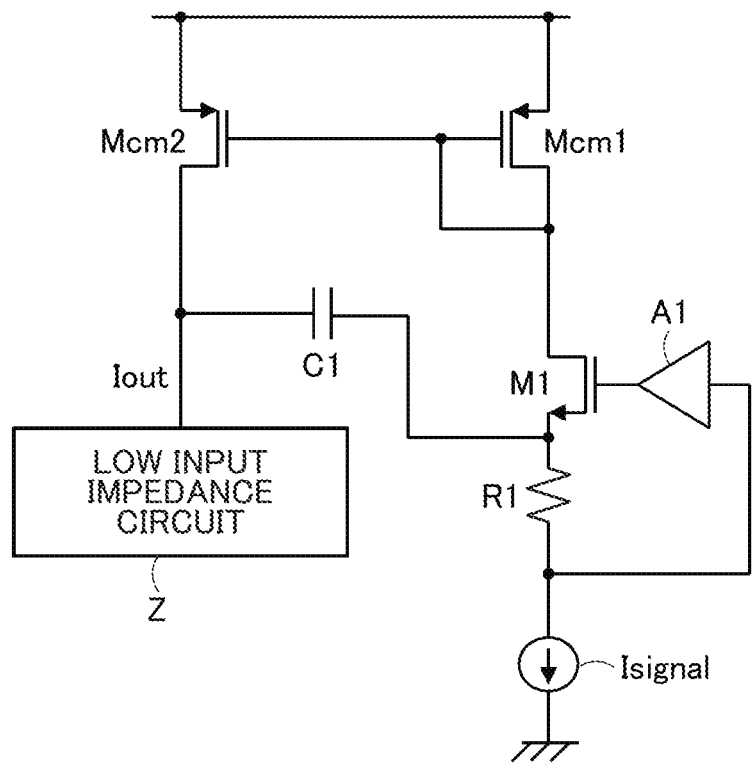
FIG. 23 is a diagram that illustrates a waveform shaping filter according to an eighth embodiment.

A waveform shaping filter according to an eighth embodiment will be described with reference to FIGS. 23 and 24. In this embodiment, the waveform shaping filter acquired by combining waveform shaping filters according to the fourth and seventh embodiments will be described. FIG. 23 is a diagram that illustrates a waveform shaping filter acquired by applying a current mirror circuit and a low input impedance circuit Z to the first embodiment.

As illustrated in FIG. 23, the waveform shaping filter includes transistors Mcm1 and Mcm2 and the low input impedance circuit Z. Hereinafter, differences from the first embodiment will be focused in the description.

The transistor Mcm1 is a PMOS and has a source terminal being connected to a power source line (second reference voltage line), a gate terminal being connected to a gate terminal of the transistor Mcm2, and a drain terminal being connected to a drain terminal of the transistor M1. In addition, in the transistor Mcm1, the gate terminal and the drain terminal are connected to each other.

The transistor Mcm2 is a PMOS and has a source terminal being connected to the power source line, a gate terminal being connected to the gate terminal of the transistor Mcm1, and a drain terminal being connected to the other end of the capacitor C1 and the low input impedance circuit Z.

The transistors Mcm1 and Mcm2 configure a current mirror circuit (second current mirror circuit). An input terminal of the current mirror circuit is a drain terminal of the transistor Mcm1, and an output terminal thereof is the drain terminal of the transistor Mcm2. In a case where the sizes of the transistors Mcm1 and Mcm2 are the same, a current flowing through the transistor Mcm1 and a current flowing through the transistor Mcm2 are the same.

The low input impedance circuit Z is connected to the other end of the capacitor C1 and the drain terminal of the transistor Mcm2. The low input impedance circuit Z adds a current flowing from the other end of the capacitor C1 to an output current output from the drain terminal of the transistor Mcm2.

In this embodiment, a current $Isignal \times (1+sC1R1)$ of a sum of the signal current Isignal and a current $Isignal \times R1 \times sC1$ flowing through the capacitor C1 flows through the transistor M1. This is similar to that illustrated in FIG. 1.

Here, in a case where the sizes of the transistors Mcm1 and Mcm2 are the same, a current flowing through the transistor Mcm2 is a current flowing through the transistor Mcm1, in other words, a current flowing through the transistor M1 and is $Isignal \times (1+sC1R1)$. Meanwhile, a current flowing out from the other end of the capacitor C1 is $Isignal \times sC1R1$.

Accordingly, a current $Isignal \times (1+2sC1R1)$ that is a sum of a current $Isignal \times (1+sC1R1)$ flowing through the transistor Mcm2 and a current $Isignal \times sC1R1$ flowing out from the other end of the capacitor C1 flows through the low input impedance circuit Z.

As can be understood from the equation described above, according to the configuration illustrated in FIG. 23, the capacitance value C1 can be decreased to be a half of that of the first embodiment. In other words, a time constant similar to that of the first embodiment can be realized by using a capacitance value C1 that is a half of that according to the first embodiment.

Figure 24:
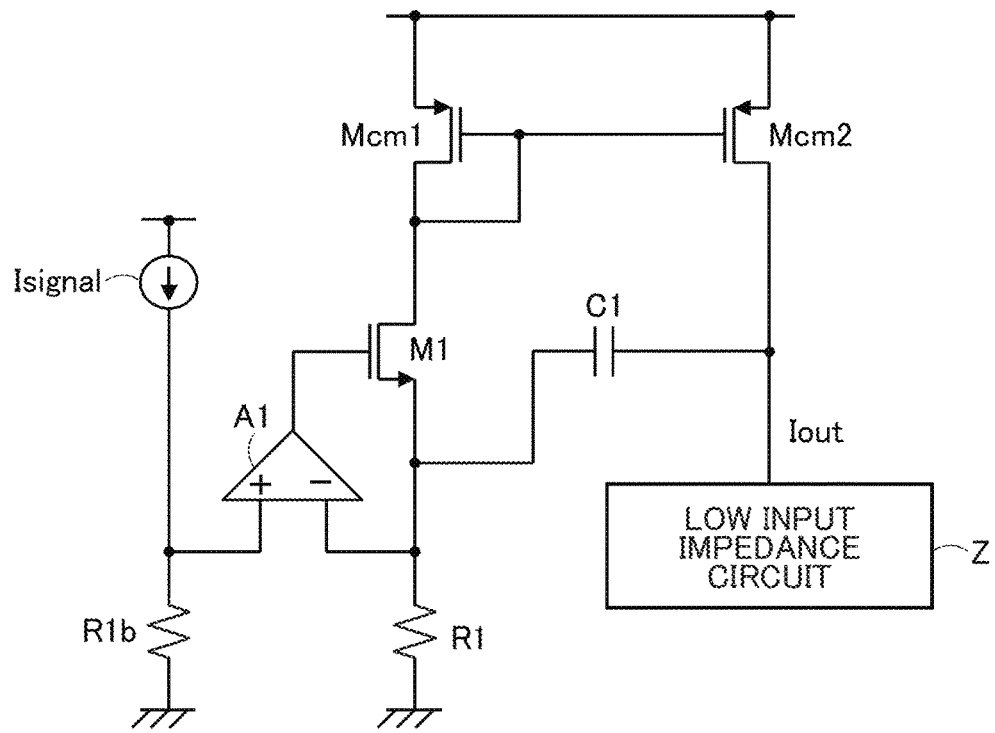
FIG. 24 is a diagram that illustrates a waveform shaping filter according to the eighth embodiment.

FIG. 24 is a diagram that illustrates a waveform shaping filter acquired by applying a current mirror circuit (fourth current mirror circuit) and a low input impedance circuit Z to the third embodiment. The configurations of the current mirror circuit and the low input impedance circuit Z are similar to those illustrated in FIG. 23. In other words, the input terminal of the current mirror circuit illustrated in FIG. 24 is the drain terminal of the transistor M1, and the output terminal thereof is the drain terminal of the transistor Mcm2. The other configurations are similar to those illustrated in FIG. 9.

In the example illustrated in FIG. 24, similarly to the case illustrated in FIG. 23, a current flowing through the low input impedance circuit Z is a sum of a current $Isignal \times (1+sC1R1)$ flowing through the transistor M1 and a current $Isignal \times sC1R1$ flowing out from the other end of the capacitor C1. This is similar to that illustrated in FIG. 23.

Thus, by employing such the configuration illustrated in FIG. 24, the capacitance value C1 can be decreased to be a half of that of the third embodiment. In other words, a time constant similar to that of the third embodiment can be realized by using a capacitance value C1 that is a half of that according to the third embodiment.

In this embodiment, while the other end of the capacitor C1 is connected to the current mirror circuit, a configuration may be employed in which the capacitor C1 is divided, and only a part thereof is connected to the current mirror circuit. In addition, the low input impedance circuit Z may be realized by the gate-grounded amplification circuit, the regulated cascode circuit, or the transimpedance circuit, respectively illustrated in FIGS. 20 to 22, or the like.

Ninth Embodiment

A waveform shaping filter according to a ninth embodiment will be described with reference to FIGS. 25 to 30.

Figure 25:
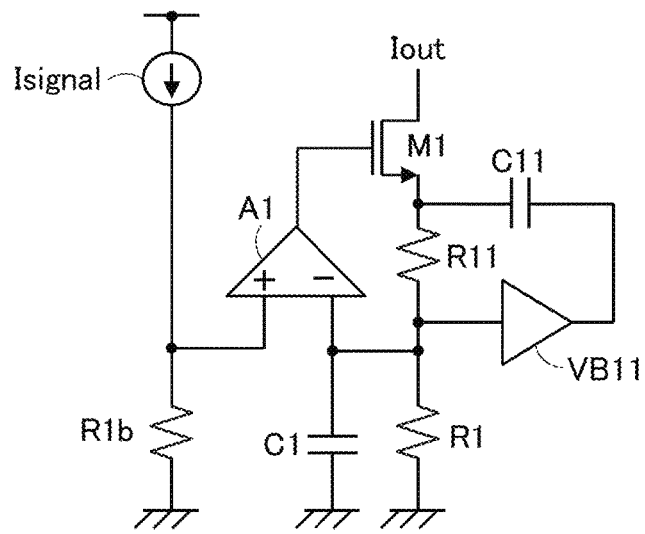
FIG. 25 is a diagram that illustrates a waveform shaping filter according to a ninth embodiment.

FIG. 25 is a diagram that illustrates the waveform shaping filter according to this embodiment. As illustrated in FIG. 25, the waveform shaping filter according to this embodiment further includes a resistor R11, a capacitor C11, and a voltage buffer VB11. The other configurations are similar to those illustrated in FIG. 9.

The resistor R11 (eighth resistor) includes one end and the other hand. One end of the resistor R11 is connected to the source terminal of the transistor M1 and one end of the capacitor C11, and the other end thereof is connected to the other end of the resistor R1, the negative input terminal of the amplifier A1, one end of the capacitor C1, and the input terminal of the voltage buffer VB11.

The capacitor C11 (ninth capacitor) includes one end and the other end. One end of the capacitor C11 is connected to the source terminal of the transistor M1 and one end of the resistor R11, and the other end thereof is connected to the output terminal of the voltage buffer VB11.

The voltage buffer VB11 includes an input terminal and an output terminal. The input terminal of the voltage buffer VB11 is connected to the other end of the resistor R1, one end of the capacitor C1, the other end of the resistor R11, and the negative input terminal of the amplifier A1, and the output terminal thereof is connected to the other end of the capacitor C11.

Next, the operation of the waveform shaping filter according to this embodiment will be described.

As described above, the waveform shaping filter has a configuration in which the output of the amplifier A1 is fed back to the negative input terminal of the amplifier A1 through the transistor M1 and the resistor R11. According to such negative feedback, the positive input terminal and the negative input terminal of the amplifier A1 become virtual short, and the voltage of the negative input terminal is approximately the same as the voltage of the positive input terminal.

The signal current Isignal transmitted from the current source Isignal flows through the resistor R1$b$ to be converted into a voltage. For this reason, the voltage of the positive input terminal of the amplifier A1 is Isignal×R1$b$. Since the voltages of the positive input terminal and the negative input terminal are approximately the same, the voltage of the negative input terminal is Isignal×R1$b$ as well. Accordingly, a current of Isignal×R1$b$/R1 flows through the resistor R1, and a current of Isignal×R1$b$×sC1 flows through the capacitor C1.

Since the current flowing through the resistor R1 and the capacitor C1 flows through the resistor R11, the voltage (the voltage of the source terminal of the transistor M1) of one end of the resistor R11 is Isignal×R1$b$[1+(1+sC1R1)R11/R1]. A voltage applied to the capacitor C11 is Isignal×R1$b$[1+(1+sC1R1)R11/R1]−Isignal×R1$b$=Isignal×R1$b$×R11×(1+sC1R1)/R1, and a current flowing through the capacitor C11 is Isignal×R1$b$×R11×sC11 (1+sC1R1)/R1.

As a result, a current of Isignal×R1$b$×(1+sC1R1)(1+sC11R11)/R1 that is a sum of the currents flowing through the resistor R11 and the capacitor C11 flows through the transistor M1 and is output from the drain terminal as the output current Iout.

As described above, the waveform shaping filter according to this embodiment outputs a sum of the current acquired by superimposing the differentiation component of the signal current Isignal on the current that is proportional to the input signal current Isignal and a current that is proportional to the differentiation component of the superimposed current. By employing such a configuration, a filter characteristic enhancing a high-frequency component, which is appropriate for a case where the signal current Isignal has a frequency characteristic acquired by passing a first-order low pass filter twice, can be realized.

In this embodiment, the load of the amplifier A1 is only the gate of the transistor M1. The gate can be approximated as a small capacitive load. Accordingly, the current driving capacity of the amplifier A1 does not need to be raised, and the power consumption of the waveform shaping filter can be reduced.

Figure 26:
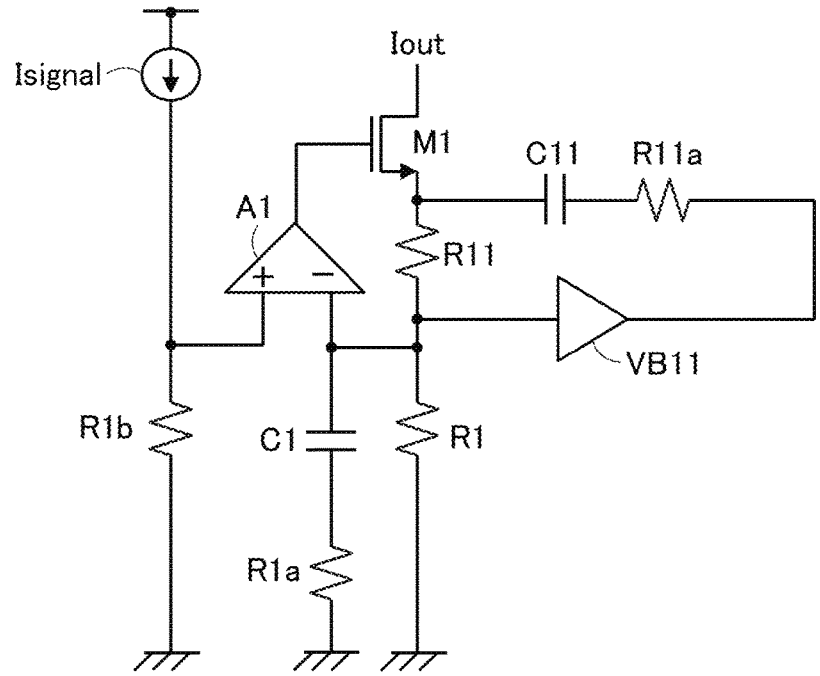
FIG. 26 is a diagram that illustrates a modified example of the waveform shaping filter illustrated in FIG. 25.

Furthermore, as illustrated in FIG. 26, by respectively connecting the resistors R1$a$ and R11$a$ in series with the capacitors C1 and C11, it may be configured such that the resistance values R1 and R11 are decreased, voltages applied to the resistors R1 and R11 are decreased, and thus, the voltage of the source terminal of the transistor M1 is decreased. In this way, by decreasing the power source voltage of the waveform shaping filter, the power consumption can be further reduced.

First Example

Figure 27:
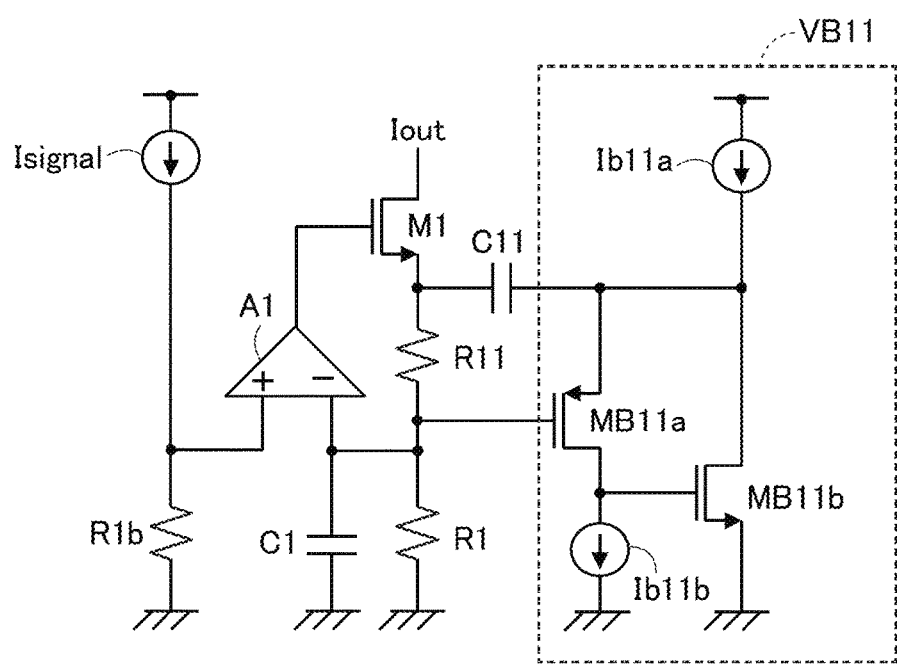
FIG. 27 is a diagram that illustrates a first example of the waveform shaping filter illustrated in FIG. 25.

FIG. 27 is a diagram that illustrates a first example of the waveform shaping filter according to this embodiment. In this example, the voltage buffer VB11 includes transistors MB11$a$ and MB11$b$ and current sources Ib11$a$ and Ib11$b$.

The transistor MB11$a$ is a PMOS and has a drain terminal being connected to the current source Ib11$b$ and a gate terminal of the transistor MB11$b$, a source terminal being connected to a drain terminal of the transistor MB11$b$, the current source Ib11$a$, and the other end of the capacitor C11, and a gate terminal being connected to the other end of the resistor R1, one end of the capacitor C1, the negative input terminal of the amplifier A11, and the other end of the resistor R11. The gate terminal of the transistor MB11$a$ is an input terminal of the voltage buffer VB11, and the source terminal thereof is an output terminal of the voltage buffer VB11.

The transistor MB11$b$ is an NMOS and has a source terminal being grounded, a gate terminal being connected to the current source Ib11$b$ and the drain terminal of the transistor MB11$a$, and a drain terminal being connected to the current source Ib11$a$, the source terminal of the transistor MB11$a$, and the other end of the capacitor C11. The drain terminal of the transistor MB11$b$ is an output terminal of the voltage buffer VB11.

The current sources Ib11$a$ and Ib11$b$ respectively supply bias currents Ib11$a$ and Ib11$b$ to the transistors MB11$a$ and MB11$b$.

Feedback is applied by the transistor MB11$b$ to the transistor MB11$a$ such that the bias current Ib11$b$ supplied from the current source Ib11$b$ flows through the transistor MB11$a$. For example, when the voltage of the gate terminal of the transistor MB11$a$ increases (decreases), at that moment, the gate-to-source voltage of the transistor MB11$a$ decreases (increases), and the current flowing through the transistor MB11$a$ becomes lower (higher) than the bias current Ib11$b$.

As a result, the voltage of the gate terminal of the transistor MB11$b$ decreases (increases), the current flowing through the transistor MB11$b$ decreases (increases), the ratio of the current supplied from the current source Ib11$a$ to the transistor MB11$a$ increases (decreases), the voltage of the source terminal of the transistor MB11$a$ increases (decreases), and accordingly, the bias current Ib11$b$ flows through the transistor MB11$a$.

In this way, since the feedback is applied such that the current flowing through the transistor MB11$a$ is the bias current Ib11$b$, the gate-to-source voltage of the transistor MB11$a$ is approximately constant. Accordingly, the voltage of the source terminal of the transistor MB11$a$ is a voltage acquired by shifting the level by the gate-to-source voltage in accordance with a voltage applied to the gate terminal. Accordingly, the function of the voltage buffer VB11 is realized.

In addition, since the feedback is applied such that the current flowing through the transistor MB11$a$ is the bias current Ib11$b$, a current flowing out from the other end of the capacitor C11 flows through the transistor MB11$b$.

Tenth Embodiment

Figure 28:
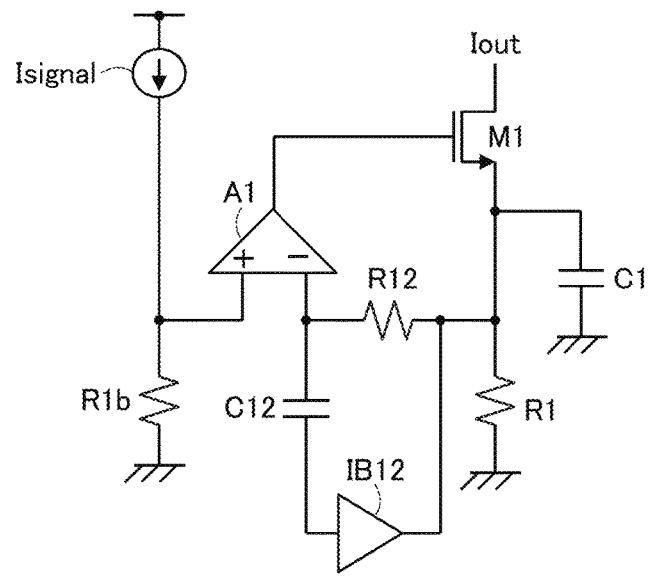
FIG. 28 is a diagram that illustrates a waveform shaping filter according to a tenth embodiment.

A waveform shaping filter according to a tenth embodiment will be described with reference to FIGS. 28 and 29. FIG. 28 is a diagram that illustrates the waveform shaping filter according to this embodiment. As illustrated in FIG. 28, the waveform shaping filter according to this embodiment includes: a resistor R12; a capacitor C12; and a current buffer IB12. The other configurations are similar to those illustrated in FIG. 9.

The resistor R12 (ninth resistor) includes one end and the other end. The one end of the resistor R12 is connected to the negative input terminal of the amplifier A1 and one end of the capacitor C12, and the other end thereof is connected to the other end of the resistor R1, the source terminal of the transistor M1, one end of the capacitor C1, and an output terminal of the current buffer IB12.

The capacitor C12 (tenth capacitor) includes one end and the other end. The one end of the capacitor C12 is connected to the negative input terminal of the amplifier A1 and one end of the resistor R12, and the other end is connected to an input terminal of the current buffer IB12.

The current buffer IB12 includes an input terminal and an output terminal. The input terminal of the current buffer IB12 is connected to the other end of the capacitor C12, and the output terminal thereof is connected to the other end of the resistor R1, the source terminal of the transistor M1, one end of the capacitor C1, and the other end of the resistor R12.

Next, the operation of the waveform shaping filter according to this embodiment will be described.

As described above, the waveform shaping filter has a configuration in which the output of the amplifier A1 is fed back to the negative input terminal of the amplifier A1 through the transistor M1 and the resistor R12. According to such negative feedback, the positive input terminal and the negative input terminal of the amplifier A1 become virtual short, and the voltage of the negative input terminal is approximately the same as the voltage of the positive input terminal.

The signal current Isignal transmitted from the current source Isignal flows through the resistor R1$b$ to be converted into a voltage. For this reason, the voltage of the positive input terminal of the amplifier A1 is Isignal×R1$b$. Since the voltages of the positive input terminal and the negative input terminal are approximately the same, the voltage of the negative input terminal is Isignal×R1$b$ as well. The other end of the capacitor C12 is connected to the input terminal of the current buffer IB12, and the input impedance of the current buffer IB12 is low, and accordingly, a current of Isignal×R1$b$×sC12 flows through the capacitor C12.

Since this current flows through the resistor R12, the voltage of one end of the resistor R12 is Isignal×R1$b$+ Isignal×R1$b$×sC12R12×Isignal×R1$b$×(1+sC12R12). Accordingly, a current of Isignal×R1$b$×(1+sC12R12)/R1 flows through the resistor R1, and a current of Isignal×R1$b$× (1+sC12R12)×sC1 flows through the capacitor C1.

The current Isignal×R1$b$×sC12 flowing through the resistor R12 is offset at one end of the resistor R12 by an output current of the current buffer IB12 that has the same magnitude and opposite polarity. Accordingly, a current of Isignal× R1$b$×(1+sC12R12)(1+sC1R1)/R1 that is a sum of the currents flowing through the resistor R1 and the capacitor C1 flows through the transistor M1 and is output from the drain terminal as the output current Iout.

As described above, the waveform shaping filter according to this embodiment outputs a sum of the current acquired by superimposing the differentiation component of the signal current Isignal on the current that is proportional to the input signal current Isignal and a current that is proportional to the differentiation component of the superimposed signal. By employing such a configuration, a filter characteristic enhancing a high-frequency component, which is appropriate for a case where the signal current Isignal has a frequency characteristic acquired by passing a first-order low pass filter twice, can be realized.

In this embodiment, the load of the amplifier A1 is only the gate of the transistor M1. The gate can be approximated as a small capacitive load. Accordingly, the current driving capacity of the amplifier A1 does not need to be raised, and the power consumption of the waveform shaping filter can be reduced.

First Example

Figure 29:
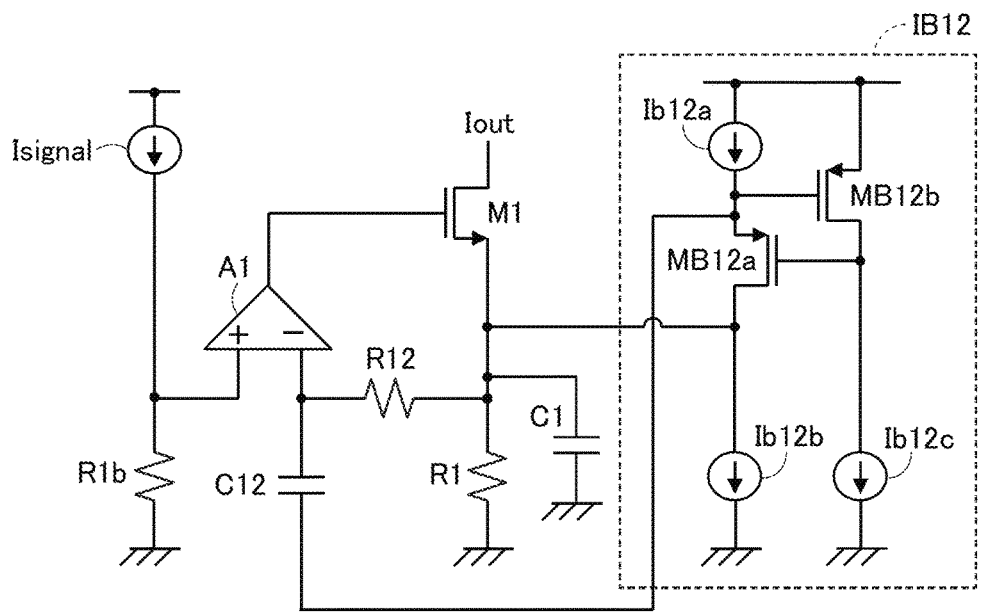
FIG. 29 is a diagram that illustrates a first example of the waveform shaping filter illustrated in FIG. 28.

FIG. 29 is a diagram that illustrates a first example of the waveform shaping filter according to this embodiment. In this example, as illustrated in FIG. 29, the current buffer IB12 includes transistors MB12$a$ and MB12$b$ and current sources Ib12$a$, Ib12$b$, and Ib12$c$.

The transistor MB12$a$ is a PMOS and has a drain terminal being connected to the current source Ib12$b$, the source terminal of the transistor M1, one end of the capacitor C1, the other end of the resistor R1, and the other end of the resistor R12, a gate terminal being connected to the drain terminal of the transistor MB12$b$ and the current source Ib12$c$, and a source terminal being connected to the current source Ib12$a$, the gate terminal of the transistor MB12$b$, and the other end of the capacitor C12. The drain terminal of the transistor MB12$a$ is an output terminal of the current buffer IB12, and the source terminal of the transistor MB12$a$ is an input terminal of the current buffer IB12.

The transistor MB12$b$ is a PMOS and has a drain terminal being connected to the current source Ib12$c$ and the gate terminal of the transistor MB12$a$, a gate terminal being connected to the source terminal of the transistor MB12$a$, the current source Ib12$a$, and the other end of the capacitor C12, and a source terminal being connected to the power source line. The gate terminal of the transistor MB12$b$ is the input terminal of the current buffer IB12.

The current sources Ib12$a$, Ib12$b$, and Ib12$c$ respectively supply bias currents Ib12$a$, Ib12$b$, and Ib12$c$ to the transistors MB12$a$ and MB12$b$.

By configuring such a configuration, the current buffer IB12 according to this embodiment can be configured.

Eleventh Embodiment

Figure 30:
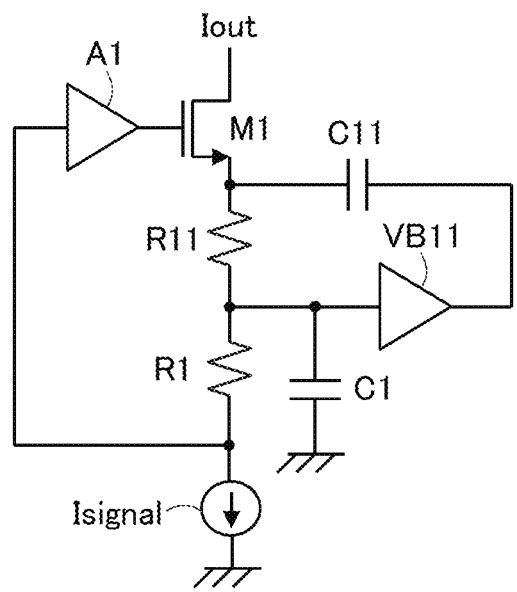
FIG. 30 is a diagram that illustrates a waveform shaping filter according to an eleventh embodiment.

A waveform shaping filter according to an eleventh embodiment will be described with reference to FIG. 30. FIG. 30 is a diagram that illustrates the waveform shaping filter according to this embodiment. As illustrated in FIG.

30, the waveform shaping filter according to this embodiment includes: a resistor R11 (tenth resistor); a capacitor C11 (eleventh capacitor); and a voltage buffer VB11. The other configurations are similar to those illustrated in FIG. 1. In addition, the configurations of the resistor R11, the capacitor C11, and the voltage buffer VB11 are similar to those illustrated in FIG. 27.

By employing such a configuration, when a signal current Isignal is input from the current source Isignal, the signal current Isignal flows through the resistor R1, and the voltage of the other end of the resistor R1 becomes Isignal×R1. Accordingly, a current of Isignal×R1×sC1 flows through the capacitor C1. Through the resistor R11, a current of Isignal×(1+sC1R1) that is a sum of the current flowing through the resistor R1 and the current flowing through the capacitor C1 flows.

Accordingly, the voltage of the source terminal of the transistor M1 is Isignal×R1+Isignal×R11×(1+sC1R1). As the voltage of the other end of the capacitor C11, a voltage of Isignal×R1 is applied through the voltage buffer VB11. Accordingly, a voltage of Isignal×R11×(1+sC1R1) is applied to the capacitor C11, and a flowing current becomes Isignal×sC11R11×(1+sC1R1). A current of Isignal×(1+sC1R1)(1+sC11R11) that is a sum of the current flowing through the resistor R11 and the current flowing through the capacitor C11 flows through the transistor M1 and is output as the output current Iout from the drain terminal.

As described above, the waveform shaping filter according to this embodiment outputs a sum of the current acquired by superimposing the differentiation component of the signal current Isignal on the current that is proportional to the input signal current Isignal and a current that is proportional to the differentiation component of the superimposed current. By employing such a configuration, a filter characteristic enhancing a high-frequency component, which is appropriate for a case where the signal current Isignal has a frequency characteristic acquired by passing a first-order low pass filter twice, can be realized.

In this embodiment, the load of the amplifier A1 is only the gate of the transistor M1. The gate can be approximated as a small capacitive load. Accordingly, the current driving capacity of the amplifier A1 does not need to be raised, and the power consumption of the waveform shaping filter can be reduced.

Twelfth Embodiment

Figure 31:
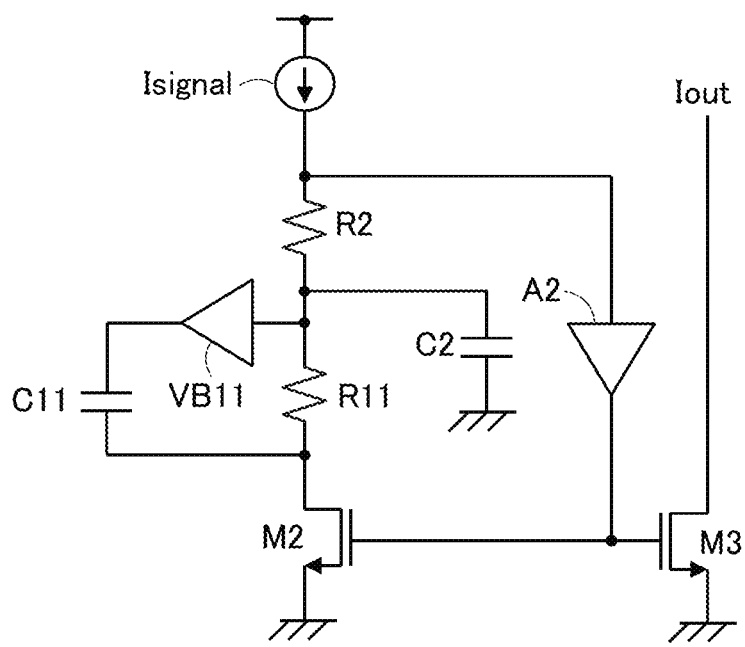
FIG. 31 is a diagram that illustrates a waveform shaping filter according to a twelfth embodiment.

A waveform shaping filter according to a twelfth embodiment will be described with reference to FIG. 31. FIG. 31 is a diagram that illustrates the waveform shaping filter according to this embodiment. As illustrated in FIG. 31, the waveform shaping filter according to this embodiment includes: a resistor R11; a capacitor C11; and a voltage buffer VB11. The other configurations are similar to those illustrated in FIG. 5. In addition, the configurations of the resistor R11, the capacitor C11, and the voltage buffer VB11 are similar to those illustrated in FIG. 27.

By employing such a configuration, when a signal current Isignal is input from the current source Isignal, the signal current Isignal flows through the resistor R2, and the voltage of the other end of the resistor R2 becomes Isignal×R2. Accordingly, a current of Isignal×R2×sC2 flows through the capacitor C2. Through the resistor R11, a current of Isignal×(1+sC2R2) that is a sum of the current flowing through the resistor R2 and the current flowing through the capacitor C2 flows.

Accordingly, the voltage of the drain terminal of the transistor M2 is Isignal×R2+Isignal×R11×(1+sC2R2). As the voltage of the other end of the capacitor C11, a voltage of Isignal×R2 is applied through the voltage buffer VB11. Accordingly, a voltage of Isignal×R11×(1+sC2R2) is applied to the capacitor C11, and a flowing current becomes Isignal×sC11R11×(1+sC2R2). A current of Isignal×(1+sC2R2)(1+sC11R11) that is a sum of the current flowing through the resistor R11 and the current flowing through the capacitor C11 flows through the transistor M2.

In this embodiment, since the voltages of the gate terminals and the source terminals of the transistors M2 and M3 are the same, a current that is "device size ratio" times of a current flowing through the transistor M2 flows through the transistor M3. Thus, in a case where the sizes of the transistors M2 and M3 are the same, a current of Isignal×(1+sC2R2)(1+sC11R11) is output from the drain terminal of the transistor M3 as an output current Iout.

As described above, the waveform shaping filter according to this embodiment outputs a sum of the current acquired by superimposing the differentiation component of the signal current Isignal on the current that is proportional to the input signal current Isignal and a current that is proportional to the differentiation component of the superimposed current. Accordingly, a filter characteristic enhancing a high-frequency component, which is appropriate for a case where the signal current Isignal has a frequency characteristic acquired by passing a first-order low pass filter twice, can be realized.

In this embodiment, the load of the amplifier A2 is only the gates of the transistors M2 and M3. The gate can be approximated as a small capacitive load. Accordingly, the current driving capacity of the amplifier A2 does not need to be raised, and the power consumption of the waveform shaping filter can be reduced.

Thirteenth Embodiment

Figure 32:
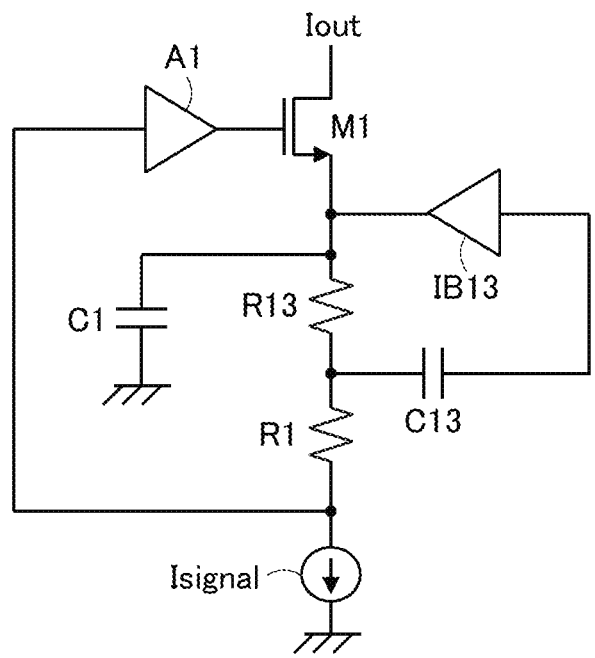
FIG. 32 is a diagram that illustrates a waveform shaping filter according to a thirteenth embodiment.

A waveform shaping filter according to a thirteenth embodiment will be described with reference to FIG. 32. FIG. 32 is a diagram that illustrates the waveform shaping filter according to this embodiment. As illustrated in FIG. 32, the waveform shaping filter according to this embodiment includes: a resistor R13; a capacitor C13; and a current buffer IB13. The other configurations are similar to those illustrated in FIG. 1.

The resistor R13 (eleventh resistor) includes one end and the other end. The one end of the resistor R13 is connected to the other end of the resistor R1 and one end of the capacitor C13, and the other end thereof is connected to one end of the capacitor C1, the source terminal of the transistor M1, and an output terminal of the current buffer IB13.

The capacitor C13 (twelfth capacitor) includes one end and the other end. The one end of the capacitor C13 is connected to the other end of the resistor R1 and one end of the resistor R13, and the other end thereof is connected to an input terminal of the current buffer IB13.

The input terminal of the current buffer IB13 is connected to the other end of the capacitor C13, and the output terminal thereof is connected to the source terminal of the transistor M1, the other end of the resistor R13, and one end of the capacitor C1.

By employing such a configuration, when a signal current Isignal is input from the current source Isignal, the signal current Isignal flows through the resistor R1, and the voltage of the other end of the resistor R1 becomes Isignal×R1. The other end of the capacitor C13 is connected to the input terminal of the current buffer IB13, and the input impedance of the current buffer IB13 is low, and accordingly, a current of Isignal×R1×sC13 flows through the capacitor C13. Since this current flows through the resistor R13, a current of Isignal×(1+sC13R1) that is a sum of the current flowing through the resistor R1 and the current flowing through the capacitor C13 flows through the resistor R13.

Accordingly, the voltage of the source terminal of the transistor M1 is Isignal×R1+Isignal×R13×(1+sC13R1), and a current of Isignal×sC1R1+Isignal×sC1R13×(1+sC13R1) flows through the capacitor C1. Through the transistor M1, a current of Isignal×(1+sC1R1)+Isignal×sC1R13(1+sC13R1) that is acquired by subtracting the current flowing through the capacitor C13 through the current buffer IB13 from a sum of the current flowing through the capacitor C1 and the current flowing through the resistor R13 flows. Here, in a case where C13=C1, the current flowing through the transistor M1 is Isignal×(1+sC13R1)(1+sC1R13), and this current is output from the drain terminal as the output current Iout.

As described above, the waveform shaping filter according to this embodiment outputs a sum of the current acquired by superimposing the differentiation component of the signal current Isignal on the current that is proportional to the input signal current Isignal and a current that is proportional to the differentiation component of the superimposed current. By employing such a configuration, a filter characteristic enhancing a high-frequency component, which is appropriate for a case where the signal current Isignal has a frequency characteristic acquired by passing a first-order low pass filter twice, can be realized.

In this embodiment, the load of the amplifier A1 is only the gate of the transistor M1. The gate can be approximated as a small capacitive load. Accordingly, the current driving capacity of the amplifier A1 does not need to be raised, and the power consumption of the waveform shaping filter can be reduced.

Fourteenth Embodiment

Figure 33:
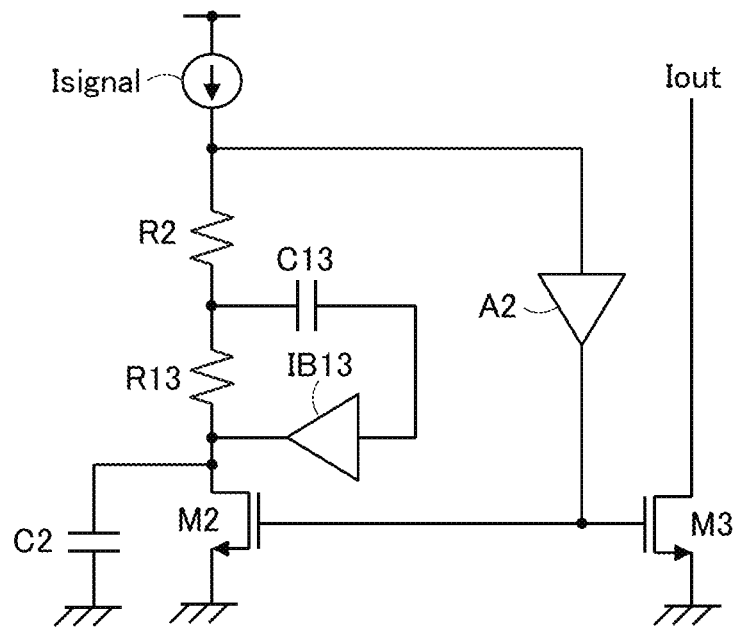
FIG. 33 is a diagram that illustrates a waveform shaping filter according to a fourteenth embodiment.

A waveform shaping filter according to a fourteenth embodiment will be described with reference to FIG. 33. FIG. 33 is a diagram that illustrates the waveform shaping filter according to this embodiment. As illustrated in FIG. 33, the waveform shaping filter according to this embodiment includes: a resistor R13; a capacitor C13; and a current buffer IB13. The other configurations are similar to those illustrated in FIG. 5. In addition, the configurations of the resistor R13, the capacitor C13, and the current buffer IB13 are similar to those illustrated in FIG. 32.

By employing such a configuration, when a signal current Isignal is input from the current source Isignal, the signal current Isignal flows through the resistor R2, and the voltage of the other end of the resistor R2 becomes Isignal×R2. The other end of the capacitor C13 is connected to the input terminal of the current buffer IB13, and the input impedance of the current buffer IB13 is low, and accordingly, a current of Isignal×R2×sC13 flows through the capacitor C13. Since this current flows through the resistor R13, a current of Isignal×(1+sC13R2) that is a sum of the current flowing through the resistor R2 and the current flowing through the capacitor C13 flows through the resistor R13.

Accordingly, the voltage of the drain terminal of the transistor M2 is Isignal×R2+Isignal×R13×(1+sC13R2), and a current of Isignal×sC2R2+Isignal×sC2R13×(1+sC13R2) flows through the capacitor C2. Through the transistor M2, a current of Isignal×(1+sC2R2)+Isignal×sC2R13(1+sC13R2) that is acquired by subtracting the current flowing through the capacitor C13 through the current buffer IB13 from a sum of the current flowing through the capacitor C2 and the current flowing through the resistor R13 flows. Here, in a case where C13=C2, the current flowing through the transistor M2 is Isignal×(1+sC13R2)(1+sC2R13).

In this embodiment, since the voltages of the gate terminals and the source terminals of the transistors M2 and M3 are the same, a current that is "device size ratio" times of a current flowing through the transistor M2 flows through the transistor M3. Thus, in a case where the sizes of the transistors M2 and M3 are the same, a current of Isignal×(1+sC13R2)(1+sC2R13) is output from the drain terminal of the transistor M3 as an output current Iout.

As described above, the waveform shaping filter according to this embodiment outputs a sum of the current acquired by superimposing the differentiation component of the signal current Isignal on the current that is proportional to the input signal current Isignal and a current that is proportional to the differentiation component of the superimposed current. By employing such a configuration, a filter characteristic enhancing a high-frequency component, which is appropriate for a case where the signal current Isignal has a frequency characteristic acquired by passing a first-order low pass filter twice, can be realized.

In this embodiment, the load of the amplifier A2 is only the gates of the transistors M2 and M3. The gate can be approximated as a small capacitive load. Accordingly, the current driving capacity of the amplifier A2 does not need to be raised, and the power consumption of the waveform shaping filter can be reduced.

Fifteenth Embodiment

Figure 34:
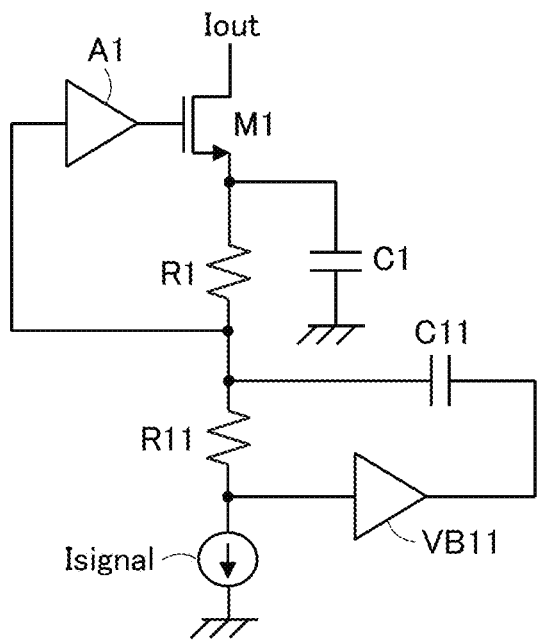
FIG. 34 is a diagram that illustrates a waveform shaping filter according to a fifteenth embodiment.

A waveform shaping filter according to a fifteenth embodiment will be described with reference to FIG. 34. FIG. 34 is a diagram that illustrates the waveform shaping filter according to this embodiment. As illustrated in FIG. 34, the waveform shaping filter according to this embodiment includes: a resistor R11 (twelfth resistor); a capacitor C11 (thirteenth capacitor); and a voltage buffer VB11. The other configurations are similar to those illustrated in FIG. 1. In addition, the configurations of the resistor R11, the capacitor C11, and the voltage buffer VB11 are similar to those illustrated in FIG. 27.

As can be understood from FIG. 34, the waveform shaping filter according to this embodiment is a modified example of the eleventh embodiment. In the eleventh embodiment, while the feedback circuit configured by the resistor R11, the capacitor C11, and the voltage buffer VB11 is connected between the transistor M1 and the resistor R1, in this embodiment, the feedback circuit is connected between the resistor R1 and the current source Isignal.

By employing such a configuration, when a signal current Isignal is input from the current source Isignal, the signal current Isignal flows through the resistor R11. Since the other end of the resistor R11 is connected to the input terminal of the amplifier A1 that is a virtual grounding point, the voltage of the other end of the resistor R11 is approximately constant. On the other hand, the voltage of one end of the resistor R11 is Isignal×R11. One end of the capacitor C11 is connected to the input terminal of the amplifier A1 that is a virtual grounding point as well, and the voltage Isignal×R11 of the one end of the resistor R11 is applied to the other end of the capacitor C11 through the voltage buffer VB11.

Accordingly, a current of Isignal×R11×sC11 flows through the capacitor C11. A current of Isignal×(1+sC11R11) that is a sum of the current flowing through the resistor R11 and the current flowing through the capacitor C11 flows through the resistor R1. Accordingly, the voltage of the source terminal of the transistor M1 becomes Isignal×R1×(1+sC11R11) and is applied to one end of the capacitor C1. Since the other end of the capacitor C1 is grounded, a voltage of Isignal×R1×(1+sC11R11) is applied to the capacitor C1. Thus, a current flowing through the capacitor C1 is Isignal×sC1R1×(1+sC11R11). As a result, a current of Isignal×(1+sC11R11)(1+sC1R1) that is a sum of the current flowing through the resistor R1 and the current flowing through the capacitor C1 flows through the transistor M1, and this current is output from the drain terminal as the output current Iout.

As described above, the waveform shaping filter according to this embodiment outputs a sum of the current acquired by superimposing the differentiation component of the signal current Isignal on the current that is proportional to the input signal current Isignal and a current that is proportional to the differentiation component of the superimposed current. By employing such a configuration, a filter characteristic enhancing a high-frequency component, which is appropriate for a case where the signal current Isignal has a frequency characteristic acquired by passing a first-order low pass filter twice, can be realized.

In this embodiment, the load of the amplifier A1 is only the gate of the transistor M1. The gate can be approximated as a small capacitive load. Accordingly, the current driving capacity of the amplifier A1 does not need to be raised, and the power consumption of the waveform shaping filter can be reduced.

Sixteenth Embodiment

Figure 35:
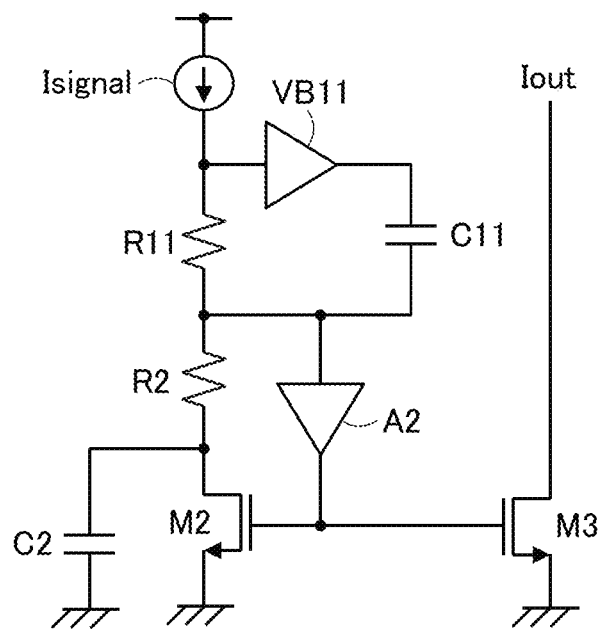
FIG. 35 is a diagram that illustrates a waveform shaping filter according to a sixteenth embodiment.

A waveform shaping filter according to a sixteenth embodiment will be described with reference to FIG. 35. FIG. 35 is a diagram that illustrates the waveform shaping filter according to this embodiment. As illustrated in FIG. 35, the waveform shaping filter according to this embodiment includes: a resistor R11 (twelfth resistor); a capacitor C11 (thirteenth capacitor); and a voltage buffer VB11. The other configurations are similar to those illustrated in FIG. 5. In addition, the configurations of the resistor R11, the capacitor C11, and the voltage buffer VB11 are similar to those illustrated in FIG. 27.

As can be understood from FIG. 35, the waveform shaping filter according to this embodiment is a modified example of the twelfth embodiment. In the twelfth embodiment, while the feedback circuit configured by the resistor R11, the capacitor C11, and the voltage buffer VB11 is connected between the transistor M2 and the resistor R2, in this embodiment, the feedback circuit is connected between the resistor R2 and the current source Isignal.

By employing such a configuration, when a signal current Isignal is input from the current source Isignal, the signal current Isignal flows through the resistor R11. Since the other end of the resistor R11 is connected to the input terminal of the amplifier A2 that is a virtual grounding point, the voltage of the other end of the resistor R11 is approximately constant. On the other hand, the voltage of one end of the resistor R11 is Isignal×R11. One end of the capacitor C11 is connected to the input terminal of the amplifier A2 that is a virtual grounding point as well, and the voltage Isignal×R11 of the one end of the resistor R11 is applied to the other end of the capacitor C11 through the voltage buffer VB11.

Accordingly, a current of Isignal×R11×sC11 flows through the capacitor C11. A current of Isignal×(1+sC11R11) that is a sum of the current flowing through the resistor R11 and the current flowing through the capacitor C11 flows through the resistor R2. Accordingly, the voltage of the drain terminal of the transistor M2 becomes Isignal×R2×(1+sC11R11) and is applied to one end of the capacitor C2. Since the other end of the capacitor C2 is grounded, a voltage of Isignal×R2×(1+sC11R11) is applied to the capacitor C2. Thus, a current flowing through the capacitor C2 is Isignal×sC2R2×(1+sC11R11). As a result, a current of Isignal×(1+sC11R11)(1+sC2R2) that is a sum of the current flowing through the resistor R2 and the current flowing through the capacitor C2 flows through the transistor M2.

In this embodiment, since the voltages of the gate terminals and the source terminals of the transistors M2 and M3 are the same, a current that is "device size ratio" times of a current flowing through the transistor M2 flows through the transistor M3. Thus, in a case where the sizes of the transistors M2 and M3 are the same, a current of Isignal×(1+sC11R11)(1+sC2R2) is output from the drain terminal of the transistor M3 as an output current Iout.

As described above, the waveform shaping filter according to this embodiment outputs a sum of the current acquired by superimposing the differentiation component of the signal current Isignal on the current that is proportional to the input signal current Isignal and a current that is proportional to the differentiation component of the superimposed current. By employing such a configuration, a filter characteristic enhancing a high-frequency component, which is appropriate for a case where the signal current Isignal has a frequency characteristic acquired by passing a first-order low pass filter twice, can be realized.

In this embodiment, the load of the amplifier A2 is only the gates of the transistors M2 and M3. The gate can be approximated as a small capacitive load. Accordingly, the current driving capacity of the amplifier A2 does not need to be raised, and the power consumption of the waveform shaping filter can be reduced.

Seventeenth Embodiment

Figure 36:
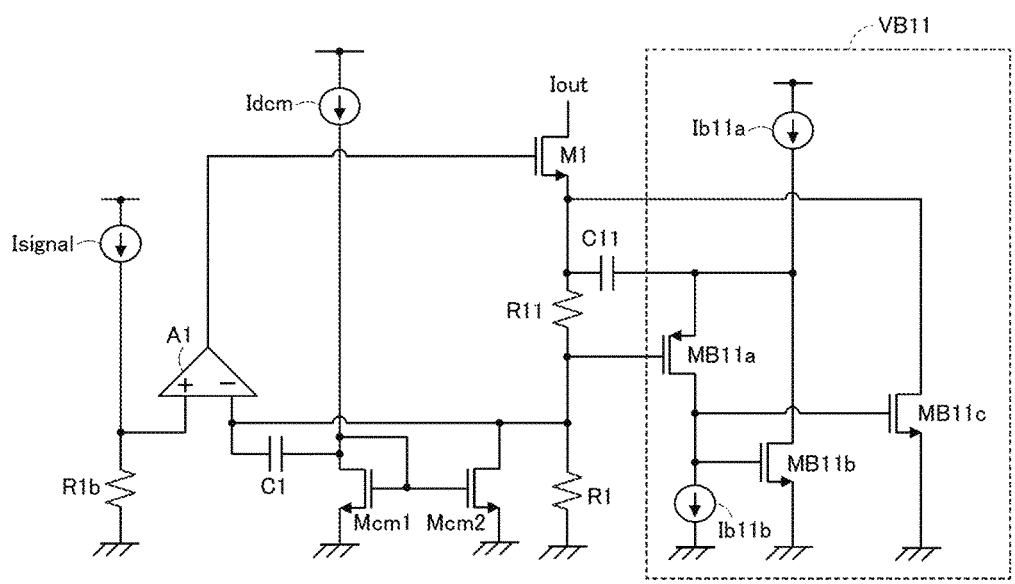
FIG. 36 is a diagram that illustrates a waveform shaping filter according to a seventeenth embodiment.

A waveform shaping filter according to a seventeenth embodiment will be described with reference to FIGS. 36 and 37. FIG. 36 is a diagram that illustrates the waveform shaping filter according to this embodiment. As illustrated in FIG. 36, the waveform shaping filter according to this embodiment includes transistors Mcm1 and Mcm2, a current source Idcm, and a transistor MB11c. The other configurations are similar to those illustrated in FIG. 27. The configuration of a current mirror circuit configured by the transistors Mcm1 and Mcm2 and the current source Idcm is similar to that illustrated in FIG. 15.

In this embodiment, one end of the capacitor C1 is connected to the drain terminal of the transistor Mcm2 that is an output terminal of the current mirror circuit, and the other end thereof is connected to the drain terminal of the transistor Mcm1 that is an input terminal of the current mirror circuit.

By employing such a configuration, a current flowing through the resistor R11 is a sum of the current flowing through the resistor R1, the current flowing through the capacitor C1, and a current acquired by replicating the current flowing through the capacitor C1 by using the current mirror circuit. For example, in a case where the sizes of the transistors Mcm1 and Mcm2 are the same, the current flowing through the resistor R11 is Isignal×R1b×(1+ 2sC1R1)/R1. Accordingly, the capacitance value C1 can be decreased to be a half of that of the ninth embodiment. In other words, a time constant similar to that of the ninth embodiment can be realized by using a capacitance value C1 that is a half of that according to the ninth embodiment.

In the description presented above, while a case in which the sizes of the transistors Mcm1 and Mcm2 are the same has been described as an example, in this embodiment, the sizes of the transistors Mcm1 and Mcm2 may be different from each other. By configuring the channel width of the transistor Mcm2 to be k times of the channel width of the transistor Mcm1, the capacitance value C1 can be configured to be 1/(1+k) times of that according to the ninth embodiment.

In the example illustrated in FIG. 36, while the other end of the capacitor C1 is connected to the current mirror circuit, a configuration may be employed in which the capacitor C1 is divided, and only a part thereof is connected to the current mirror circuit.

Meanwhile, the transistor MB11c is an NMOS and has a source terminal being grounded, a gate terminal being connected to the current source Ib11b, the drain terminal of the transistor MB11a, and the gate terminal of the transistor MB11b, and a drain terminal being connected to the source terminal of the transistor M1, one end of the capacitor C11, and one end of the resistor R11.

By employing such a configuration, the gate-to-source voltage of the transistor MB11c and the gate-to-source voltage of the transistor MB11b are the same. Here, for example, in a case where the sizes of the transistors MB11b and MB11c are configured to be the same, a current acquired by replicating the current flowing through the transistor MB11b flows through the transistor MB11c, and this current is added to a current flowing into one end of the capacitor C11. As a result, a current that is twice the current flowing into one end of the capacitor C11 flows through the transistor M1. Accordingly, the capacitance value C11 can be decreased to be a half of that of the ninth embodiment. In other words, a time constant similar to that of the ninth embodiment can be realized by using a capacitance value C11 that is a half of that according to the ninth embodiment.

In the description presented above, while a case in which the sizes of the transistors MB11b and MB11c are the same has been described as an example, in this embodiment, the sizes of the transistors MB11b and MB11c may be different from each other. By configuring the channel width of the transistor MB11c to be k times of the channel width of the transistor MB11b, the capacitance value C11 can be configured to be 1/(1+k) times of that of the ninth embodiment.

Figure 37:
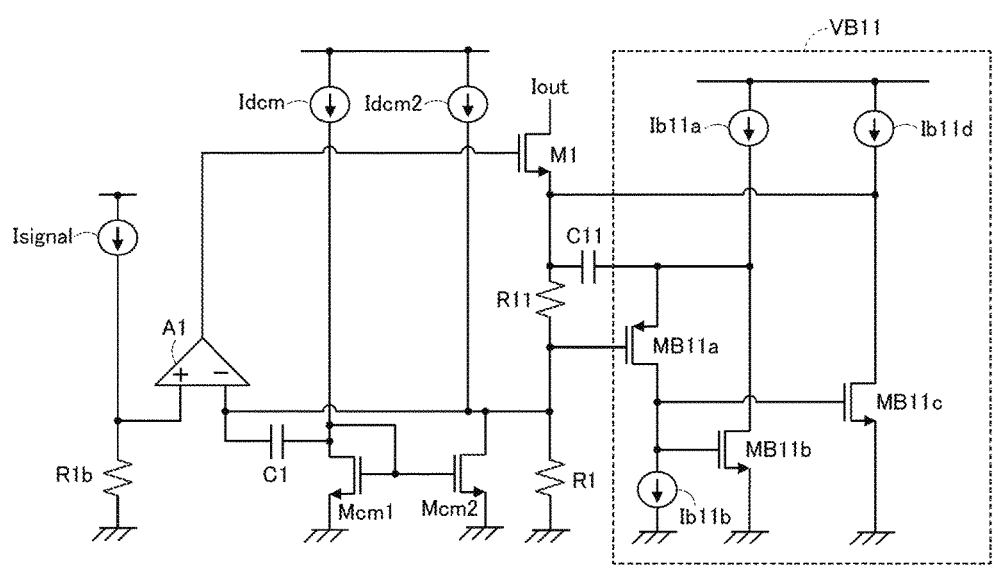
FIG. 37 is a diagram that illustrates a modified example of the waveform shaping filter illustrated in FIG. 36.

In addition, in this embodiment, as illustrated in FIG. 37, a current source Idcm2 may be added to the current mirror circuit, or a current source Ib11d may be added to the voltage buffer 11VB. By adding the current source Idcm2, a part or the whole of the bias current flowing through the transistor Mcm2 is canceled not to flow through the resistor R11, and accordingly, a DC voltage applied to the resistor R11 can be decreased. In addition, by adding the current source Ib11d, a part or the whole of the bias current flowing through the transistor MB11c is canceled not to flow through the transistor M1, and accordingly, the bias current flowing through the transistor M1 can be decreased.

Eighteenth Embodiment

Figure 38:
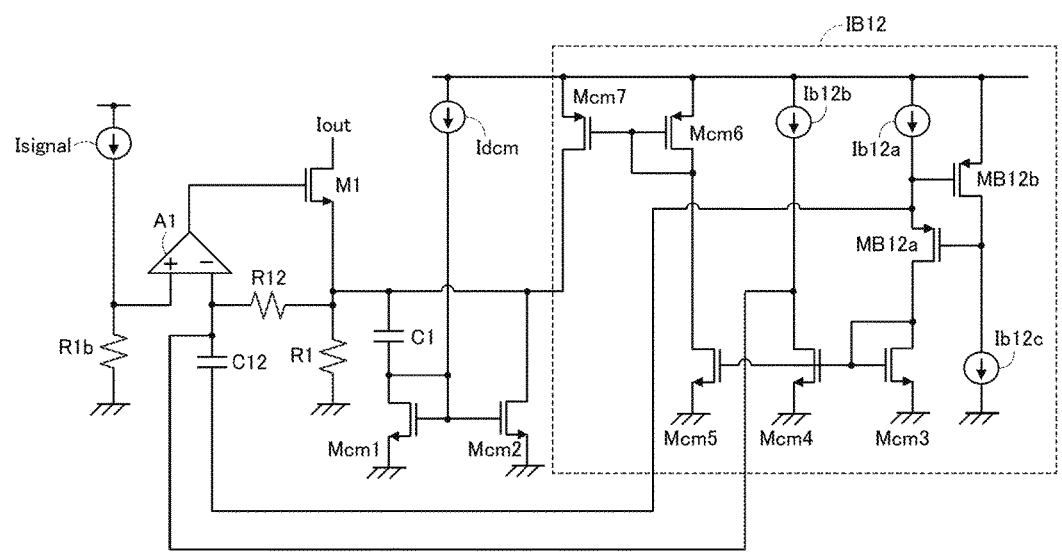
FIG. 38 is a diagram that illustrates a waveform shaping filter according to an eighteenth embodiment.

A waveform shaping filter according to an eighteenth embodiment will be described with reference to FIGS. 38 and 39. FIG. 38 is a diagram that illustrates the waveform shaping filter according to this embodiment. As illustrated in FIG. 38, the waveform shaping filter according to this embodiment includes transistors Mcm1 to Mcm7 and a current source Idcm. The other configurations are similar to those illustrated in FIG. 29. A current mirror circuit configured by the transistors Mcm1 and Mcm2 and the current source Idcm is similar to that illustrated in FIG. 15.

In this embodiment, the current buffer IB12 further includes the transistors Mcm3 to Mcm7.

The transistor Mcm3 is an NMOS and has a source terminal being grounded, a gate terminal being connected to the gate terminals of the transistors Mcm4 and Mcm5, and a drain terminal being connected to the drain terminal of the transistor MB12a. In addition, the gate terminal and the drain terminal of the transistor Mcm3 are connected to each other.

The transistor Mcm4 is an NMOS and has a source terminal being grounded, a gate terminal being connected to the gate terminals of the transistors Mcm3 and Mcm5, and a drain terminal being connected to the current source Ib12b, the negative input terminal of the amplifier A1, one end of the resistor R12, and one end of the capacitor C12.

The transistor Mcm5 is an NMOS and has a source terminal being grounded, a gate terminal being connected to the gate terminals of the transistors Mcm3 and Mcm4, and a drain terminal being connected to the drain terminal of the transistor Mcm6.

The transistor Mcm6 is a PMOS and has a source terminal being connected to the power source line, a gate terminal being connected to the gate terminal of the transistor Mcm7, and a drain terminal being connected to the drain terminal of the transistor Mcm5. In addition, the gate terminal and the drain terminal of the transistor Mcm6 are connected to each other.

The transistor Mcm7 is a PMOS and has a source terminal being connected to the power source line, a gate terminal being connected to the gate terminal of the transistor Mcm6, and a drain terminal being connected to the other end of the capacitor C1. The drain terminal of the transistor Mcm7 is an output terminal of the current buffer IB12.

The transistors Mcm3 to Mcm7 configure a current mirror circuit. The current source Ib12b supplies a bias current Ib12b used for operating this current mirror.

As described with reference to FIG. 29, the current flowing into the current buffer IB12 from the other end of the capacitor C12 is input to the source terminal of the transistor MB12a and is output from the drain terminal of the transistor MB12a. The current output from the drain terminal of the transistor MB12a is input to the current mirror circuit from the drain terminal of the transistor Mcm3 and is replicated by the transistors Mcm4 and Mcm5.

In addition, the current replicated by the transistor Mcm5 is turned back (the polarity is inverted) by the transistors Mcm6 and Mcm7 and is output from the drain terminal of the transistor Mcm7. Here, for example, in a case where the sizes of the transistors Mcm3 to Mcm5 are the same, and the size of the transistor Mcm7 is configured to be twice the size of the transistor Mcm6, a current having the same magnitude as the current flowing into the current buffer IB12 from the other end of the capacitor C12 is drawn from the transistor Mcm4, and a current that is twice the current flowing through the capacitor C12 flows through the resistor R12.

Meanwhile, a current that is twice the current flowing into the current buffer IB12 from the other end of the capacitor C12 is supplied from the transistor Mcm7 to one end of the resistor R12 and offsets the current (the current that is twice the current flowing through the capacitor C12) supplied from the other end of the resistor R12. Accordingly, the voltage of one end of the resistor R12 is Isignal×R1$b$×(1+ 2sC12R12). Thus, the capacitance value C12 can be decreased to be a half of that according to the tenth embodiment. In other words, a time constant that is similar to that according to the tenth embodiment can be realized by using the capacitance value C12 that is a half of that according to the tenth embodiment.

In the description presented above, while a case has been described as an example in which the sizes of the transistors Mcm3 to Mcm5 are the same, and the size of the transistor Mcm7 is twice the size of the transistor Mcm6, the size of each transistor is not limited thereto in this embodiment. For example, by configuring the channel width of the transistor Mcm4 to be k times of the channel width of the transistor Mcm3 and configuring the channel width of the transistor Mcm7 to be (1+k) times of the channel width of the transistor Mcm6, the capacitance value C12 can be configured to be 1/(1+k) times of that of the tenth embodiment.

In this embodiment, one end of the capacitor C1 is connected to the drain terminal of the transistor Mcm2 that is the output terminal of the current mirror circuit, and the other end thereof is connected to the drain terminal of the transistor Mcm1 that is the input terminal of the current mirror circuit. In addition, the current source Idcm supplies a bias current Idcm used for operating the current mirror circuit.

By employing such a configuration, in a case where the sizes of the transistors Mcm1 and Mcm2 are the same, a current of Isignal×R1$b$×(1+2sC12R12)(1+2sC1R1)/R1 that is a sum of the current flowing through the resistor R1 and the current flowing through the capacitor C1 flows through the transistor M1 and is output from the drain terminal as the output current Iout. Accordingly, the capacitance value C1 can be decreased to be a half of that according to the tenth embodiment. In other words, a time constant similar to that according to the tenth embodiment can be realized by using the capacitance value C1 that is a half of that according to the tenth embodiment.

In the description presented above, while a case in which the sizes of the transistors Mcm1 and Mcm2 are the same has been described as an example, in this embodiment, the sizes of the transistors Mcm1 and Mcm2 may be different from each other. For example, by configuring the channel width of the transistor Mcm2 to be k times of the channel width of the transistor Mcm1, the capacitance value C1 can be configured to be 1/(1+k) times of that according to the tenth embodiment.

In the example illustrated in FIG. 38, while the other end of the capacitor C1 is connected to the current mirror circuit, a configuration may be employed in which the capacitor C1 is divided, and only a part thereof is connected to the current mirror circuit.

Figure 39:
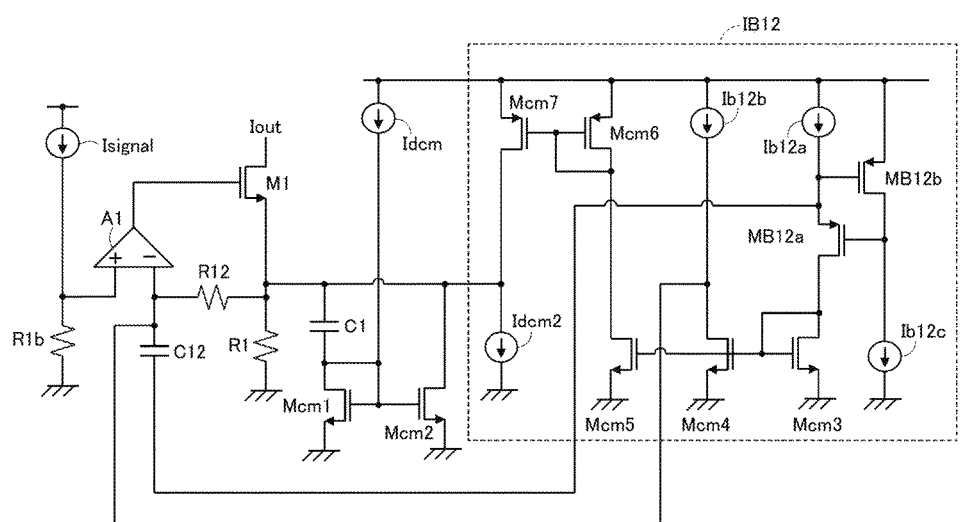
FIG. 39 is a diagram that illustrates a modified example of the waveform shaping filter illustrated in FIG. 38.

Furthermore, as illustrated in FIG. 39, by adding a current source Idcm2 to the current mirror circuit, the bias current flowing through the transistor M1 may be increased.

Nineteenth Embodiment

Figure 40:
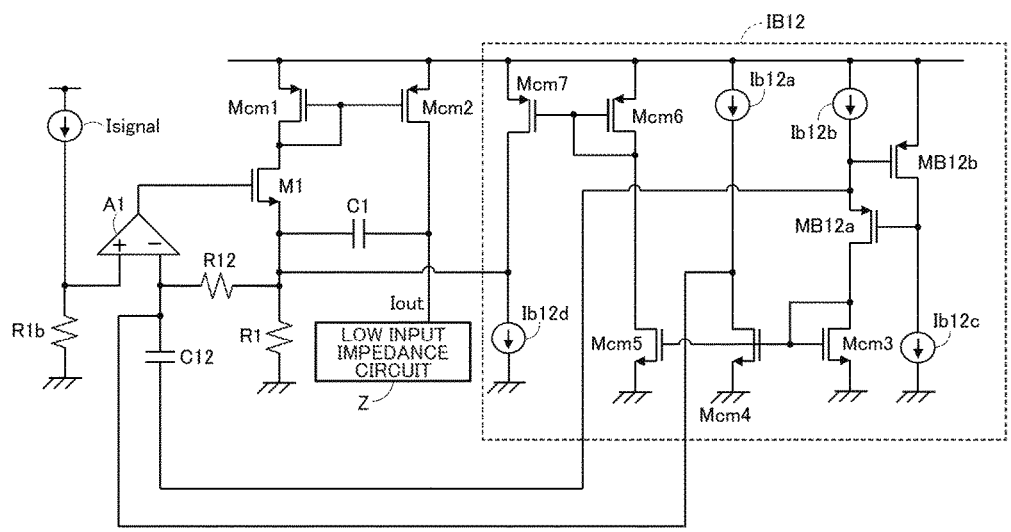
FIG. 40 is a diagram that illustrates a waveform shaping filter according to a nineteenth embodiment.
Figure 42:
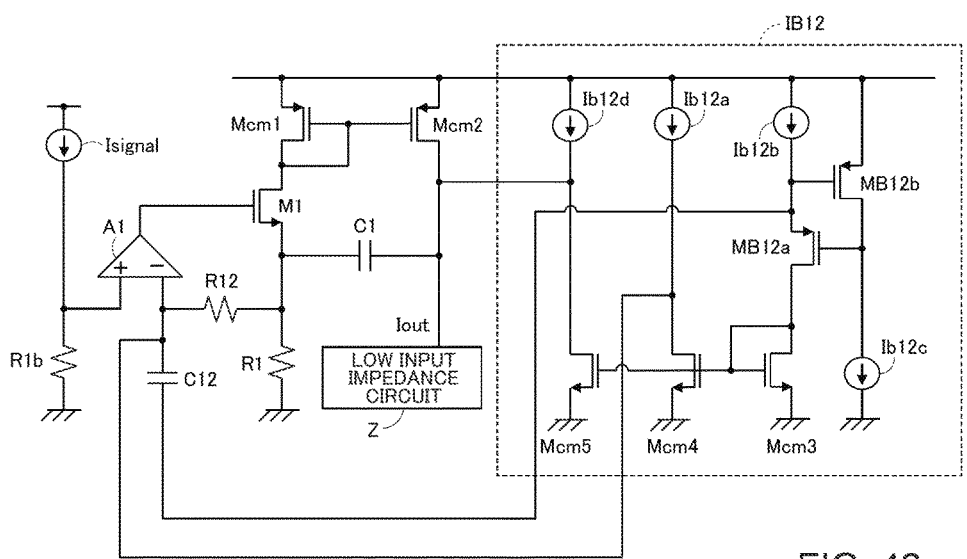
FIG. 42 is a diagram that illustrates a modified example of the waveform shaping filter illustrated in FIG. 40.

A waveform shaping filter according to a nineteenth embodiment will be described with reference to FIGS. 40 and 42. FIG. 40 is a diagram that illustrates the waveform shaping filter according to this embodiment. As illustrated in FIG. 40, the waveform shaping filter according to this embodiment includes transistors Mcm1 and Mcm2 and a low input impedance circuit Z. The other configurations are similar to those illustrated in FIG. 28. In addition, the configuration of the current buffer IB12 is similar to that illustrated in FIG. 39. Furthermore, the configurations of the current mirror circuit configured by the transistors Mcm1 and Mcm2 and the low input impedance circuit Z are similar to those illustrated in FIG. 23.

By employing such a configuration, a current of Isignal× R1$b$×(1+2sC12R12)(1+sC1R1)/R1 that is a sum of the current flowing through the resistor R1 and the current flowing through the capacitor C1 flows through the transistor M1. Through the low input impedance circuit Z, a current of Isignal×R1$b$×(1+2sC12R12)(1+sC1R1)/R1 that is a sum of a current acquired by replicating the current flowing through the transistor M1 in accordance with the current mirror circuit and the current Isignal×R1$b$×(1+2sC12R12)×sC1R1/ R1 flowing through the capacitor C1 flows. Accordingly, the capacitance values C1 and C12 can be decreased to be a half of that of the tenth embodiment. In other words, a time constant similar to that according to the tenth embodiment can be realized by using the capacitance values C1 and C12 that are halves of those according to the tenth embodiment.

Figure 41:
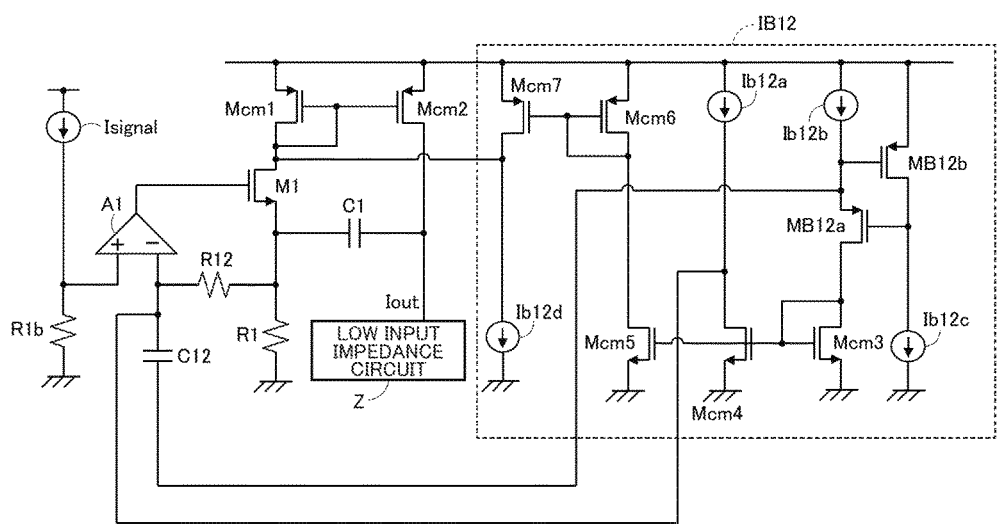
FIG. 41 is a diagram that illustrates a modified example of the waveform shaping filter illustrated in FIG. 40.

In the case illustrated in FIG. 40, while the current that is twice the current flowing through the capacitor C12 is offset by using the source terminal of the transistor M1, it may be executed by using the drain terminal of the transistor M1. This, as illustrated in FIG. 41 can be configured by connecting the drain terminal of the transistor Mcm7 that is the output terminal of the current buffer IB21 to the source terminal of the transistor M1.

Furthermore, the size of the transistor Mcm5 may be configured to be twice the size of the transistor Mcm3, and the current that is twice the current flowing through the capacitor C12 may be offset by using the input terminal of the low input impedance circuit Z. This, as illustrated in FIG. 42, can be executed by excluding the transistors Mcm6 and Mcm7 from the current buffer IB12 and connecting the drain terminal of the transistor Mcm6 to the input terminal of the low input impedance circuit Z as the output terminal of the current buffer IB12.

In addition, in this embodiment, the current buffer IB12 may be configured not to include at least one of the current sources Ib12$a$ and Ib12$d$ and may be configured similarly to the configuration illustrated in FIG. 29.

Twentieth Embodiment

Figure 43:
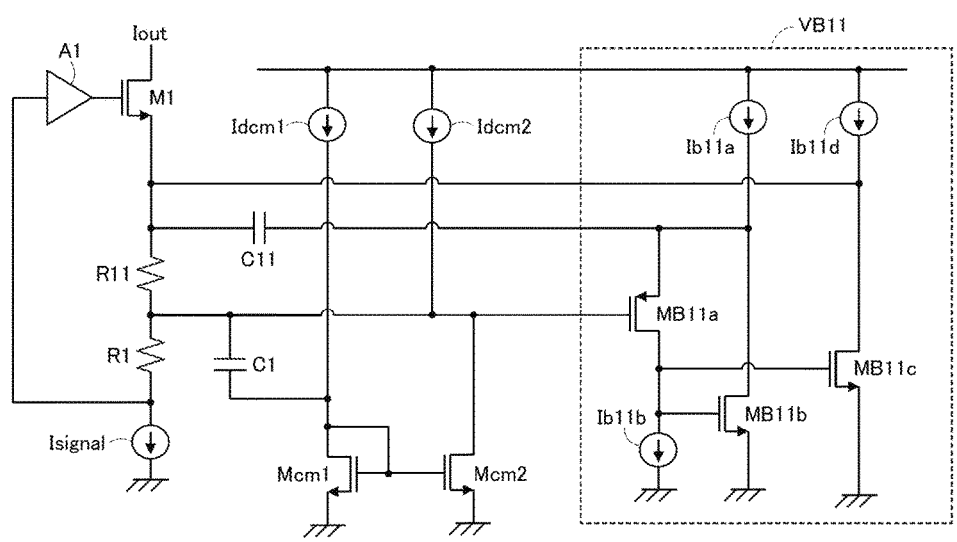
FIG. 43 is a diagram that illustrates a waveform shaping filter according to a twentieth embodiment.

A waveform shaping filter according to a twentieth embodiment will be described with reference to FIG. 43. FIG. 43 is a diagram that illustrates the waveform shaping filter according to this embodiment. As illustrated in FIG. 43, the waveform shaping filter according to this embodiment includes transistors Mcm1 and Mcm2 and current sources Idcm1 and Idcm2. The other configurations are similar to those illustrated in FIG. 30. The configurations of a current mirror circuit configured by the transistors Mcm1 and Mcm2 and the current sources Idcm1 and Idcm2 and a voltage buffer VB11 are similar to those illustrated in FIG. 37.

As illustrated in FIG. 43, one end of the capacitor C1 is connected to the drain terminal of the transistor Mcm2 that is an output terminal of the current mirror circuit, and the other end thereof is connected to the drain terminal of the transistor Mcm1 that is an input terminal of the current mirror circuit. The current source Idcm1 supplies a bias current Idcm1 used for operating the current mirror circuit. The current source Idcm2 cancels a part or the whole of the bias current flowing through the transistor Mcm2 and decreases the bias current flowing through the resistor R11, thereby decreasing a DC voltage applied to the resistor R11.

By employing such a configuration, in a case where the sizes of the transistors Mcm1 and Mcm2 are the same, a current flowing through the resistor R11 is a sum of the current flowing through the resistor R1, the current flowing through the capacitor C1, and a current acquired by replicating the current flowing through the capacitor C1 by using the current mirror circuit. For example, in a case where the sizes of the transistors Mcm1 and Mcm2 are the same, the current flowing through the resistor R11 is Isignal×(1+2sC1R1). Accordingly, the capacitance value C1 can be decreased to be a half of that of the eleventh embodiment. In other words, a time constant similar to that of the eleventh embodiment can be realized by using a capacitance value C1 that is a half of that according to the eleventh embodiment.

In the description presented above, while a case in which the sizes of the transistors Mcm1 and Mcm2 are the same has been described as an example, in this embodiment, the sizes of the transistors Mcm1 and Mcm2 may be different from each other. For example, by configuring the channel width of the transistor Mcm2 to be k times of the channel width of the transistor Mcm1, the capacitance value C1 can be configured to be 1/(1+k) times of that according to the eleventh embodiment.

In the example illustrated in FIG. 43, while the other end of the capacitor C1 is connected to the current mirror circuit, a configuration may be employed in which the capacitor C1 is divided, and only a part thereof is connected to the current mirror circuit.

In the case illustrated in FIG. 43, the gate terminal of the transistor MB11c is connected to the gate terminal of the transistor MB11b, and the source terminals of the transistors MB11b and MB11c are grounded. Accordingly, the gate-to-source voltage of the transistor MB11c and the gate-to-source voltage of the transistor MB11b are the same.

Here, for example, in a case where the size of the transistor MB11c is configured to be the same as the size of the transistor MB11b, a current acquired by replicating the current flowing through the transistor MB11b flows through the transistor MB11c, and this current is added to a current flowing into one end of the capacitor C11. As a result, a current that is twice the current flowing into one end of the capacitor C11 flows through the transistor M1. Accordingly, the capacitance value C11 can be decreased to be a half of that of the eleventh embodiment. In other words, a time constant similar to that of the eleventh embodiment can be realized by using a capacitance value C11 that is a half of that according to the eleventh embodiment.

In the description presented above, while a case in which the sizes of the transistors MB11b and MB11c are the same has been described as an example, in this embodiment, the sizes of the transistors MB11b and MB11c may be different from each other. For example, by configuring the channel width of the transistor MB11c to be k times of the channel width of the transistor MB11b, the capacitance value C11 can be configured to be 1/(1+k) times of that of the eleventh embodiment.

In this embodiment, the whole or a part of the bias current flowing through the transistor MB11c is supplied by the current source Ib11d. Accordingly, the degree of freedom of design of the bias current flowing through the transistor M1 can be improved.

21st Embodiment

Figure 44:
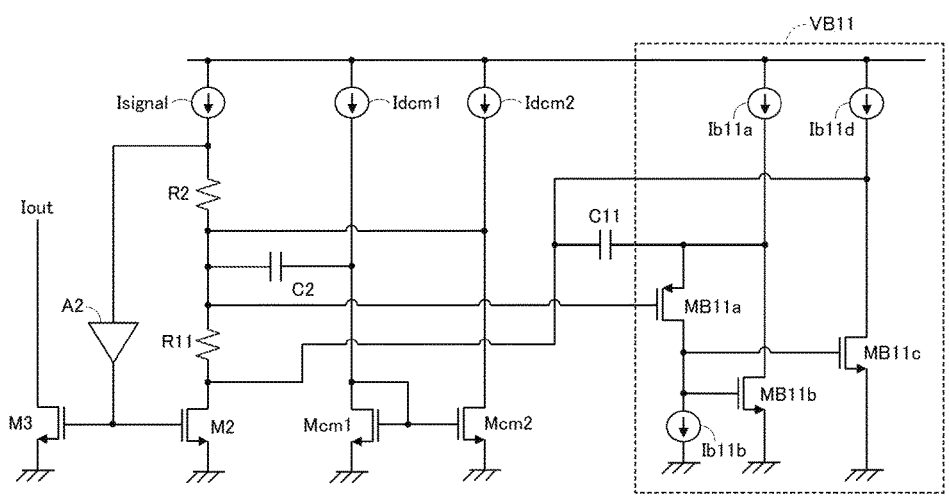
FIG. 44 is a diagram that illustrates a waveform shaping filter according to a 21st embodiment.

A waveform shaping filter according to a 21st embodiment will be described with reference to FIG. 44. FIG. 44 is a diagram that illustrates the waveform shaping filter according to this embodiment. As illustrated in FIG. 44, the waveform shaping filter according to this embodiment includes transistors Mcm1 and Mcm2 and current sources Idcm1 and Idcm2. The other configurations are similar to those illustrated in FIG. 31. The configurations of a current mirror circuit configured by the transistors Mcm1 and Mcm2 and the current sources Idcm1 and Idcm2 and a voltage buffer VB11 are similar to those illustrated in FIG. 37.

As illustrated in FIG. 44, one end of the capacitor C2 is connected to the drain terminal of the transistor Mcm2 that is an output terminal of the current mirror circuit, and the other end thereof is connected to the drain terminal of the transistor Mcm1 that is an input terminal of the current mirror circuit. The current source Idcm1 supplies a bias current Idcm1 used for operating the current mirror circuit. The current source Idcm2 cancels a part or the whole of the bias current flowing through the transistor Mcm2 and decreases the bias current flowing through the resistor R11, thereby decreasing a DC voltage applied to the resistor R11.

By employing such a configuration, a current flowing through the resistor R11 is a sum of the current flowing through the resistor R2, the current flowing through the capacitor C2, and a current acquired by replicating the current flowing through the capacitor C2 by using the current mirror circuit. For example, in a case where the sizes of the transistors Mcm1 and Mcm2 are the same, the current flowing through the resistor R11 is Isignal×(1+2sC2R2). Accordingly, the capacitance value C2 can be decreased to be a half of that of the twelfth embodiment. In other words, a time constant similar to that of the twelfth embodiment can be realized by using a capacitance value C2 that is a half of that according to the twelfth embodiment.

In the description presented above, while a case in which the sizes of the transistors Mcm1 and Mcm2 are the same has been described as an example, in this embodiment, the sizes of the transistors Mcm1 and Mcm2 may be different from each other. For example, by configuring the channel width of the transistor Mcm2 to be k times of the channel width of the transistor Mcm1, the capacitance value C2 can be configured to be 1/(1+k) times of that according to the twelfth embodiment.

In the example illustrated in FIG. 44, while the other end of the capacitor C2 is connected to the current mirror circuit, a configuration may be employed in which the capacitor C2 is divided, and only a part thereof is connected to the current mirror circuit.

In the case illustrated in FIG. 44, the gate terminal of the transistor MB11c is connected to the gate terminal of the transistor MB11b, and the source terminals of the transistors MB11b and MB11c are grounded. Accordingly, the gate-to-source voltage of the transistor MB11c and the gate-to-source voltage of the transistor MB11b are the same. Here, for example, in a case where the size of the transistor MB11c is configured to be the same as the size of the transistor MB11b, a current acquired by replicating the current flowing through the transistor MB11b flows through the transistor MB11c, and this current is added to a current flowing into one end of the capacitor C11. As a result, a current that is twice the current flowing into one end of the capacitor C11 flows through the transistor M2. Accordingly, the capacitance value C11 can be decreased to be a half of that of the twelfth embodiment. In other words, a time constant similar to that of the twelfth embodiment can be realized by using a capacitance value C11 that is a half of that according to the twelfth embodiment.

In the description presented above, while a case in which the sizes of the transistors MB11b and MB11c are the same has been described as an example, in this embodiment, the sizes of the transistors MB11b and MB11c may be different from each other. For example, by configuring the channel width of the transistor MB11c to be k times of the channel width of the transistor MB11b, the capacitance value C11 can be configured to be 1/(1+k) times of that of the twelfth embodiment.

22nd Embodiment

Figure 45:
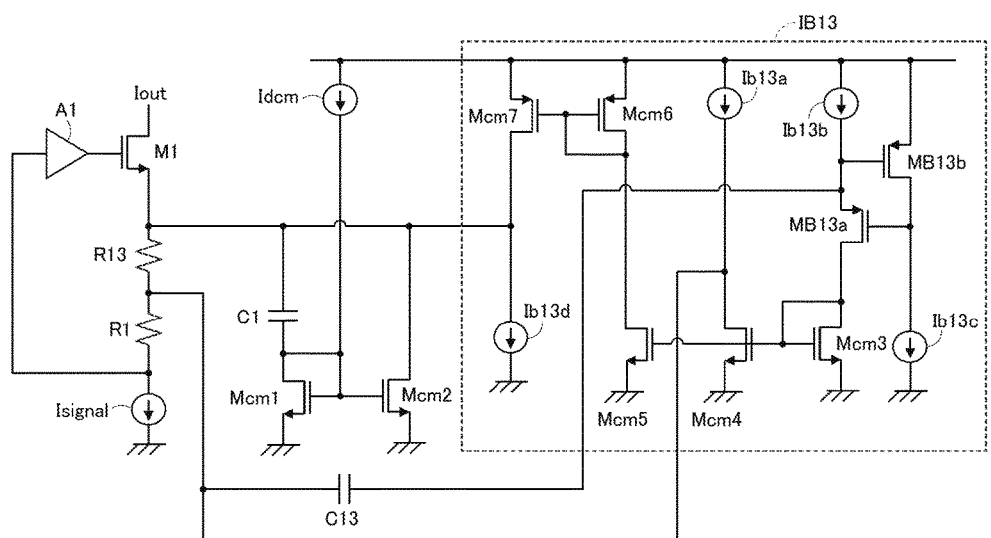
FIG. 45 is a diagram that illustrates a waveform shaping filter according to a 22nd embodiment.

A waveform shaping filter according to a 22nd embodiment will be described with reference to FIG. 45. FIG. 45 is a diagram that illustrates the waveform shaping filter according to this embodiment. As illustrated in FIG. 45, the waveform shaping filter according to this embodiment includes transistors Mcm1 and Mcm2 and a current source Idcm. The other configurations are similar to those illustrated in FIG. 32. The configuration of a current mirror circuit configured by the transistors Mcm1 and Mcm2 and the current source Idcm is similar to that illustrated in FIG. 15.

In addition, a current buffer IB13 includes: transistors Mcm3 to Mcm7; current sources Ib13a to Ib13d; and transistors MB13a and MB13b. The current buffer IB13 has a configuration similar to the current buffer IB12 illustrated in FIG. 39, and the current sources Ib13a to Ib13d and the transistors MB13a and MB13b of the current buffer IB13 respectively correspond to the current sources Ib12a to Ib12d and the transistors MB12a and MB12b of the current buffer IB12.

As illustrated in FIG. 45, the gate terminal and the drain terminal of the transistor Mcm3 are respectively connected to the gate terminals of the transistors Mcm4 and Mcm5. In addition, the drain terminal of the transistor Mcm5 is connected to the gate terminal and the drain terminal of the transistor Mcm6 and the gate terminal of the transistor Mcm7. The current source Ib13a supplies a bias current to the transistor Mcm4.

As described with reference to FIG. 29, the current flowing into the current buffer IB13 from the other end of the capacitor C13 is input to the source terminal of the transistor MB13a and is output from the drain terminal. The current output from the drain terminal of the transistor MB13a is input to the current mirror circuit from the drain terminal of the transistor Mcm3 that is the input terminal of the current mirror circuit and is replicated by the transistors Mcm4 and Mcm5.

In addition, the current replicated by the transistor Mcm5 is turned back (the polarity is inverted) by the current mirror circuit configured by the transistors Mcm6 and Mcm7 and is output from the drain terminal of the transistor Mcm7.

Here, for example, in a case where the sizes of the transistors Mcm3 to Mcm5 are the same, and the size of the transistor Mcm7 is configured to be twice the size of the transistor Mcm6, a current having the same magnitude as the current flowing into the current buffer IB13 from the other end of the capacitor C13 is drawn from the transistor Mcm4, and a current that is twice the current flowing through the capacitor C13 flows through the resistor R13.

In other words, a current of Isignal×(1+2sC13R1) flows through the resistor R13. Accordingly, the voltage of the source terminal of the transistor M1 is Isignal×R1+Isignal× R13×(1+2sC13R1). A current of Isignal×sC1R1+Isignal× sC1R13×(1+2sC13R1) flows through the capacitor C1.

Meanwhile, a current that is twice the current flowing into the current buffer IB13 from the other end of the capacitor C13 is supplied from the transistor Mcm7 to the other end of the resistor R13 and offsets the current (the current that is twice the current flowing through the capacitor C13) Isignal×2sC13R1 supplied from one end of the resistor R13.

The one end of the capacitor C1 is connected to the drain terminal of the transistor Mcm2 that is the output terminal of the current mirror circuit, and the other end thereof is connected to the drain terminal of the transistor Mcm1 that is the input terminal of the current mirror circuit. The current source Idcm supplies a bias current Idcm used for operating the current mirror circuit.

By employing such a configuration, in a case where the sizes of the transistors Mcm1 and Mcm2 are the same, a current of Isignal×(1+2sC13R1)(1+2sC1R13)+Isignal× 2sR1(C1−C13) that is acquired by subtracting the current that is twice the current flowing through the capacitor C13 from a sum of the current flowing through the resistor R13 and the current that is twice the current flowing through the capacitor C1 flows through the transistor M1 and is output from the drain terminal as the output current Iout.

Here, by setting C13=C1, Iout=Isignal×(1+2sC13R1)(1+ 2sC1R13). Thus, in this embodiment, by setting C13=C1, the capacitance values C1 and C13 can be decreased to be halves of those according to the thirteenth embodiment. In other words, a time constant similar to that according to the thirteenth embodiment can be realized by using the capacitance values C1 and C13 that are halves of those according to the thirteenth embodiment.

23rd Embodiment

Figure 46:
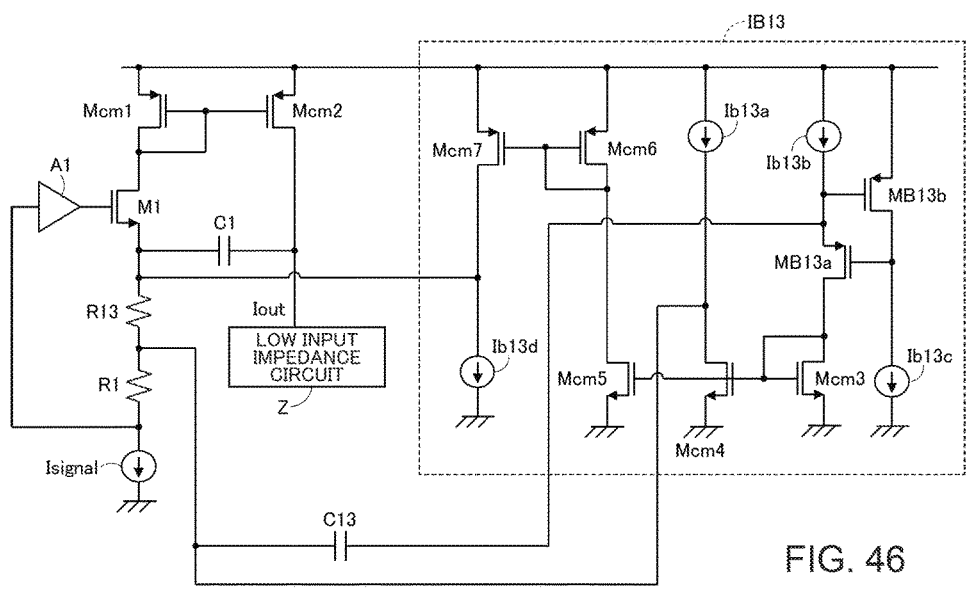
FIG. 46 is a diagram that illustrates a waveform shaping filter according to a 23rd embodiment.

A waveform shaping filter according to a 23rd embodiment will be described with reference to FIG. 46. FIG. 46 is a diagram that illustrates the waveform shaping filter according to this embodiment. As illustrated in FIG. 46, the waveform shaping filter according to this embodiment includes transistors Mcm1 and Mcm2 and a low input impedance circuit Z. The other configurations are similar to those illustrated in FIG. 32. In addition, the configurations of the transistors Mcm1 and Mcm2 and the low input impedance circuit Z are similar to those illustrated in FIG. 23. Furthermore, the configuration of the current buffer IB13 is similar to that illustrated in FIG. 45.

As illustrated in FIG. 46, the waveform shaping filter according to this embodiment connects the output terminal (the drain terminal of the transistor M1) of the waveform shaping filter illustrated in FIG. 32 to the input terminal (the drain terminal of the transistor Mcm1) of the current mirror circuit configured by the transistors Mcm1 and Mcm2 and connects the output terminal (the drain terminal of the transistor Mcm2) of the current mirror circuit to the low input impedance circuit. In addition, the other end of the capacitor C1 is connected to the output terminal (the drain terminal of the transistor Mcm2) of the current mirror circuit and the low input impedance circuit Z.

As described above, the current Isignal×2sC13R1 that is twice the current flowing through the capacitor C13 is offset at the other end of the resistor R13, and accordingly, a current of Isignal×(1+2sC13R1)(1+sC1R13)+Isignal×2sR1 (C1−C13) flows through the transistor M1. Through the low input impedance circuit Z, a current of Isignal×(1+ 2sC13R1)(1+2sC1R13)+Isignal×2sR1(C1−C13) that is a sum of the current acquired by replicating the current flowing through the transistor M1 by using the current mirror circuit and the current Isignal×(1+2sC13R1)×sC1R13 flowing through the capacitor C1 flows.

Here, by setting C13=C1, the current input to the low input impedance circuit is Isignal×(1+2sC13R1)(1+2sC1R13). Thus, in this embodiment, by setting C13=C1, the capacitance values C1 and C13 can be decreased to be halves of those according to the thirteenth embodiment. In other words, a time constant similar to that according to the thirteenth embodiment can be realized by using the capacitance values C1 and C13 that are halves of those according to the thirteenth embodiment.

24th Embodiment

Figure 47:
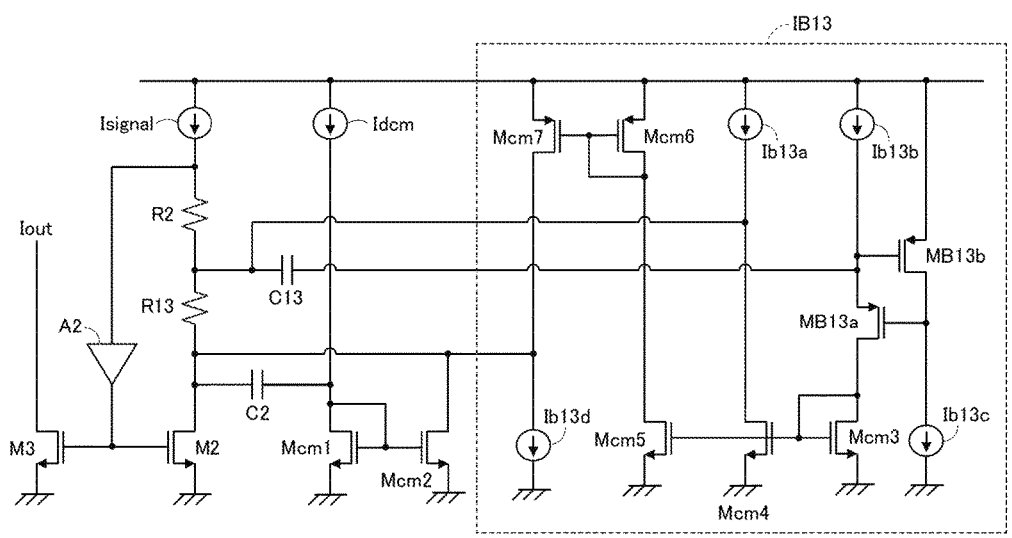
FIG. 47 is a diagram that illustrates a waveform shaping filter according to a 24th embodiment.

A waveform shaping filter according to a 24th embodiment will be described with reference to FIG. 47. FIG. 47 is a diagram that illustrates the waveform shaping filter according to this embodiment. As illustrated in FIG. 47, the waveform shaping filter according to this embodiment includes transistors Mcm1 and Mcm2 and a current source Idcm. The other configurations are similar to those illustrated in FIG. 33. The configuration of a current mirror circuit configured by the transistors Mcm1 and Mcm2 and the current source Idcm is similar to that illustrated in FIG. 15. In addition, the configuration of a current buffer IB13 is similar to that illustrated in FIG. 45.

As illustrated in FIG. 47, the gate terminal and the drain terminal of the transistor Mcm3 are respectively connected to the gate terminals of the transistors Mcm4 and Mcm5. In addition, the drain terminal of the transistor Mcm5 is connected to the gate terminal and the drain terminal of the transistor Mcm6 and the gate terminal of the transistor Mcm7. The current source Ib13a supplies a bias current to the transistor Mcm4.

As described with reference to FIG. 29, the current flowing into the current buffer IB13 from the other end of the capacitor C13 is input to the source terminal of the transistor MB13a and is output from the drain terminal. The current output from the drain terminal of the transistor MB13a is input to the input terminal (the drain terminal of the transistor Mcm3) of the current mirror circuit and is replicated by the transistors Mcm4 and Mcm5. In addition, the current replicated by the transistor Mcm5 is turned back (the polarity is inverted) by the current mirror circuit configured by the transistors Mcm6 and Mcm7 and is output from the drain terminal of the transistor Mcm7.

Here, for example, in a case where the sizes of the transistors Mcm3 to Mcm5 are the same, and the size of the transistor Mcm7 is configured to be twice the size of the transistor Mcm6, a current having the same magnitude as the current flowing into the current buffer IB13 from the other end of the capacitor C13 is drawn from the transistor Mcm4, and a current that is twice the current flowing through the capacitor C13 flows through the resistor R13. In other words, a current of Isignal×(1+2sC13R2) flows through the resistor R13. Accordingly, the voltage of the source terminal of the transistor M2 is Isignal×R2+Isignal×R13×(1+2sC13R2). A current of Isignal×sC2R2+Isignal×sC2R13×(1+2sC13R2) flows through the capacitor C2.

Meanwhile, a current that is twice the current flowing into the current buffer IB13 from the other end of the capacitor C13 is supplied from the transistor Mcm7 to the other end of the resistor R13 and offsets the current (the current that is twice the current flowing through the capacitor C13) Isignal×2sC13R2 supplied from one end of the resistor R13. The one end of the capacitor C2 is connected to the output terminal (the drain terminal of the transistor Mcm2) of the current mirror circuit, and the other end thereof is connected to the input terminal (the drain terminal of the transistor Mcm1) of the current mirror circuit. The current source Idcm supplies a bias current Idcm used for operating the current mirror circuit.

By employing such a configuration, in a case where the sizes of the transistors Mcm1 and Mcm2 are the same, a current of Isignal×(1+2sC13R2)(1+2sC2R13)+Isignal×2sR2(C2−C13) that is acquired by subtracting the current that is twice the current flowing through the capacitor C13 from a sum of the current flowing through the resistor R13 and the current that is twice the current flowing through the capacitor C2 flows through the transistor M2 and is output from the drain terminal as the output current Iout.

Here, by setting C13=C2, Iout=Isignal×(1+2sC13R2)(1+2sC2R13). Thus, in this embodiment, by setting C13=C2, the capacitance values C2 and C13 can be decreased to be halves of those according to the fourteenth embodiment. In other words, a time constant similar to that according to the fourteenth embodiment can be realized by using the capacitance values C2 and C13 that are halves of those according to the fourteenth embodiment.

25th Embodiment

Figure 48:
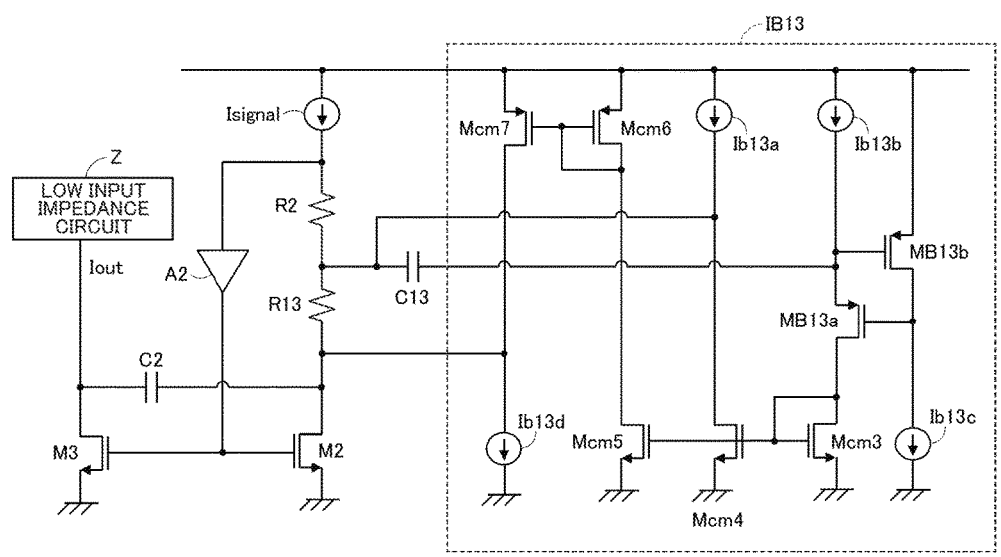
FIG. 48 is a diagram that illustrates a waveform shaping filter according to a 25th embodiment.

A waveform shaping filter according to a 25th embodiment will be described with reference to FIG. 48. FIG. 48 is a diagram that illustrates the waveform shaping filter according to this embodiment. As illustrated in FIG. 48, the waveform shaping filter according to this embodiment includes a low input impedance circuit Z. The other configurations are similar to those illustrated in FIG. 33. In addition, the configuration of a current buffer IB13 is similar to that illustrated in FIG. 45.

As illustrated in FIG. 48, the waveform shaping filter according to this embodiment connects the drain terminal of the transistor M3 that is the output terminal of the waveform shaping filter illustrated in FIG. 33 to the input terminal of the low input impedance circuit. In addition, the other end of the capacitor C2 is connected to the low input impedance circuit.

In this embodiment, as described above, the current Isignal×2sC13R2 that is twice the current flowing through the capacitor C13 is offset at the other end of the resistor R13, and accordingly, a current of Isignal×(1+2sC13R2)(1+sC2R13)+Isignal×2sR2(C2−C13) flows through the transistor M2. Through the low input impedance circuit Z, a current of Isignal×(1+2sC13R2)(1+2sC2R13)+Isignal×2sR2(C2−C13) that is a sum of the current flowing through the transistor M3 and the current Isignal×(1+2sC13R2)×sC2R13 flowing through the capacitor C2 flows through the low input impedance circuit Z.

Here, by setting C13=C2, the current input to the low input impedance circuit Z is Isignal×(1+2sC13R2)(1+2sC2R13). Thus, in this embodiment, by setting C13=C2, the capacitance values C2 and C13 can be decreased to be halves of those according to the fourteenth embodiment. In other words, a time constant similar to that according to the fourteenth embodiment can be realized by using the capacitance values C2 and C13 that are halves of those according to the fourteenth embodiment.

26th Embodiment

Figure 49:
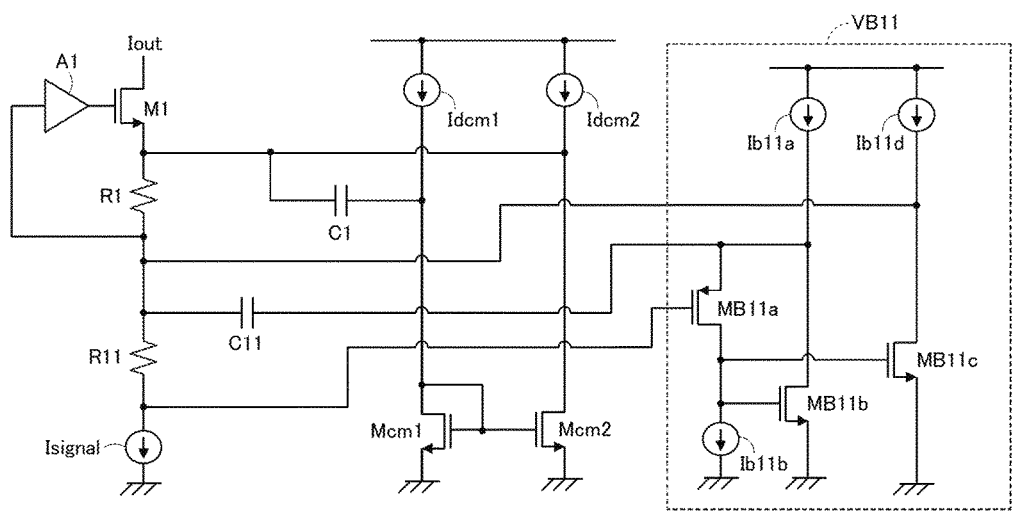
FIG. 49 is a diagram that illustrates a waveform shaping filter according to a 26th embodiment.

A waveform shaping filter according to a 26th embodiment will be described with reference to FIG. 49. FIG. 49 is a diagram that illustrates the waveform shaping filter according to this embodiment. As illustrated in FIG. 49, the waveform shaping filter according to this embodiment includes transistors Mcm1 and Mcm2 and current sources Idcm1 and Idcm2. The other configurations are similar to those illustrated in FIG. 34. The configurations of a current mirror circuit configured by the transistors Mcm1 and Mcm2 and the current sources Idcm1 and Idcm2 and a voltage buffer VB11 are similar to those illustrated in FIG. 37.

As illustrated in FIG. 49, a gate terminal of the transistor MB11c is connected to a gate terminal of the transistor MB11b, and source terminals of the transistors MB11b and MB11c are grounded. Thus, the gate-to-source voltage of transistor MB11c and the gate-to-source voltage of the transistor MB11b are the same.

Here, for example, in a case where the size of the transistor MB11c is configured to be the same as the size of the transistor MB11b, a current acquired by replicating the current flowing through the transistor MB11b flows through the transistor MB11c, and this current is added to a current flowing into one end of the capacitor C11. As a result, a current that is twice the current flowing into one end of the capacitor C11 flows through the resistor R1. Accordingly, a current of Isignal×(1+2sC11R11) flows through the resistor R1.

As illustrated in FIG. 49, one end of the capacitor C1 is connected to an output terminal (the drain terminal of the transistor Mcm2) of the current mirror circuit, and the other end thereof is connected to an input terminal (the drain terminal of the transistor Mcm1) of the current mirror circuit. The current source Idcm1 supplies a bias current Idcm1 used for operating the current mirror circuit. The current source Idcm2 adjusts the bias current flowing through the transistor M1 by canceling a part or the whole of the bias current flowing through the transistor Mcm2.

By employing such a configuration, a current flowing through the transistor M1 is a sum of the current flowing through the resistor R1, the current flowing through the capacitor C1, and a current acquired by replicating the current flowing through the capacitor C1 by using the current mirror circuit. For example, in a case where the sizes of the transistors Mcm1 and Mcm2 are the same, the current flowing through the transistor M1 is Isignal×(1+2sC11R11)(1+2sC1R1) and is output from the drain terminal as the output current Iout. Accordingly, the capacitance values C1 and C11 can be decreased to be halves of those of the fifteenth embodiment. In other words, a time constant similar to that of the fifteenth embodiment can be realized by using the capacitance values C1 and C11 that are halves of those according to the fifteenth embodiment.

In the description presented above, while a case in which the sizes of the transistors MB11b and MB11c are the same, and the sizes of the transistors Mcm1 and Mcm2 are the same has been described as an example, in this embodiment, the sizes of the transistors may be different from each other. For example, by configuring the channel width of the transistor MB11c to be k times of the channel width of the transistor MB11b, the capacitance value C11 can be configured to be 1/(1+k) times of that of the fifteenth embodiment. By configuring the channel width of the transistor Mcm2 to be m times of the channel width of the transistor Mcm1, the capacitance value C1 can be configured to be 1/(1+m) times of that of the fifteenth embodiment.

In the configuration illustrated in FIG. 49, while the other end of the capacitor C1 is connected to the current mirror circuit, a configuration may be employed in which the capacitor C1 is divided, and only a part thereof is connected to the current mirror circuit. In addition, a configuration in which the voltage buffer VB11 does not include the current source Ib11d may be employed.

27th Embodiment

Figure 50:
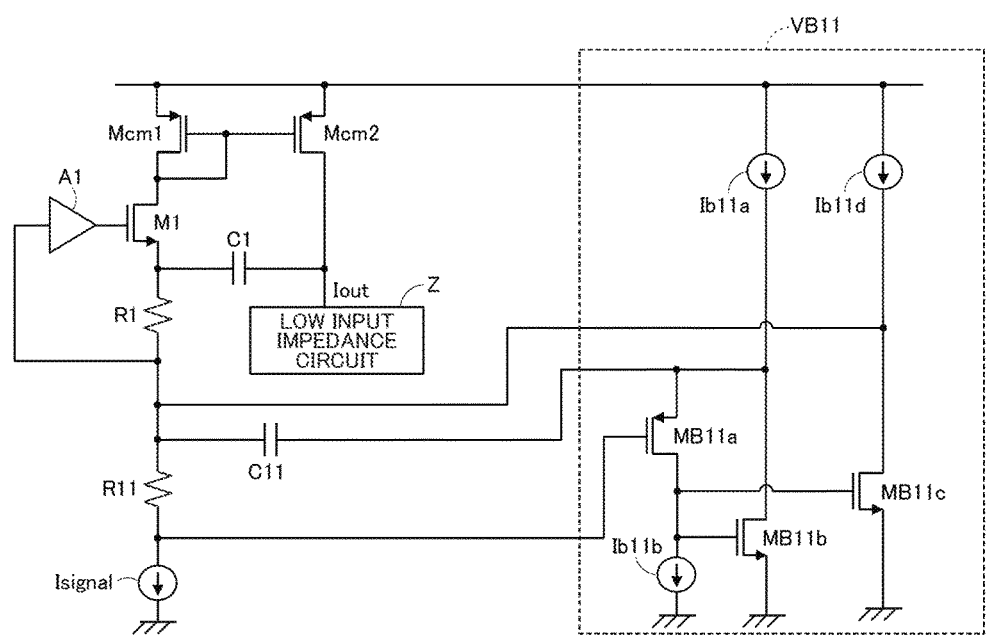
FIG. 50 is a diagram that illustrates a waveform shaping filter according to a 27th embodiment.

A waveform shaping filter according to a 27th embodiment will be described with reference to FIG. 50. FIG. 50 is a diagram that illustrates the waveform shaping filter according to this embodiment. As illustrated in FIG. 50, the waveform shaping filter according to this embodiment includes transistors Mcm1 and Mcm2 and a low input impedance circuit Z. The other configurations are similar to those illustrated in FIG. 34. In addition, the configurations of the current mirror circuit configured by the transistors Mcm1 and Mcm2 and the low input impedance circuit Z are similar to those illustrated in FIG. 23. Furthermore, the configuration of a voltage buffer VB11 is similar to that illustrated in FIG. 37.

As illustrated in FIG. 50, a drain terminal of the transistor M1 is connected to an input terminal (a drain terminal of the transistor Mcm1) of a current mirror circuit configured by the transistors Mcm1 and Mcm2. An output terminal (a drain terminal of the transistor Mcm2) of the current mirror circuit is connected to the low input impedance circuit Z. In addition, the other end of the capacitor C1 is connected to the output terminal (the drain terminal of the transistor Mcm2) of the current mirror circuit and the low input impedance circuit Z.

As described with reference to FIG. 49, in a case where the size of the transistor MB11c is configured to be the same as the size of the transistor MB11b, a current of Isignal×(1+2sC11R11) flows through the resistor R1. Accordingly, the voltage of the source terminal of the transistor M1 is Isignal×R1×(1+2sC11R11), and this voltage is applied to one end of the capacitor C1.

A current flowing into the transistor M1 from one end of the capacitor C1 is Isignal×sC1R1×(1+2sC11R11). Accordingly, a current of Isignal×(1+2sC11R11)(1+sC1R1) that is a sum of the current flowing through the resistor R1 and the current flowing through the capacitor C1 flows through the transistor M1 and is output from the drain terminal. This current is replicated by a current mirror circuit configured by the transistors Mcm1 and Mcm2. Then, a current of Isignal×(1+2sC11R11)(1+2sC1R1) that is a sum of the replicated current and a current Isignal×sC1R1×(1+2sC11R11) flowing out from the other end of the capacitor C1 flows through the low input impedance circuit Z.

Accordingly, the capacitance values C1 and C11 can be decreased to be halves of those of the fifteenth embodiment. In other words, a time constant similar to that of the fifteenth embodiment can be realized by using the capacitance values C1 and C11 that are halves of those according to the fifteenth embodiment.

In the description presented above, while a case in which the sizes of the transistors MB11b and MB11c are the same, and the sizes of the transistors Mcm1 and Mcm2 are the same has been described as an example, in this embodiment, the sizes of the transistors may be different from each other. For example, by configuring the channel width of the transistor MB11c to be k times of the channel width of the transistor MB11b, the capacitance value C11 can be configured to be 1/(1+k) times of that of the fifteenth embodiment. By configuring the channel width of the transistor Mcm2 to be m times of the channel width of the transistor Mcm1, the capacitance value C1 can be configured to be 1/(1+m) times of that of the fifteenth embodiment.

In the configuration illustrated in FIG. 50, while the other end of the capacitor C1 is connected to the current mirror circuit, a configuration may be employed in which the capacitor C1 is divided, and only a part thereof is connected to the current mirror circuit. In addition, a configuration in which the voltage buffer VB11 does not include the current source Ib73 may be employed.

28th Embodiment

Figure 51:
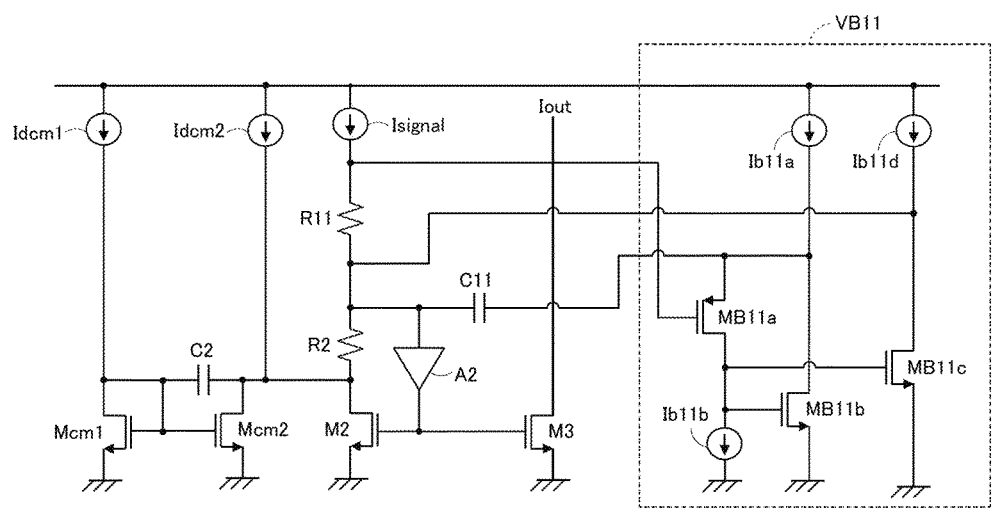
FIG. 51 is a diagram that illustrates a waveform shaping filter according to a 28th embodiment.

A waveform shaping filter according to a 28th embodiment will be described with reference to FIG. 51. FIG. 51 is a diagram that illustrates the waveform shaping filter according to this embodiment. As illustrated in FIG. 51, the waveform shaping filter according to this embodiment includes transistors Mcm1 and Mcm2 and current sources Idcm1 and Idcm2. The other configurations are similar to those illustrated in FIG. 35. The configurations of a current mirror circuit configured by the transistors Mcm1 and Mcm2 and the current sources Idcm1 and Idcm2 and a voltage buffer VB11 are similar to those illustrated in FIG. 37.

As illustrated in FIG. 51, a gate terminal of the transistor MB11$c$ is connected to a gate terminal of the transistor MB11$b$. In addition, source terminals of the transistors MB11$b$ and MB11$c$ are grounded. Thus, the gate-to-source voltage of transistor MB11$c$ and the gate-to-source voltage of the transistor MB11$b$ are the same.

For example, in a case where the size of the transistor MB11$c$ is configured to be the same as the size of the transistor MB11$b$, a current acquired by replicating the current flowing through the transistor MB11$b$ flows through the transistor MB11$c$, and this current is added to a current flowing into one end of the capacitor C11. As a result, a current that is twice the current flowing into one end of the capacitor C11 flows through the resistor R2. Accordingly, a current of Isignal×(1+2sC11R11) flows through the resistor R2.

As illustrated in FIG. 51, one end of the capacitor C2 is connected to an output terminal (the drain terminal of the transistor Mcm2) of the current mirror circuit, and the other end thereof is connected to an input terminal (the drain terminal of the transistor Mcm1) of the current mirror circuit. The current source Idcm1 supplies a bias current Idcm1 used for operating the current mirror circuit. The current source Idcm2 adjusts the bias current flowing through the transistor M2 by canceling a part or the whole of the bias current flowing through the transistor Mcm2.

By employing such a configuration, a current flowing through the transistor M2 is a sum of the current flowing through the resistor R2, the current flowing through the capacitor C2, and a current acquired by replicating the current flowing through the capacitor C2 by using the current mirror circuit. For example, in a case where the sizes of the transistors Mcm1 and Mcm2 are the same, the current flowing through the transistor M2 is Isignal×(1+2sC11R11)(1+2sC2R2). The current flowing through the transistor M2 is replicated by the transistor M3 and is output from the drain terminal as the output current Iout.

Accordingly, the capacitance values C2 and C11 can be decreased to be halves of those of the sixteenth embodiment. In other words, a time constant similar to that of the sixteenth embodiment can be realized by using the capacitance values C2 and C11 that are halves of those according to the sixteenth embodiment.

In the description presented above, while a case in which the sizes of the transistors MB11$b$ and MB11$c$ are the same, and the sizes of the transistors Mcm1 and Mcm2 are the same has been described as an example, in this embodiment, the sizes of the transistors may be different from each other. For example, by configuring the channel width of the transistor MB11$c$ to be k times of the channel width of the transistor MB11$b$, the capacitance value C11 can be configured to be 1/(1+k) times of that of the sixteenth embodiment. By configuring the channel width of the transistor Mcm2 to be m times of the channel width of the transistor Mcm1, the capacitance value C1 can be configured to be 1/(1+m) times of that of the sixteenth embodiment.

In the configuration illustrated in FIG. 51, while the other end of the capacitor C2 is connected to the current mirror circuit, a configuration may be employed in which the capacitor C2 is divided, and only a part thereof is connected to the current mirror circuit. In addition, a configuration in which the voltage buffer VB11 does not include the current source Ib11$d$ may be employed.

29th Embodiment

Figure 52:
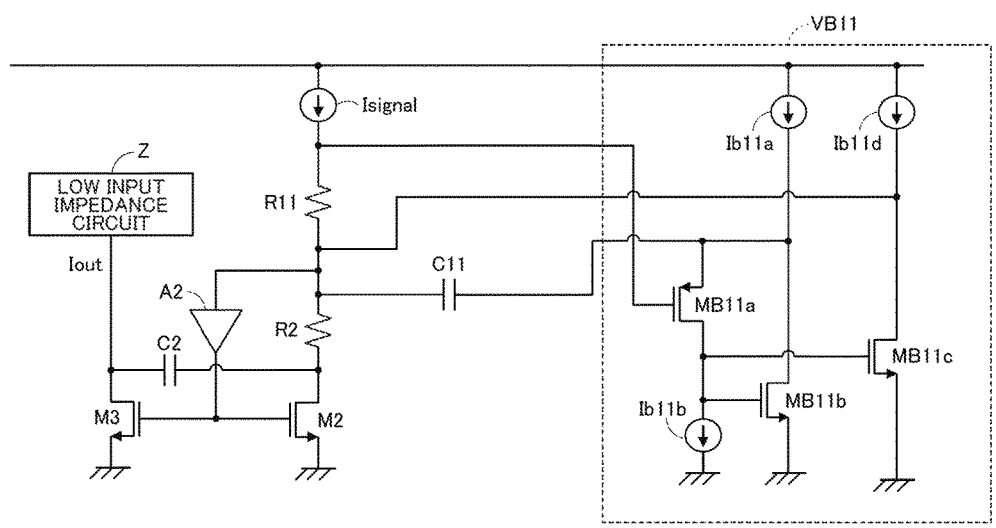
FIG. 52 is a diagram that illustrates a waveform shaping filter according to a 29th embodiment.

A waveform shaping filter according to a 29th embodiment will be described with reference to FIG. 52. FIG. 52 is a diagram that illustrates the waveform shaping filter according to this embodiment. As illustrated in FIG. 52, the waveform shaping filter according to this embodiment includes a low input impedance circuit Z. The other configurations are similar to those illustrated in FIG. 35. In addition, the configuration of a voltage buffer VB11 is similar to that illustrated in FIG. 37.

As illustrated in FIG. 52, the waveform shaping filter according to this embodiment connects the output terminal (the drain terminal of the transistor M3) of the waveform shaping filter to the low input impedance circuit Z. In addition, the other end of the capacitor C2 is connected to an input terminal of the low input impedance circuit Z.

As described with reference to FIG. 51, a current of Isignal×(1+2sC11R11) flows through the resistor R2. A current of Isignal×sC2R2×(1+2sC11R11) flows through the capacitor C2. Thus, a current of Isignal×(1+sC11R11)(1+2sC2R2) flows through the transistor M2. In a case where the sizes of the transistors M2 and M3 are the same, a current that is the same as the current flowing through the transistor M2 flows through the transistor M3. As a result, through the low input impedance circuit Z, a current of Isignal×(1+2sC11R11)(1+2sC2R2) that is a sum of the current Isignal×(1+sC11R11)(1+2sC2R2) flowing through the transistor M3 and the current Isignal×sC2R2×(1+2sC11R11) flowing out from the other end of the capacitor C2 flows.

Accordingly, the capacitance values C2 and C11 can be decreased to be halves of those of the sixteenth embodiment. In other words, a time constant similar to that of the sixteenth embodiment can be realized by using the capacitance values C2 and C11 that are halves of those according to the sixteenth embodiment.

30th Embodiment

Figure 53:
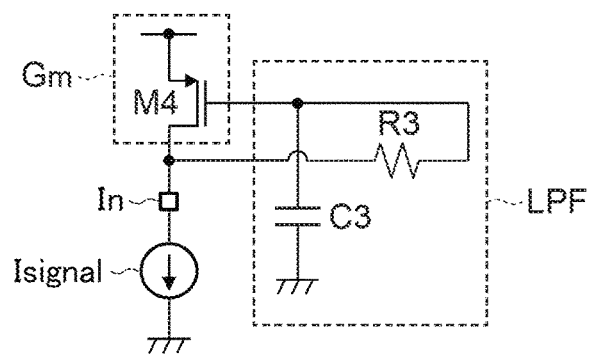
FIG. 53 is a diagram that illustrates a waveform shaping filter according to a 30th embodiment.

A waveform shaping filter according to a 30th embodiment will be described with reference to FIG. 53. FIG. 53 is a diagram that illustrates the waveform shaping filter according to this embodiment. As illustrated in FIG. 53, the waveform shaping filter according to this embodiment includes: an input terminal In; a voltage current converter Gm; and a low pass filter LPF.

A signal current Isignal is input to this waveform shaping filter from the input terminal In. In the configuration illustrated in FIG. 53, the current source Isignal is a current source that inputs the signal current Isignal to the waveform shaping filter. The output of the waveform shaping filter becomes an input terminal voltage V1.

The voltage current converter Gm includes a negative input terminal and an output terminal. The negative input terminal is connected to one end of the low pass filter LPF, and the output terminal is connected to the input terminal In and the other end of the low pass filter LPF. The voltage current converter Gm converts a voltage input from the negative input terminal into a current and outputs the converted current from the output terminal. As illustrated in FIG. 53, the voltage current converter Gm may be configured by a transistor M4.

The transistor M4 (third transistor) is a PMOS including a source terminal, a gate terminal, and a drain terminal. The source terminal (first terminal) of the transistor M4 is connected to a power source, the drain terminal (second terminal) is connected to the input terminal In and one end of the low pass filter LPF, and the gate terminal (control terminal) is connected to the other end of the low pass filter LPF. The drain terminal of the transistor M4 serves as the output terminal of the voltage current converter Gm, and the gate terminal thereof serves as the negative input terminal.

In this way, by configuring the voltage current converter Gm using the transistor M4, the size of the waveform shaping filter can be decreased.

The low pass filter LPF is connected between the input terminal In and the negative input terminal of the voltage current converter Gm. In other words, the low pass filter LPF has one end being connected to the input terminal In and the other end being connected to the negative input terminal of the voltage current converter Gm. The low pass filter LPF applies a low-frequency component of the input terminal voltage V1 to the negative input terminal of the voltage current converter Gm. As illustrated in FIG. 53, the low pass filter LPF may be configured by a resistor R3 and a capacitor C3.

The resistor R3 (third resistor) includes one end and the other end. One end of the resistor R3 is connected to the input terminal In, and the other end thereof is connected to the negative input terminal of the voltage current converter Gm and one end of the capacitor C3. One end of the resistor R3 serves as one end of the low pass filter LPF, and the other end thereof serves as the other end of the low pass filter LPF.

The capacitor C3 (second capacitor) includes one end and the other end. One end of the capacitor C3 is connected to the other end of the resistor R3 and the negative input terminal of the voltage current converter Gm, and the other end thereof is grounded. One end of the capacitor C3 serves as the other end of the low pass filter LPF.

In this way, by configuring the low pass filter LPF using the resistor R3 and the capacitor C3 that are passive elements, the power consumption of the waveform shaping filter can be reduced.

Next, the operation of the waveform shaping filter according to this embodiment will be described. Hereinafter, the current value of the signal current Isignal will be denoted as Isignal(s), the voltage value of the input terminal voltage V1 will be denoted as V1(s), the transfer function of the low pass filter LPF will be denoted as $H_{LPF}(s)$, and the voltage current conversion coefficient of the voltage current converter Gm will be denoted as Gm. In addition, $H_{LPF}(s)=1/(1+s\tau)$. Here, $\tau$ is the time constant of the low pass filter LPF. As illustrated in FIG. 53, in a case where the low pass filter LPF is configured by the resistor R3 and the capacitor C3, $\tau=C3\times R3$.

When the signal current Isignal is input to this waveform shaping filter, the input terminal voltage V1 is defined as $V1(s)=Isignal(s)/\{Gm\times H_{LPF}(s)\}=Isignal(s)\times(1+s\tau)/Gm$. In other words, the input terminal voltage V1 is a voltage acquired by superimposing a voltage corresponding to a high-frequency component of the signal current Isignal on a voltage corresponding to the signal current Isignal. Accordingly, a filter characteristic enhancing the high-frequency component of the signal current Isignal can be realized.

In addition, since the waveform shaping filter according to this embodiment consumes only the signal current Isignal, the power consumption can be reduced.

31st Embodiment

Figure 54:
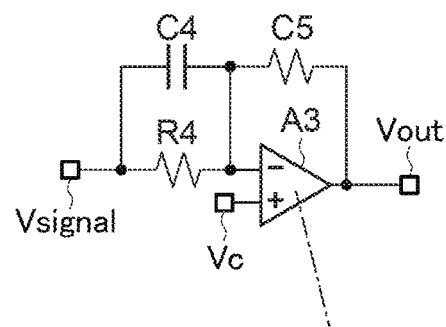
FIG. 54 is a diagram that illustrates a waveform shaping filter according to a 31st embodiment.
Figure 54:
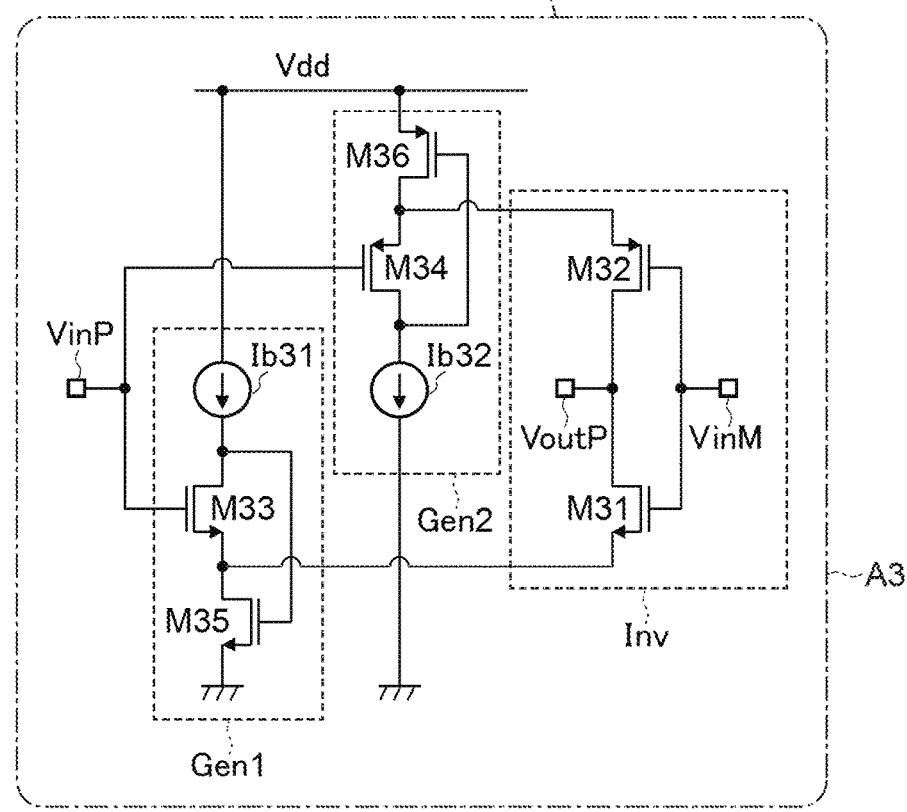

A waveform shaping filter according to a 31st embodiment will be described with reference to FIGS. 54 to 59. FIG. 54 is a diagram that illustrates the waveform shaping filter according to the 31st embodiment. As illustrated in FIG. 54, the waveform shaping filter according to this embodiment includes: a resistor R4; a capacitor C4; an amplifier A3; and a resistor R5.

The resistor R4 (fourth resistor) includes one end and the other end. The signal voltage Vsignal is input to the resistor R4 from the one end thereof. The other end of the resistor R4 is connected to the other end of the capacitor C4 and the negative input terminal of the amplifier A3.

The capacitor C4 (third capacitor) includes one end and the other end. One end of the capacitor C4 is connected to one end of the resistor R4. Accordingly, the signal voltage Vsignal is input to the capacitor C4 from the one end thereof. The other end of the capacitor C4 is connected to the other end of the resistor R4, the negative input terminal of the amplifier A3, and one end of the resistor R5.

The resistor R5 (fifth resistor) includes one end and the other end. One end of the resistor R5 is connected to the other end of the resistor R4, the negative input terminal of the amplifier A3, and the other end of the capacitor C4. The other end of the resistor R5 is connected to the output terminal of the amplifier A3.

The amplifier A3 (second amplifier) includes: the negative input terminal; a positive input terminal; and the output terminal. The negative input terminal is connected to the other end of the resistor R4, the other end of the capacitor C4, and one end of the resistor R5. A predetermined voltage Vc is applied to the positive input terminal. The output terminal is connected to the other end of the resistor R5. A voltage output from the output terminal of the amplifier A3 is the output voltage Vout of the waveform shaping filter.

In this embodiment, the amplifier A3, as illustrated in FIG. 54, includes: an inverter circuit Inv; and voltage generating circuits Gen1 and Gen2.

The inverter circuit Inv (first inverter circuit) includes: an input terminal VinM; an output terminal VoutP; and transistors M31 and M32. The input terminal VinM is the negative input terminal of the amplifier A3. The output terminal VoutP is the output terminal of the amplifier A3.

The transistor M31 (fourth transistor) is an NMOS and includes: a source terminal (first terminal); a drain terminal (second terminal); and a gate terminal (control terminal). The source terminal is connected to the source terminal of a transistor M33 and the drain terminal of a transistor M35 to be described later. The drain terminal is connected to the output terminal VoutP and the drain terminal of the transistor M32. The gate terminal is connected to the input terminal VinM.

The transistor M32 (fifth transistor) is a PMOS and includes: a source terminal (first terminal); a drain terminal (second terminal); and a gate terminal (control terminal). The source terminal is connected to the source terminal of a transistor M34 and the drain terminal of a transistor M36 to be described later. The drain terminal is connected to the output terminal VoutP and the drain terminal of the transistor M31. The gate terminal is connected to the input terminal VinM.

The voltage generating circuit Gen1 (first voltage generating circuit) includes a current source Ib31 and transistors M33 and M35.

The current source Ib31 (second current source) has one end being connected to the drain terminal of the transistor M33 and supplies a predetermined current Ib31 to the transistor M33.

The transistor M33 (sixth transistor) is an NMOS and includes: a source terminal (first terminal); a drain terminal (second terminal); and a gate terminal (control terminal). The source terminal is connected to the source terminal of the transistor M31 and the drain terminal of the transistor M35. The drain terminal is connected to the current source Ib31 and the gate terminal of the transistor M35. The gate terminal is connected to the input terminal VinP and the gate terminal of the transistor M34 to be described later. The input terminal VinP is the positive input terminal of the amplifier A3. Thus, a predetermined voltage Vc is applied to the gate terminal of the transistor M33.

The transistor M35 (seventh transistor) is an NMOS and includes: a source terminal (first terminal); a drain terminal (second terminal); and a gate terminal (control terminal). The source terminal is grounded. The drain terminal is connected to the source terminals of the transistors M31 and M33. The gate terminal is connected to the current source Ib31 and the drain terminal of the transistor M33.

The voltage generating circuit Gen2 (second voltage generating circuit) includes a current source Ib32 and transistors M34 and M36.

The current source Ib32 (third current source) has one end being connected to the drain terminal of the transistor M34 and supplies a predetermined current Ib32 to the transistor M34.

The transistor M34 (eighth transistor) is a PMOS and includes: a source terminal (first terminal); a drain terminal (second terminal); and a gate terminal (control terminal). The source terminal is connected to the source terminal of the transistor M32 and the drain terminal of the transistor M36. The drain terminal is connected to the current source Ib32 and the gate terminal of the transistor M36. The gate terminal is connected to the input terminal VinP and the gate terminal of the transistor M33. Thus, a predetermined voltage Vc is applied to the gate terminal of the transistor M34.

The transistor M36 (ninth transistor) is a PMOS and includes: a source terminal (first terminal); a drain terminal (second terminal); and a gate terminal (control terminal). The source terminal is connected to a power source. The drain terminal is connected to the source terminals of the transistors M32 and M34. The gate terminal is connected to the current source Ib32 and the drain terminal of the transistor M34.

Next, the operation of the amplifier A3 according to this embodiment will be described. Hereinafter, the size ratio between the transistors M34 and M32 and the size ratio between the transistors M33 and M31 are assumed to be the same. In addition, the current Ib31 supplied by the current source Ib31 and the current Ib32 supplied by the current source Ib32 are assumed to be the same (Ib31=Ib32=Ib3).

Feedback is applied to the voltage generating circuit Gen1 such that the current Ib31 of the current source Ib31 flows through the transistor M33 regardless of a current flowing through the transistor M31 of the inverter circuit Inv.

For example, in a case where the current flowing through the transistor M33 is lower than the current Ib31, the gate voltage of the transistor M35 increases, and the current flowing through the transistor M33 increases.

On the other hand, in a case where the current flowing through the transistor M33 is higher than the current Ib31, the gate voltage of the transistor M35 decreases, and the current flowing through the transistor M33 decreases.

As a result, the current Ib31 flows through the transistor M33.

Similarly, feedback is applied to the voltage generating circuit Gen2 such that the current Ib32 of the current source Ib32 flows through the transistor M34 regardless of a current flowing through the transistor M32 of the inverter circuit Inv.

For this reason, in a case where the voltage Vc applied to the positive input terminal VinP of the amplifier is applied to the input terminal VinM (the negative input terminal of the amplifier A3) of the inverter circuit Inv, a current Ib3 according to the size ratio between the transistors M33 and M31 flows through the transistor M31, and a current Ib3 according to the size ratio between the transistors M34 and M32 flows through the transistor M32.

In this way, the inverter circuit Inv operates as an inverting circuit that has the voltage Vc applied to the positive input terminal VinP of the amplifier A3 as an operating point. The bias current of the inverter circuit Inv at the operating point is a current acquired by multiplying the current Ib31 by the size ratio between the transistors M33 and M31.

In a case where the voltage applied to the negative input terminal VinM of the amplifier A3 is higher than the voltage Vc, the current flowing through the transistor M31 is higher than the bias current described above, and the current flowing through the transistor M32 is lower than the bias current described above. As a result, a difference between the current flowing through the transistor M31 and the current flowing through the transistor M32 is output from the output terminal VoutP of the amplifier A3, and the output voltage Vout of the amplifier A3 decreases.

In addition, in a case where the voltage applied to the negative input terminal VinM of the amplifier A3 is much higher than the voltage Vc, the transistor M32 is in the Off state, and the current Ib3 flows through the transistors M33, M34, and M36. Then, a large current according to the voltage applied to the negative input terminal VinM flows only through the transistors M31 and M35.

On the other hand, in a case where the voltage applied to the negative input terminal VinM of the amplifier A3 is lower than the voltage Vc, the current flowing through the transistor M31 is lower than the bias current described above, and the current flowing through the transistor M32 is higher than the bias current described above. As a result, a difference between the current flowing through the transistor M31 and the current flowing through the transistor M32 is output from the output terminal VoutP of the amplifier A3, and the output voltage Vout of the amplifier A3 increases.

In addition, in a case where the voltage applied to the negative input terminal VinM of the amplifier A3 is much lower than the voltage Vc, the transistor M31 is in the Off state, and the current Ib3 flows through the transistors M33, M34, and M35. Then, a large current according to the voltage applied to the negative input terminal VinM flows only through the transistors M32 and M36.

As described above, the amplifier A3 can set the operating point voltage at a time when the input AC signal is zero based on the voltage Vc applied to the positive input terminal VinP. In addition, the amplifier A3 can set the bias current of the inverter circuit Inv by adjusting the currents Ib31 and Ib32, the size ratio between the transistors M31 and M33, and the size ratio between the transistors M32 and M34. In addition, according to the amplifier A3, in a case where a large current is output, the path of the large current is limited to the transistor M31 and M35 or the transistors M32 and M36, and accordingly, the power consumption can be reduced. For this reason, an AB-class amplification circuit having high efficiency can be realized. In addition, since the amplifier A3 is configured by the inverter circuit Inv, the amplification operation can be executed at high speed.

Figure 55:
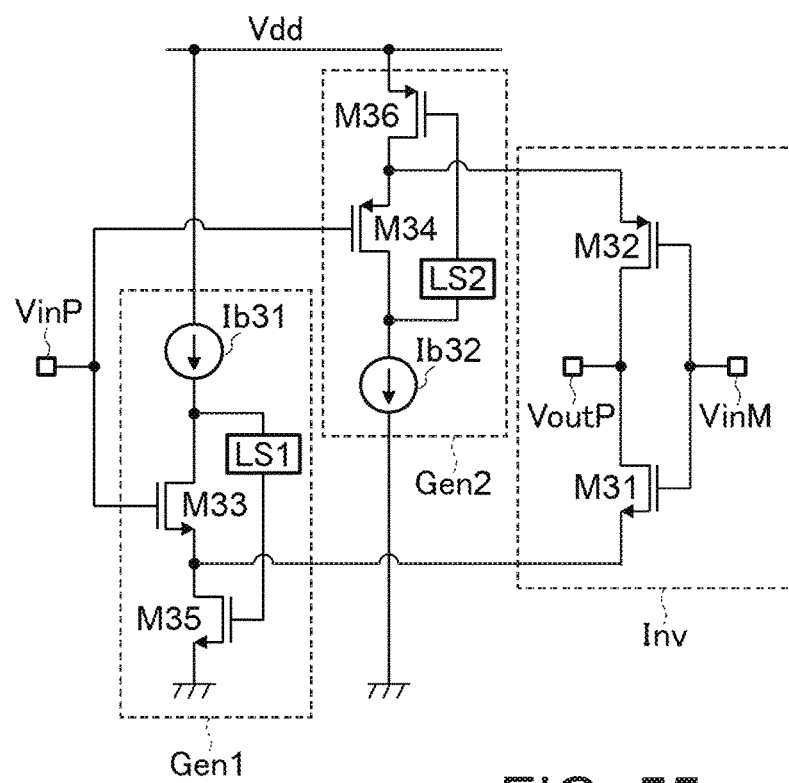
FIG. 55 is a diagram that illustrates a modified example of an amplifier illustrated in FIG. 54.

FIG. 55 is a diagram that illustrates a modified example of the amplifier A3 according to this embodiment. As illustrated in FIG. 55, this amplifier A3 further includes level shift circuits LS1 and LS2. The other configurations are similar to those of the amplifier A3 illustrated in FIG. 54.

The level shift circuit LS1 is connected between the drain terminal of the transistor M33 and the gate terminal of the transistor M35. The level shift circuit LS1 executes level shift of voltages such that the drain voltage of the transistor M33 is higher than the gate voltage of the transistor M35.

The level shift circuit LS2 is connected between the drain terminal of the transistor M34 and the gate terminal of the transistor M36. The level shift circuit LS2 executes level shift of voltages such that the drain voltage of the transistor M34 is lower than the gate voltage of the transistor M36.

In the amplifier A3 illustrated in FIG. 54, the voltages of the drains of the transistors M33 and M34 coincide with the voltages of the gates of the transistors M35 and M36. For this reason, for example, in a case where a voltage between the power source Vdd and the ground is high, the gate-to-source voltage of the transistor M33 is constant, and accordingly, the source voltage of the transistor M33 increases, and the drain-to-source voltage of the transistor M35 increases.

The gate-to-source voltage of the transistor M35 is a sum of the drain-to-source voltage of the transistor M35 and the drain-to-source voltage of the transistor M33, and accordingly, when the drain-to-source voltage of the transistor M35 increases, the drain-to-source voltage of the transistor M33 decreases.

As a result, the drain-to-source voltage of the transistor M33 is lower than an overdrive voltage, and there is concern that the voltage generating circuit Gen1 may not execute a desired operation. This situation is similar to the case of the voltage generating circuit Gen2.

In contrast to this, in the amplifier A3 illustrated in FIG. 55, a sum of the gate-to-source voltage of the transistor M35 and a voltage raised by the level shift circuits LS1 and LS2 becomes a sum of the drain-to-source voltage of the transistor M35 and the drain-to-source voltage of the transistor M33. In this way, the drain-to-source voltages of the transistors M33 and M36 are secured, the range of the power source voltage Vdd or a set range of the operating point in which the transistors M33 and M36 operate in a saturated region may be increased.
(First Example of Level Shift Circuit)

Figure 56:
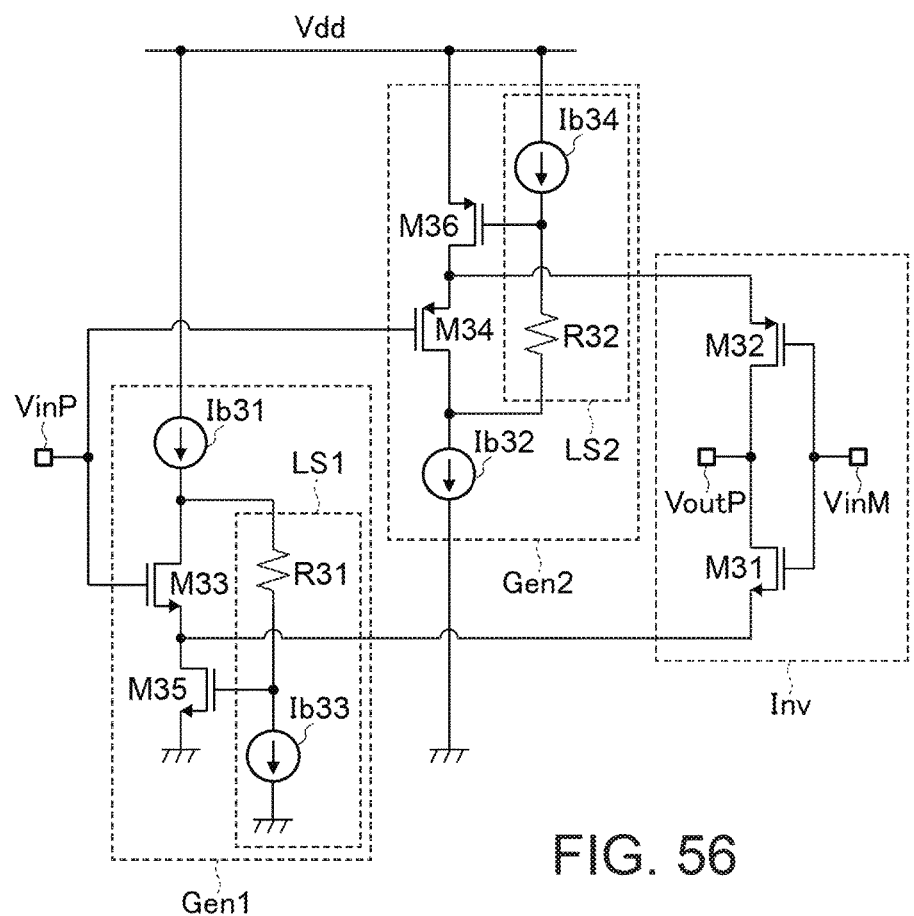
FIG. 56 is a diagram that illustrates a first example of a level shift circuit illustrated in FIG. 55.

FIG. 56 is a diagram that illustrates a first example of the level shift circuits LS1 and LS2 illustrated in FIG. 55. As illustrated in FIG. 56, the level shift circuit LS1 (LS2) includes a resistor R31 (R32) and a current source Ib33 (Ib34).

The resistor R31 (R32) includes one end and the other end. One end of the resistor R31 (R32) is connected to the drain terminal of the transistor M33 (M34) and the current source Ib31 (Ib32). The other end of the resistor R31 (R32) is connected to the gate terminal of the transistor M35 (M36) and the current source Ib33 (Ib34). The current source Ib33 (Ib34) supplies a predetermined current Ib33 (Ib34) to the resistor R31 (R32).

By employing such a configuration, the drain voltage of the transistor M33 (M34) is higher (lower) than the gate voltage of the transistor M35 (M36) by R31×Ib33 (R32×Ib34).
(Second Example of Level Shift Circuit)

Figure 57:
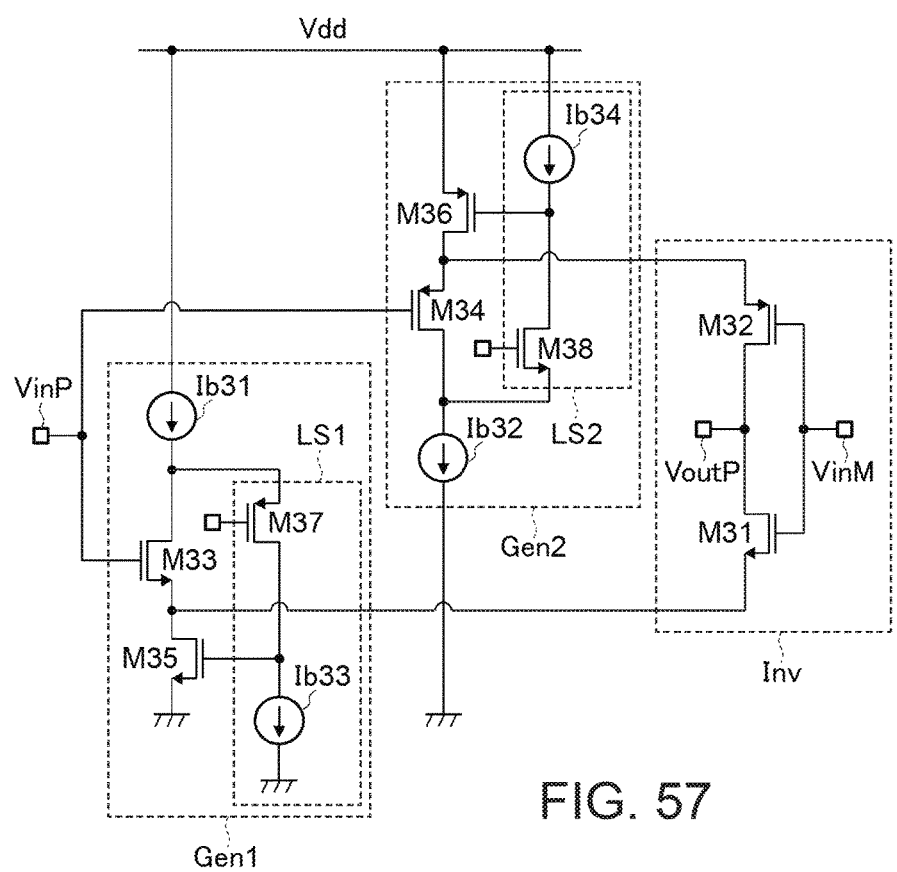
FIG. 57 is a diagram that illustrates a second example of the level shift circuit illustrated in FIG. 55.

FIG. 57 is a diagram that illustrates a second example of the level shift circuits LS1 and LS2 illustrated in FIG. 55. As illustrated in FIG. 57, the level shift circuit LS1 (LS2) includes a transistor M37 (M38) and a current source Ib33 (Ib34).

The transistor M37 (M38) is a PMOS (NMOS). The source terminal of the transistor M37 (M38) is connected to the drain terminal of the transistor M33 (M34) and the current source Ib31 (Ib32). The drain terminal of the transistor M37 (M38) is connected to the gate terminal of the transistor M35 (M36) and the current source Ib33 (Ib34). A predetermined voltage is applied to the gate terminal of the transistor M37 (M38). The current source Ib33 (Ib34) supplies a predetermined current Ib33 (Ib34) to the transistor M37 (M38).

By employing such a configuration, the drain voltage of the transistor M33 (M34) is higher (lower) than the gate voltage of the transistor M35 (M36) by the drain-to-source voltage of the transistor M37 (M38).
(Third Example of Level Shift Circuit)

Figure 58:
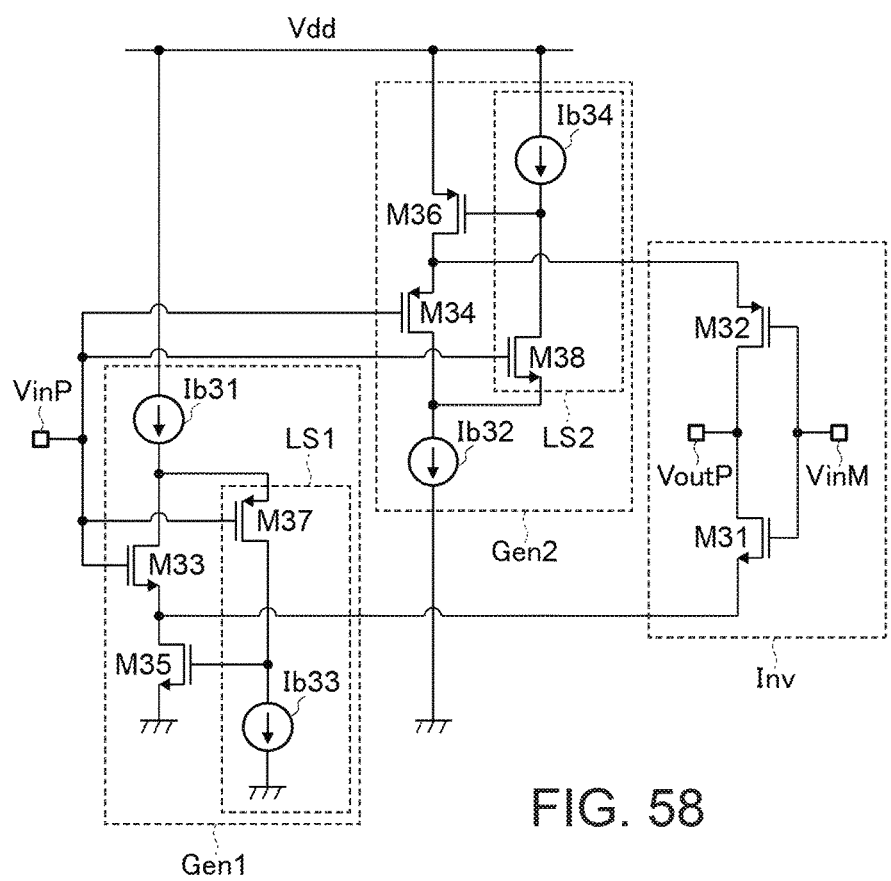
FIG. 58 is a diagram that illustrates a third example of the level shift circuit illustrated in FIG. 55.

FIG. 58 is a diagram that illustrates a third example of the level shift circuits LS1 and LS2 illustrated in FIG. 55. As illustrated in FIG. 58, this level shift circuit LS1 (LS2) is acquired by connecting the gate terminal of the transistor M37 (M38) of the level shift circuit LS1 (LS2) illustrated in FIG. 57 to the gate terminal of the transistor M33 (M34). A voltage Vc is applied to the gate terminals of the transistors M37 and M38. By employing such a configuration, a new voltage source used for applying a voltage to the gate terminals of the transistors M37 and M38 is not required, and the circuit configuration can be simplified.
(Fourth Example of Level Shift Circuit)

Figure 59:
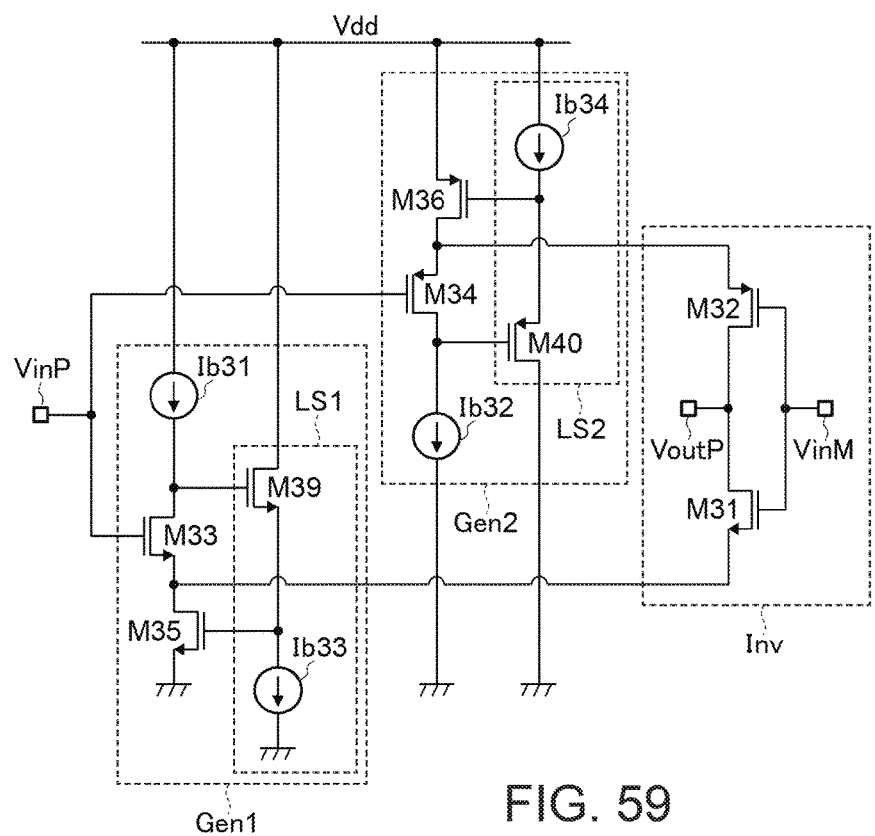
FIG. 59 is a diagram that illustrates a fourth example of the level shift circuit illustrated in FIG. 55.

FIG. 59 is a diagram that illustrates a fourth example of the level shift circuits LS1 and LS2 illustrated in FIG. 55. As illustrated in FIG. 59, the level shift circuit LS1 (LS2) includes a transistor M39 (M40) and a current source Ib33 (Ib34).

The transistor M39 (M40) is an NMOS (PMOS). The source terminal of the transistor M39 (M40) is connected to the gate terminal of the transistor M35 (M36) and the current source Ib33 (Ib34). The drain terminal of the transistor M39 (M40) is connected to the power source (ground). The gate terminal of the transistor M39 (M40) is connected to the drain terminal of the transistor M33 (M34) and the current source Ib31 (Ib32). The current source Ib33 (Ib34) supplies a predetermined current Ib33 (Ib34) to the transistor M39 (M40).

By employing such a configuration, the drain voltage of the transistor M33 (M34) voltage is higher (lower) than the gate voltage of the transistor M35 (M36) by the gate-to-source voltage of the transistor M39 (M40).

32nd Embodiment

Figure 60:
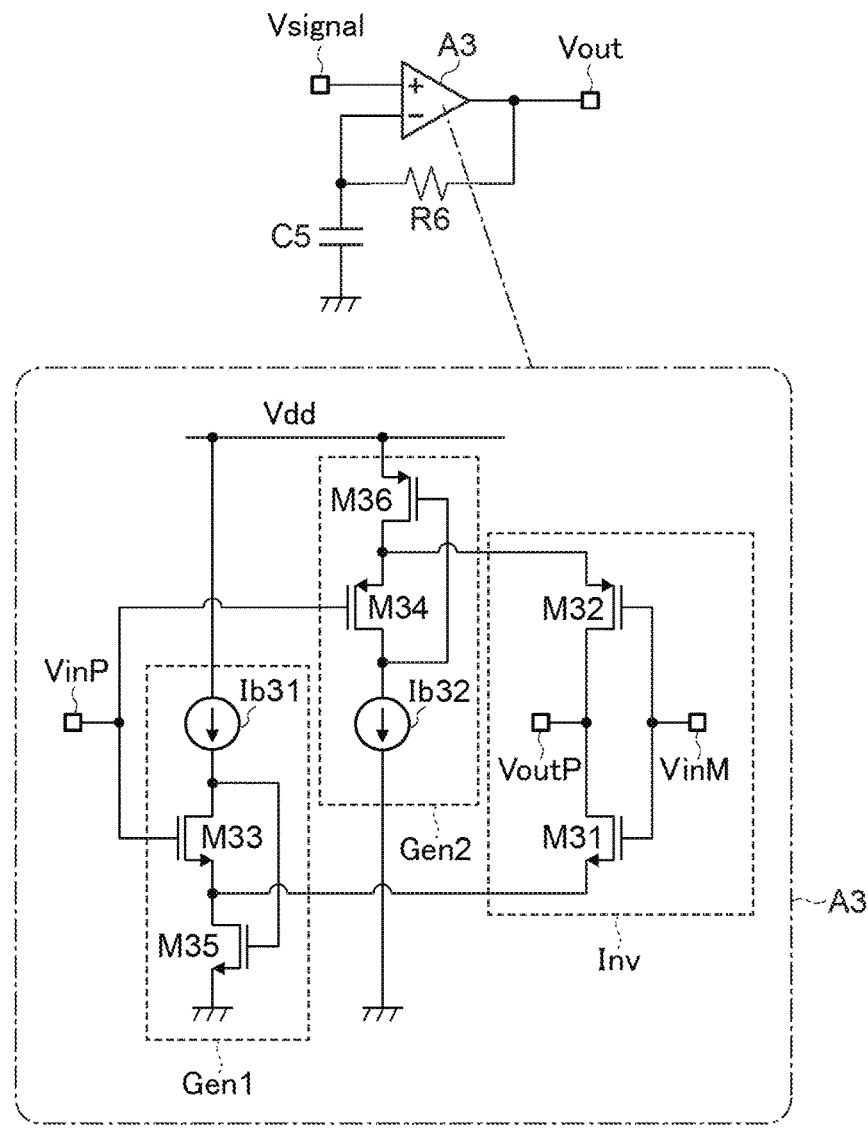
FIG. 60 is a diagram that illustrates a waveform shaping filter according to a 32nd embodiment.

Next, a waveform shaping filter according to a 32nd embodiment will be described with reference to FIG. 60. FIG. 60 is a diagram that illustrates the waveform shaping filter according to the 32nd embodiment. As illustrated in FIG. 60, the waveform shaping filter according to this embodiment includes: a resistor R6; a capacitor C5; and an amplifier A3.

The resistor R6 (sixth resistor) includes one end and the other end. One end of the resistor R6 is connected to a negative input terminal of the amplifier A3 and one end of the capacitor C5. The other end of the resistor R6 is connected to an output terminal of the amplifier A3.

The capacitor C5 (fourth capacitor) includes one end and the other end. One end of the capacitor C4 is connected to the negative input terminal of the amplifier A3 and one end of the resistor R6. The other end of the capacitor C4 is grounded.

The amplifier A3 (third amplifier) includes: the negative input terminal; a positive input terminal; and an output terminal. The negative input terminal is connected to one end of the resistor R6 and one end of the capacitor C5. A signal voltage Vsingal is input to the positive input terminal. The output terminal is connected to the other end of the resistor R6. A voltage output from the output terminal of the amplifier A3 is the output voltage Vout of the waveform shaping filter.

As illustrated in FIG. 60, the amplifier A3 has a configuration similar to that illustrated in FIG. 54 and includes an inverter circuit Inv and voltage generating circuits Gen1 and Gen2.

The inverter circuit Inv (second inverter circuit) includes: an input terminal VinM; an output terminal VoutP; and transistors M31 and M32. The input terminal VinM is the negative input terminal of the amplifier A3. The output terminal VoutP is the output terminal of the amplifier A3.

The transistor M31 (tenth transistor) is an NMOS and includes: a source terminal (first terminal); a drain terminal (second terminal); and a gate terminal (control terminal). The source terminal is connected to the source terminal of the transistor M33 and the drain terminal of the transistor M35. The drain terminal is connected to the output terminal VoutP and the drain terminal of the transistor M32. The gate terminal is connected to the input terminal VinM.

The transistor M32 (eleventh transistor) is a PMOS and includes: a source terminal (first terminal); the drain terminal (second terminal); and a gate terminal (control terminal). The source terminal is connected to the source terminal of the transistor M34 and the drain terminal of the transistor M36. The drain terminal is connected to the output terminal VoutP and the drain terminal of the transistor M31. The gate terminal is connected to the input terminal VinM.

The voltage generating circuit Gen1 (third voltage generating circuit) includes: a current source Ib31 and transistors M33 and M35.

The current source Ib31 (fourth current source) has one end connected to the drain terminal of the transistor M33 and supplies a predetermined current Ib31 to the transistor M33.

The transistor M33 (twelfth transistor) is an NMOS and includes: a source terminal (first terminal); a drain terminal (second terminal); and a gate terminal (control terminal). The source terminal is connected to the source terminal of the transistor M31 and the drain terminal of the transistor M35. The drain terminal is connected to the current source Ib31 and the gate terminal of the transistor M35. The gate terminal is connected to an input terminal VinP and the gate terminal of the transistor M34 to be described later. The input terminal VinP is the positive input terminal of the amplifier A3. Accordingly, the signal voltage Vsignal is applied to the gate terminal of the transistor M33.

The transistor M35 (thirteenth transistor) is an NMOS and includes: a source terminal (first terminal); a drain terminal (second terminal); and a gate terminal (control terminal). The source terminal is grounded. The drain terminal is connected to the source terminals of the transistors M31 and M33. The gate terminal is connected to the current source Ib31 and the drain terminal of the transistor M33.

The voltage generating circuit Gen2 (fourth voltage generating circuit) includes: a current source Ib32 and transistors M34 and M36.

The current source Ib32 (fifth current source) has one end connected to the drain terminal of the transistor M34 and supplies a predetermined current Ib32 to the transistor M34.

The transistor M34 (fourteenth transistor) is a PMOS and includes: a source terminal (first terminal); a drain terminal (second terminal); and a gate terminal (control terminal). The source terminal is connected to the source terminal of the transistor M32 and the drain terminal of the transistor M36. The drain terminal is connected to the current source Ib32 and the gate terminal of the transistor M36. The gate terminal is connected to the input terminal VinP and the gate terminal of the transistor M33. Accordingly, the signal voltage Vsignal is applied to the gate terminal of the transistor M34.

The transistor M36 (fifteenth transistor) is a PMOS and includes: a source terminal (first terminal); a drain terminal (second terminal); and a gate terminal (control terminal). The source terminal is connected to the power source. The drain terminal is connected to the source terminals of the transistors M32 and M34. The gate terminal is connected to the current source Ib32 and the drain terminal of the transistor M34.

Next, the operation of the amplifier A3 according to this embodiment will be described. Hereinafter, the size ratio between the transistors M34 and M32 and the size ratio between the transistors M33 and M31 are assumed to be the same. In addition, the current Ib31 supplied by the current source Ib31 and the current Ib32 supplied by the current source Ib32 are assumed to be the same (Ib31=Ib32=Ib3).

As described above, feedback is applied to the voltage generating circuit Gen1 such that the current Ib31 of the current source Ib31 flows through the transistor M33 regardless of a current flowing through the transistor M31 of the inverter circuit Inv. In addition, feedback is applied to the voltage generating circuit Gen2 such that the current Ib32 of the current source Ib32 flows through the transistor M34 regardless of a current flowing through the transistor M32 of the inverter circuit Inv.

For this reason, in a case where a voltage that is the same as the signal voltage Vsignal applied to the positive input terminal VinP of the amplifier is applied to the input terminal VinM (the negative input terminal of the amplifier A3) of the inverter circuit Inv, a current Ib3 according to the size ratio between the transistors M33 and M31 flows through the transistor M31, and a current Ib3 according to the size ratio between the transistors M34 and M32 flows through the transistor M32.

Since the output voltage of the amplifier A3 is fed back to the negative input terminal through the resistor R6, the voltage of the negative input terminal VinM follows the signal voltage Vsignal applied to the positive input terminal VinP. In this way, the amplifier A3 operates as a non-inverting amplification circuit. The bias current of the inverter circuit Inv is a current acquired by multiplying the current Ib31 by the size ratio between the transistors M33 and M31.

In a case where the voltage applied to the negative input terminal VinM of the amplifier A3 is higher than the signal voltage Vsignal, the current flowing through the transistor M31 is higher than the bias current described above, and the current flowing through the transistor M32 is lower than the bias current described above. As a result, a difference between the current flowing through the transistor M31 and the current flowing through the transistor M32 is output from the output terminal VoutP of the amplifier A3, and the output voltage of the amplifier A3 decreases.

In addition, in a case where the voltage applied to the negative input terminal VinM of the amplifier A3 is much higher than the signal voltage Vsignal, the transistor M32 is in the Off state, and the current Ib3 flows through the transistors M33, M34, and M36. Then, a large current according to the voltage applied to the negative input terminal VinM flows only through the transistors M31 and M35.

On the other hand, in a case where the voltage applied to the negative input terminal VinM of the amplifier A3 is lower than the signal voltage Vsignal, the current flowing through the transistor M31 is lower than the bias current described above, and the current flowing through the transistor M32 is higher than the bias current described above. As a result, a difference between the current flowing through the transistor M31 and the current flowing through the transistor M32 is output from the output terminal VoutP of the amplifier A3, and the output voltage Vout of the amplifier A3 increases.

In addition, in a case where the voltage applied to the negative input terminal VinM of the amplifier A3 is much lower than the signal voltage Vsignal, the transistor M31 is in the Off state, and the current Ib3 flows through the transistors M33, M34, and M35. Then, a large current according to the voltage applied to the negative input terminal VinM flows only through the transistors M32 and M36.

As described above, since the voltage of the negative input terminal VinM is the same as the voltage of the positive input terminal VinP, the amplifier A3 can set the bias current of the inverter circuit Inv. In addition, the amplifier A3 can set the bias current of the inverter circuit Inv by adjusting the currents Ib31 and Ib32, the size ratio between the transistors M31 and M33, and the size ratio between the transistors M32 and M34. In addition, according to the amplifier A3, in a case where a large current is output, the path of the large current is limited to the transistor M31 and M35 or the transistors M32 and M36, and accordingly, the power consumption can be reduced. For this reason, an AB-class amplification circuit having high efficiency can be realized. In addition, since the amplifier A3 is configured by the inverter circuit Inv, the amplification operation can be executed at high speed.

In the description presented above, while the amplifier A3 has a configuration similar to that illustrated in FIG. 54, it may have any of the configurations illustrated in FIGS. 55 to 59.

33rd Embodiment

Figure 61:
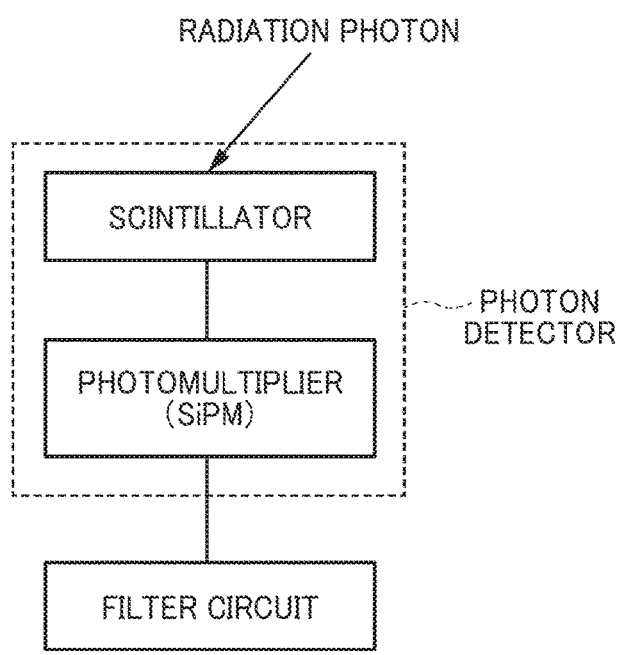
FIG. 61 is a schematic diagram that illustrates a radiation detection device according to a 33rd embodiment.

Next a radiation detection device according to a 33rd embodiment will be described with reference to FIGS. 61 to 66. FIG. 61 is a schematic diagram that illustrates the radiation detection device according to this embodiment. As illustrated in FIG. 61, the radiation detection device includes a photon detector and a filter circuit.

The photon detector outputs the amount of electric charge that is proportional to the energy level of incident radiation photons as a pulse signal current Isignal. As illustrated in FIG. 61, the photon detector includes a scintillator and a photomultiplier.

The scintillator generates scintillation light corresponding to the energy level of the incident radiation photons. The scintillator has a low-pass characteristic due to the attenuation time of the scintillation light. Hereinafter, the time constant of the scintillator will be denoted by $\tau 1$, and the low-pass characteristic is assumed to be $1/(1+s\tau 1)$.

The photomultiplier (SiPM) outputs the amount of electric charge corresponding to the energy level of the scintillation light generated by the scintillator as a pulse signal current Isignal. Generally, the photomultiplier has a low-pass characteristic. Hereinafter, the time constant of the photomultiplier will be denoted by $\tau 2$, and the low-pass characteristic is assumed to be $1/(1+s\tau 2)$.

The filter circuit shapes the waveform of the signal current Isignal input from the photon detector and outputs a resultant signal current. The filter circuit includes at least one of the waveform shaping filters according to the first embodiment to the 32nd embodiment. The filter circuit may include a plurality of waveform shaping filters having the same configuration or a plurality of waveform shaping filters having mutually-different configurations.

In a case where the filter circuit includes the waveform shaping filter according to the 31st embodiment or the 32nd embodiment, the filter circuit may include a current voltage conversion circuit that converts the signal current Isignal into a signal voltage Vsignal.

In addition, it is preferable that the filter circuit includes a waveform shaping filter having the same time constant as a time constant of each configuration of the photon detector.

For example, like the radiation detection device illustrated in FIG. 61, in a case where the photon detector includes the scintillator of the time constant $\tau 1$ and the photomultiplier of the time constant $\tau 2$, the filter circuit preferably includes a waveform shaping filter of the first stage having the time constant $\tau 1$ and a waveform shaping filter of the second stage having the time constant $\tau 2$. At this time, the enhancement characteristic of the waveform shaping filter of the first stage is $1+s\tau 1$, and the enhancement characteristic of the waveform shaping filter of the second stage is $1+s\tau 2$.

By employing such a configuration, by offsetting the low-pass characteristic of the signal current Isignal using the high-frequency enhancement characteristic of each waveform shaping filter of the filter circuit, the pulse width can be narrowed by eliminating the dulling of the signal current Isignal that has been dulled (the pulse width is enlarged) according to the low-pass characteristic.

Figure 62:
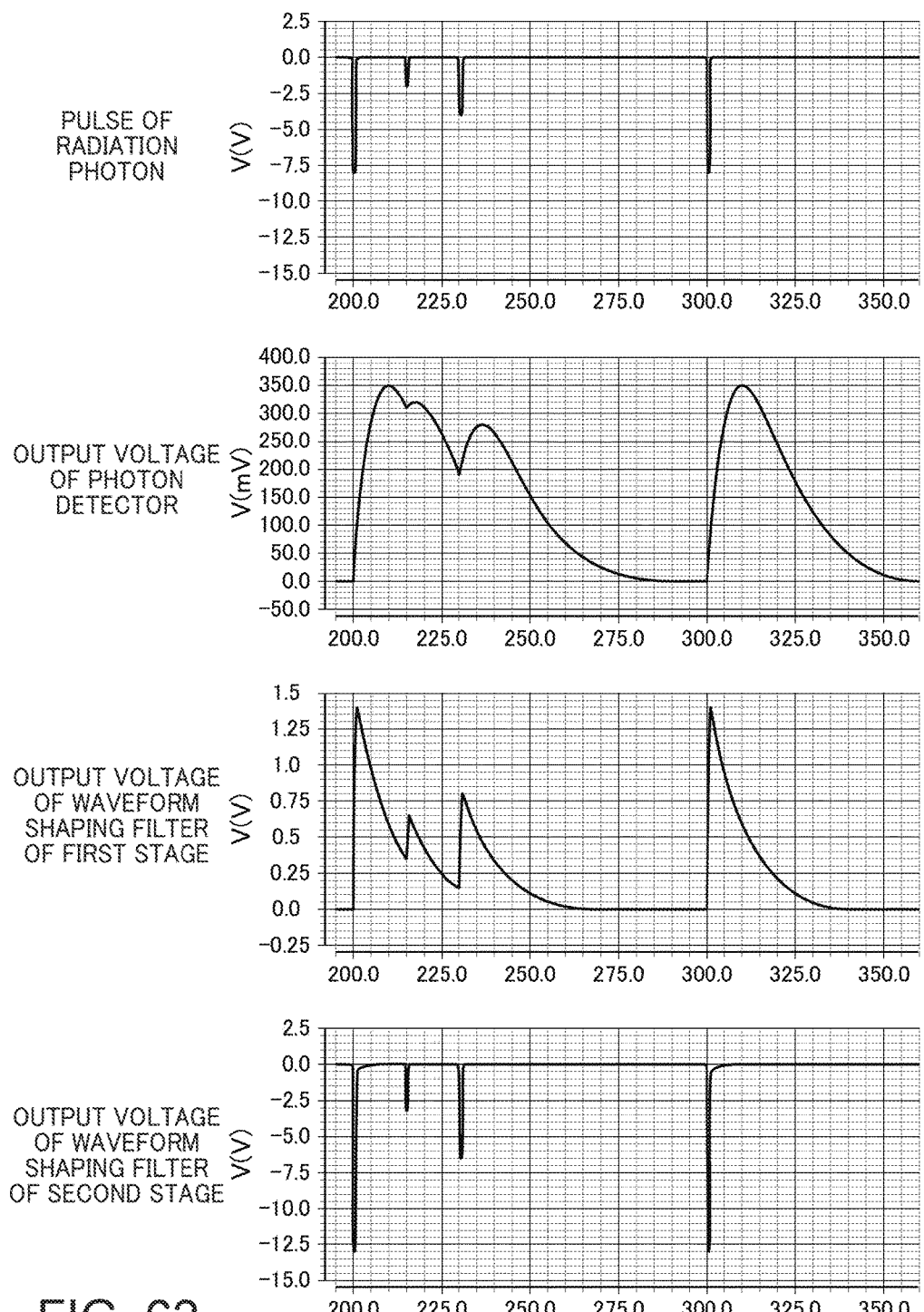
FIG. 62 is a diagram that illustrates a result of a simulation of the radiation detection device illustrated in FIG. 61.

Here, FIG. 62 is a diagram that illustrates a result of a simulation of the radiation detection device including the filter circuit having such a configuration. As illustrated in FIG. 62, the output voltage of the photon detector has a waveform acquired by applying a second-order low-pass characteristic to a pulse of radiation photons. In contrast to this, it can be understood that the output voltage of the waveform shaping filter of the second stage has a waveform that is proportional to the original pulse of radiation photons by eliminating the low-pass characteristic of the signal voltage Vsignal.

Also in a case where the time constant of the waveform shaping filter of the first stage is set to $\tau 2$, and the time constant of the waveform shaping filter of the second stage is set to τ1, a similar effect can be acquired. In addition, the filter circuit may include waveform shaping filters of stages corresponding to the degree of the low-pass characteristic of the signal current Isignal. For example, in a case where the signal current Isignal has a first-order low-pass characteristic, the filter circuit may include a waveform shaping filter of only one stage.

First Example

Figure 63:
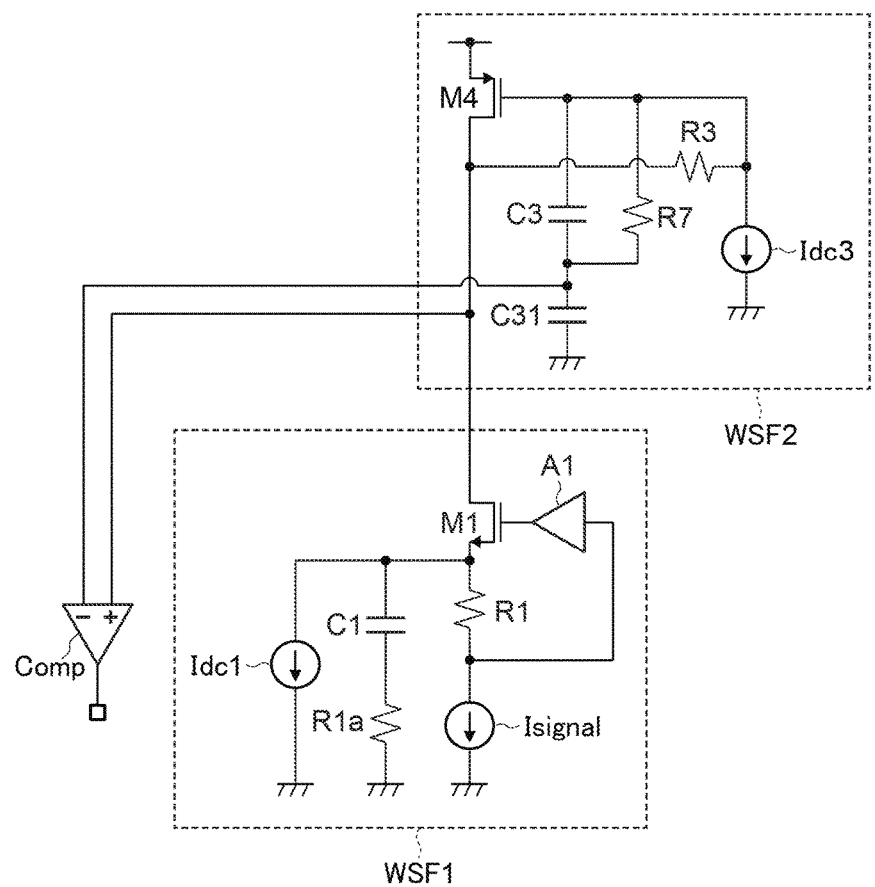
FIG. 63 is a diagram that illustrates a first example of a filter circuit illustrated in FIG. 61.

FIG. 63 is a diagram that illustrates a first example of the filter circuit according to this embodiment. As illustrated in FIG. 63, this filter circuit includes: waveform shaping filters WSF1 and WSF2 and a comparator Comp.

The waveform shaping filter WSF1 is a waveform shaping filter of the first stage acquired by combining the waveform shaping filters illustrated in FIGS. 3 and 4 and includes: a transistor M1, a resistor R1, a capacitor C1, an amplifier A1, a current source Idc1, and a resistor R1a. The time constant of the waveform shaping filter WSF1 is C1(R1+R1a).

When a signal current Isignal is input from the photon detector (current source Isignal), the waveform shaping filter WSF1 outputs a current of Isignal×{1+sC1(R1+R1a)} from the drain terminal of the transistor M1.

The waveform shaping filter WSF2 is a waveform shaping filter of the second stage acquired by modifying the waveform shaping filter illustrated in FIG. 53 and includes: a transistor M4, a resistor R3, and a capacitor C3. The configuration described above is similar to that illustrated in FIG. 53. The waveform shaping filter WSF2 further includes: a current source Idc3, a capacitor C31, and a resistor R7.

The current source Idc3 is connected to the gate terminal (the negative input terminal of the voltage current conversion circuit Gm) of the transistor M4, one end of the capacitor C3, the other end of the resistor R3, and one end of the resistor R7. The current source Idc3 supplies a predetermined current Idc3 to the transistor M4 and the resistors R3 and R7. Accordingly, also when there is no incoming input signal, in other words, when a radiation photon is not detected by the photon detector, the transistor M4 can be configured to be in the On state.

The capacitor C31 includes one end and the other end. One end of the capacitor C31 is connected to the other end of the capacitor C3, the negative input terminal of the comparator Comp, and the other end of the resistor R7. The other end of the capacitor C31 is grounded. The time constant of the waveform shaping filter WSF2 is R3×C3×C31/(C3+C31) depending on the combined capacitance acquired by connecting the capacitor C3 and the capacitor C31 in series.

The resistor R7 includes one end and the other end. One end of the resistor R7 is connected to the gate terminal of the transistor M4, the other end of the resistor R3, one end of the capacitor C3, and the current source Idc3. The other end of the resistor R7 is connected to the other end of the capacitor C3, one end of the capacitor C31, and the negative input terminal of the comparator Comp.

The comparator Comp includes a negative input terminal, a positive input terminal, and an output terminal. The negative input terminal is connected to the other end of the capacitor C3, one end of the capacitor C31, and the other end of the resistor R7. The positive input terminal is connected to the drain terminals of the transistors M1 and M4 and one end of the resistor R3.

The comparator Comp compares a reference voltage applied to the negative input terminal with the output voltage (input terminal voltage V1) of the waveform shaping filter WSF2 that is applied to the positive input terminal and outputs a binary signal. Here, the comparator Comp is configured to output "1" or "0". The comparator Comp outputs "1" in a case where the output voltage of the waveform shaping filter WSF2 is lower than the reference voltage, in other words, in a case where an input signal arrives and outputs "0" in the other cases. In other words, the filter circuit illustrated in FIG. 63 can not only shape the waveform of the signal current Isignal but also detect the arrival of an input signal.

As described above, by shaping the waveform of the signal current Isignal, the pulse width of the input signal can be narrowed. In this way, as illustrated in FIG. 62, input signals piled up in the signal current Isignal can be separated from each other. For this reason, the filter circuit can detect the arrival of each input signal with high accuracy.

In addition, since the reference voltage applied to the negative input terminal of the comparator Comp is a voltage of a voltage dividing point between the capacitors C3 and C31, an AC component is decreased. Accordingly, fluctuation of the reference voltage can be suppressed. A DC component of the reference voltage is set by the resistor R7.

The output voltage of the waveform shaping filter WSF2 that is input to the positive input terminal of the comparator Comp is a voltage acquired by shifting the level of the gate voltage of the transistor M4 by R3×Idc3. Accordingly, by adjusting the current Idc3, a threshold used for detecting (outputting "1") the arrival of an input signal can be easily set. Thus, also in a case where there is a variation in the threshold voltage of the transistor M4 or in a case where there is an input offset of the comparator Comp, the arrival of an input signal can be detected with high accuracy.

In this example, while the arrival of an input signal is detected by using the comparator Comp, the filter circuit may output the output voltage (the drain voltage of the transistor M4) of the waveform shaping filter WSF2 without including the comparator Comp. In this way, the input current Isignal can be shaped into a signal having a narrow pulse width. In addition, the filter circuit Idc3 may be configured not to include the current source Idc3, the resistor R7, and the capacitor C31.

Second Example

Figure 64:
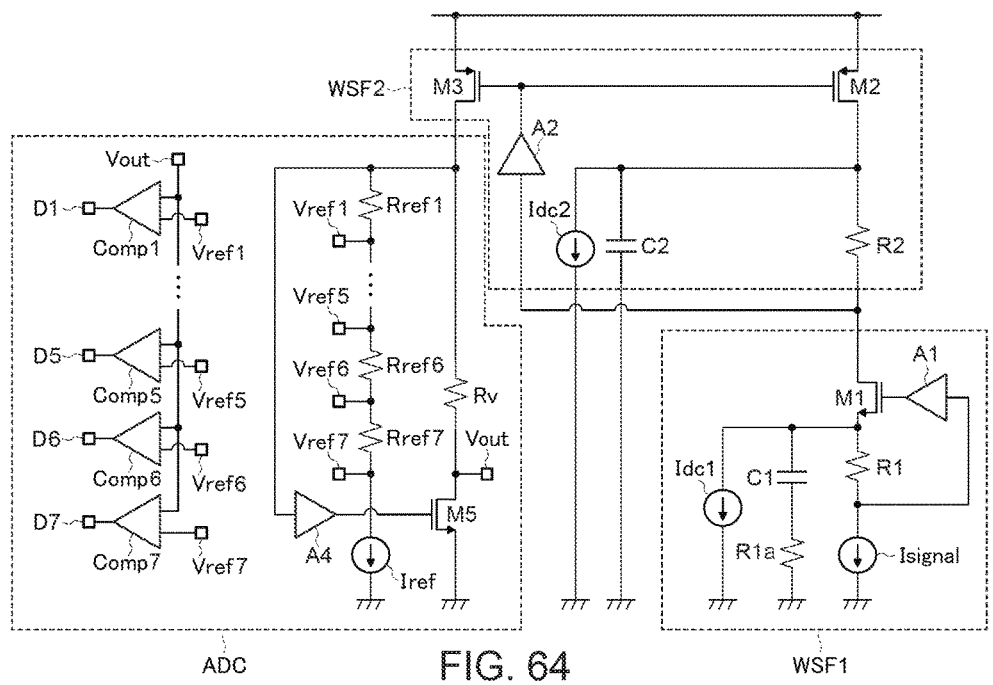
FIG. 64 is a diagram that illustrates a second example of the filter circuit illustrated in FIG. 61.

FIG. 64 is a diagram that illustrates a second example of the filter circuit according to this embodiment. As illustrated in FIG. 64, this filter circuit includes: waveform shaping filters WSF1 and WSF2 and an AD converter ADC.

The waveform shaping filter WSF1 is a waveform shaping filter of the first stage having a configuration similar to that of the waveform shaping filter WSF1 illustrated in FIG. 63.

The waveform shaping filter WSF2 is a waveform shaping filter of the second stage having a configuration similar to that of the waveform shaping filter illustrated in FIG. 7 and includes: transistors M2 and M3; a resistor R2; a capacitor C2; a current source Idc2; and an amplifier A2. The time constant of the waveform shaping filter WSF2 is C2×R2.

The AD converter ADC includes: a resistor Rv; a transistor M5; an amplifier A4; resistors Rref1 to Rref7; comparators Comp1 to Comp7; and a current source Iref.

The resistor Rv includes one end and the other end. One end of the resistor Rv is connected to the drain terminal of the transistor M3, one end of the resistor Rref1, and the input terminal of the amplifier A4. The other end of the resistor Rv is connected to the drain terminal of the transistor M5 and each of the positive input terminals of the comparators Comp1 to Comp7.

The output current of the waveform shaping filter WSF2, in other words, a current flowing through the transistor M3 is converted into a voltage Vout by the resistor Rv and is applied to each of the positive input terminals of the comparators Comp1 to Comp7.

The transistor M5 is an NMOS and includes: a source terminal; a drain terminal; and a gate terminal. The source terminal is grounded. The drain terminal is connected to the other end of the resistor Rv and each of the positive input terminals of the comparators Comp1 to Comp7. The gate terminal is connected to the output terminal of the amplifier A4.

The amplifier A4 is a non-inverting amplifier and includes: a positive input terminal; a negative input terminal; and an output terminal. The positive input terminal is connected to the drain terminal of the transistor M3 and one end of each of the resistors Rv and Rref1. The negative input terminal is grounded (not illustrated in the drawing). The output terminal is connected to the gate terminal of the transistor M5. The input of the amplifier A4 is a virtual grounding point, and, based on the voltage of this virtual grounding point, the reference voltages Vref1 to Vref7 of the comparators Comp1 to Comp7 are generated.

Each of the resistors Rref1 to Rref7 includes one end and the other end. One end of the resistor Rref1 is connected to the drain terminal of the transistor M3, one end of the resistor Rv, and the positive input terminal of the amplifier A4. The other end of the resistor Rref1 is connected to one end of the resistor Rref2 and the negative input terminal of the comparator Comp1. One end of the resistor Rref7 is connected to the other end of the resistor Rref6 and the negative input terminal of the comparator Comp6. The other end of the resistor Rref7 is connected to the negative input terminal of the comparator Comp7 and the current source Iref.

The resistors Rref2 to Rref6 are connected in series between the resistors Rref1 to Rref7. One ends of the resistors Rref2 to Rref6 are respectively connected to the other ends of the resistors Rref1 to Rref5 and the negative input terminals of the comparators Comp1 to Comp5. The other ends of the resistors Rref2 to Rref6 are respectively connected to one ends of the resistors Rref3 to Rref7 and the negative input terminals of the comparators Comp2 to Comp6.

The current source Iref is a DC current source and is connected to the other end of the resistor Rref7 and the negative input terminal of the comparator Comp7. Accordingly, a reference voltage VrefN of the comparator CompN (here, N=1 to 7) is a voltage lower than the voltage of the virtual grounding point of the amplifier A4 by Iref× (Rref1+ . . . +RrefN).

In this way, since the reference voltage VrefN of the comparator CompN can be generated based on the voltage of the virtual grounding point of the amplifier A4, even in a case where the voltage of the virtual grounding point varies due to variations of components, an appropriate reference voltage VrefN can be applied to the comparator CompN.

The comparator CompN (here, N=1 to 7) includes: a negative input terminal; a positive input terminal; and an output terminal. The positive input terminal of the comparator CompN is connected to the other end of the resistor Rv and the drain terminal of the transistor M5. The negative input terminals of the comparators Comp1 to Comp6 are respectively connected to the other ends of the resistors Rref1 to Rref6 and one ends of the resistors Rref2 to Rref7. The negative input terminal of the comparator Comp7 is connected to the other end of the resistor Rref7 and the current source Iref.

The comparator CompN compares the output voltage Vout applied to the positive input terminal with the reference voltage VrefN (threshold) applied to the negative input terminal and outputs a binary digital signal DN. Here, the comparator CompN is configured to output "1" or "0".

The comparator CompN outputs "1" in a case where the output voltage Vout is lower than the reference voltage VrefN and outputs "0" in the other cases. In other words, the AD converter ADC outputs a digital signal that corresponds to the wave height of the output voltage Vout. In a case where seven comparators CompN are included as in this example, the AD converter ADC can execute AD conversion of the wave height of an input signal into seven gray scales.

As described above, the filter circuit illustrated in FIG. 64 can not only shape the waveform of the signal current Isignal but also execute AD conversion of the wave height of the signal current Isignal and output a digital signal corresponding to the wave height.

In the configuration illustrated in FIG. 64, while the AD converter ADC includes seven comparators CompN, N may be arbitrarily selected. In a case where N=1, in other words, in a case where the AD converter ADC includes only one comparator CompN, similarly to the filter circuit illustrated in FIG. 63, the filter circuit can detect the arrival of an input signal. In a case where N≥2, the filter circuit can execute AD conversion of the wave height of the signal current Isignal into N gray scales.

Third Example

Figure 65:
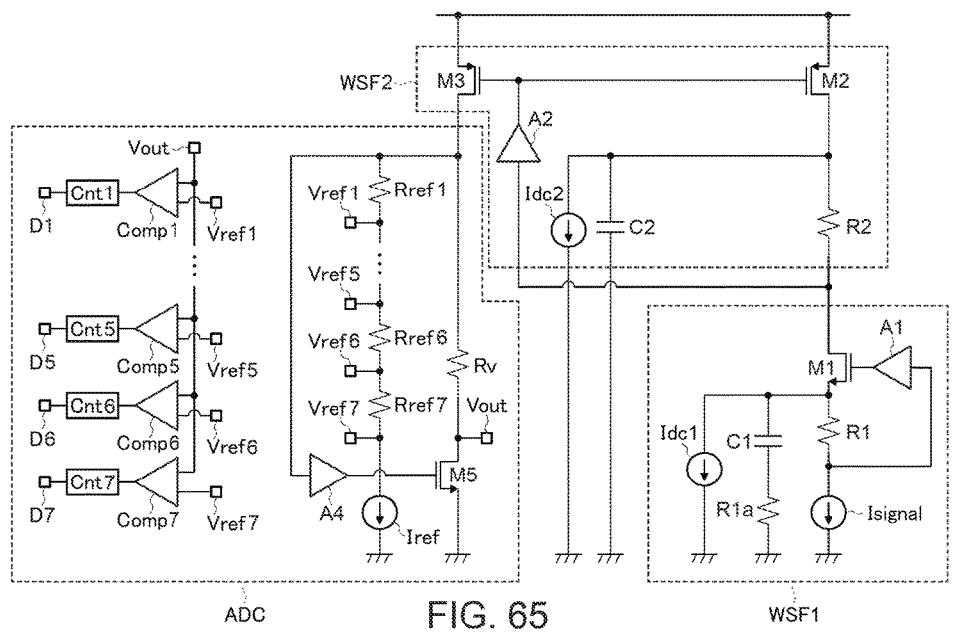
FIG. 65 is a diagram that illustrates a third example of the filter circuit illustrated in FIG. 61.

FIG. 65 is a diagram that illustrates a third example of the filter circuit according to this embodiment. As illustrated in FIG. 65, the AD converter ADC further includes counters Cnt1 to Cnt7. The other configurations are similar to those illustrated in FIG. 64.

The counter CntN (here, N=1 to 7) is connected to the output terminal of the comparator CompN and counts an output result of the comparator CompN. The counter CntN, for example, counts the number of times of outputting "1" from the comparator CompN, in other words, the number of times of inputting an output voltage Vout lower than the reference voltage VrefN to the comparator CompN. Then, the counter CntN outputs a digital signal DN corresponding to a count value CntN at a predetermined time interval.

By employing such a configuration, the latter-stage circuit of the filter circuit acquires the number of input signals each having a wave height between the reference voltage VrefN and the reference voltage Vref(N−1) by calculating a difference between the count value CntN and the count value Cnt(N−1) and can generate a histogram of input signals.

Fourth Example

Figure 66:
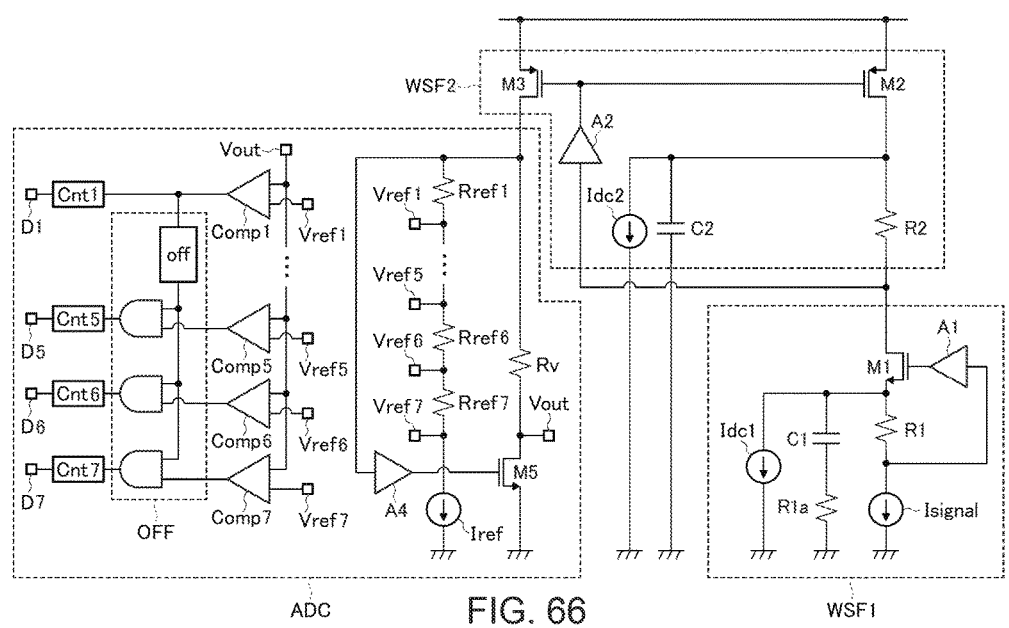
FIG. 66 is a diagram that illustrates a fourth example of the filter circuit illustrated in FIG. 61.

FIG. 66 is a diagram that illustrates a fourth example of the filter circuit according to this embodiment. As illustrated in FIG. 66, the AD converter ADC further includes an off-period generating circuit OFF. The other configurations are similar to those illustrated in FIG. 65.

After the filter circuit detects the arrival of an input signal, the off-period generating circuit OFF stops the observation (AD conversion) of a wave height between a predetermined off-period. The reason for this is as follows.

As described above, in a case where input signals are piled up in the signal current Isignal, the piled-up input signals are separated from each other by the waveform shaping filters WSF1 and WSF2. However, there is concern that there may be an error in the wave height of each separated input signal (for example, a second input signal and a third input signal illustrated in FIG. 62) due to the influence of the piling up.

Thus, in this example, after an input signal is detected, counting using the counters Cnt2 to Cnt7 is stopped by the off-period generating circuit OFF. Accordingly, an error in the detection of a wave height can be suppressed. The off-period may be arbitrarily set.

The off-period generating circuit OFF, for example, as illustrated in FIG. 66, includes an off-signal generator off and AND circuits.

The off-signal generator off receives an output signal of the comparator Comp1 as input and outputs a binary signal corresponding to the output signal. More specifically, after "1" is input from the comparator Comp1, the off-signal generator off outputs "0" (off signal) during the off period and outputs "1" (on signal) during the other periods.

The AND circuits are respectively disposed between the comparators Comp2 to Comp7 and the counters Cnt2 to Cnt7. The output signal of the comparator CompN and the output signal of the off-signal generator off are input to each AND circuit. The AND circuit outputs "1" in a case where "1" is input from the comparator CompN, and "1" is input from the off-signal generator off and outputs "0" in the other cases. The output signal of each AND circuit is input to the counter ContN (here, N=2 to 7). The counter CntN (here, N=2 to 7) counts the number of times of inputting "1" from the AND circuit.

Next, the operation of the off-period generating circuit OFF will be described. In a case where an input signal has not been arrived at this filter circuit, the off-signal generator off outputs "1" (on signal), and the comparators Comp1 to Comp7 output "0". For this reason, the counters Cnt1 to Cnt7 do not execute counting.

When an input signal arrives at this filter circuit, the comparator CompN (here, N=1 to 7) outputs "1" or "0" based on a result of a comparison between the output voltage Vout and the reference voltage VrefN. At this time point, since the off-signal generator off outputs "1", the result of the comparison is counted by the counter CntN.

Thereafter, when "1" is input from the comparator Comp1, the output signal of the off-signal generator off becomes "0" (off signal). The off-signal generator off continuously outputs "0" during the off period. For this reason, during the off period, the output of the AND circuit is "0", and the counting using the counters Cnt2 to Cnt7 is stopped.

After the off period elapses, the output signal of the off-signal generator becomes 1 (on signal). Thereafter, until the next input signal arrives, the off-signal generator off continuously outputs "1".

By employing the configuration described above, even when a piled-up input signal arrives during the off period, a wave height is not detected. Accordingly, a detection error in the piled-up input signal can be suppressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A waveform shaping filter comprising:
   a first resistor that includes one end to which a signal current is input and the other end;
   a first transistor that includes a first terminal connected to the other end of the first resistor, a second terminal, and a control terminal;
   a first capacitor that includes one end connected to the other end of the first resistor and the other end; and
   a first amplifier that includes an input terminal connected to the one end of the first resistor and an output terminal connected to the control terminal of the first transistor.

2. The filter according to claim 1, wherein the first amplifier is an inverting amplifier.

3. The filter according to claim 1, further comprising a second transistor that includes a first terminal, a second terminal, and a control terminal connected to the control terminal of the first transistor,
   wherein the first amplifier is a non-inverting amplifier.

4. The filter according to claim 3, further comprising a low input impedance circuit that includes an input terminal connected to the first terminal of the second transistor and the other end of the first capacitor.

5. The filter according to claim 1, wherein the first amplifier is an amplifier of a current input type.

6. The filter according to claim 1, further comprising a first current source that is connected to the first terminal of the first transistor.

7. The filter according to claim 1, further comprising a second resistor that is connected to the other end of the first capacitor.

8. The filter according to claim 1, wherein a time constant that is the same as any one of one or a plurality of time constants of a low-pass characteristic included in the signal current is included.

9. The filter according to claim 1, wherein the product of a resistance value of the first resistor and a capacitance value of the first capacitor is the same as any one of one or a plurality of time constants of a low-pass characteristic of the signal current.

10. The filter according to claim 1, further comprising a first current mirror circuit that includes an input terminal connected to the other end of the first capacitor and an output terminal connected to the one end of the first capacitor,
    wherein the first current mirror circuit inverts the polarity of a current flowing through the first capacitor and outputs the polarity-inverted current.

11. The filter according to claim 10, wherein the low pass filter includes:
    a third resistor that includes one end connected to the input terminal and the other end; and
    a second capacitor that includes one end connected to the other end of the third resistor and the negative input terminal and the other end.

12. The filter according to claim 10, wherein the voltage current converter includes a third transistor that includes:
    a first terminal connected to a power source, a second terminal connected to the input terminal and one end of the low pass filter, and a control terminal connected to the other end of the low pass filter.

13. The filter according to claim 1, further comprising:
a second current mirror circuit that includes an input terminal connected to the second terminal of the first transistor and an output terminal connected to the other end of the first capacitor; and
a low input impedance circuit that includes an input terminal connected to the output terminal of the second current mirror circuit,
wherein the second current mirror circuit inverts the polarity of a current flowing through the first transistor and outputs the polarity-inverted current.

14. The filter according to claim 1, further comprising:
a tenth resistor that is connected between the other end of the first resistor and the first terminal of the first transistor;
a voltage buffer that includes an input terminal connected to the other end of the first resistor and an output terminal; and
an eleventh capacitor that includes one end connected to the first terminal of the first transistor and the other end connected to the output terminal of the voltage buffer.

15. The filter according to claim 1, further comprising:
an eleventh resistor that is connected between the other end of the first resistor and the first terminal of the first transistor;
a current buffer that includes an output terminal connected to the first terminal of the first transistor and an input terminal; and
a twelfth capacitor that includes one end connected to the other end of the first resistor and the other end connected to the input terminal of the current buffer.

16. The filter according to claim 1, further comprising:
a twelfth resistor that includes one end connected to the one end of the first resistor and the other end;
a voltage buffer that includes an input terminal connected to the other end of the twelfth resistor and an output terminal; and
a thirteenth capacitor that includes one end connected to the one end of the first resistor and the other end connected to the output terminal of the voltage buffer.

17. A waveform shaping filter comprising:
a first resistor that includes one end to which a signal voltage is input and the other end;
a first capacitor that includes one end connected to the one end of the first resistor and the other end connected to the other end of the first resistor;
a second amplifier that includes a negative input terminal connected to the other end of the first resistor, a positive input terminal applied with a predetermined voltage, an output terminal, a first inverter circuit, a first voltage generating circuit, and a second voltage generating circuit; and
a second resistor that includes one end connected to the negative input terminal and the other end connected to the output terminal,
wherein the first inverter circuit includes:
  a first transistor that includes a first terminal, a second terminal connected to the output terminal, and a control terminal connected to the negative input terminal; and
  a second transistor that includes a first terminal, a second terminal connected to the output terminal, and a control terminal connected to the negative input terminal,
wherein the first voltage generating circuit includes:
  a first current source that supplies a predetermined current;
  a third transistor that includes a first terminal connected to the first terminal of the first transistor, a second terminal connected to the first current source, and a control terminal connected to the positive input terminal; and
  a fourth transistor that includes a first terminal, a second terminal connected to the first terminal of the third transistor, and a control terminal connected to the second terminal of the third transistor, and
wherein the second voltage generating circuit includes:
  a second current source that supplies a predetermined current;
  an fifth transistor that includes a first terminal connected to the first terminal of the second transistor, a second terminal connected to the second current source, and a control terminal connected to the positive input terminal; and
  a sixth transistor that includes a first terminal, a second terminal connected to the first terminal of the fifth transistor, and a control terminal connected to the second terminal of the fifth transistor.

18. A waveform shaping filter comprising:
a first amplifier that includes a negative input terminal, a positive input terminal to which a signal voltage is input, an output terminal, a first inverter circuit, a first voltage generating circuit, and a second voltage generating circuit;
a first resistor that includes one end connected to the negative input terminal and the other end connected to the output terminal; and
a first capacitor that includes one end connected to the negative input terminal and the other end,
wherein the first inverter circuit includes:
  a first transistor that includes a first terminal, a second terminal connected to the output terminal, and a control terminal connected to the negative input terminal; and
  a second transistor that includes a first terminal, a second terminal connected to the output terminal, and a control terminal connected to the negative input terminal,
wherein the first voltage generating circuit includes:
  a first current source that supplies a predetermined current;
  a third transistor that includes a first terminal connected to the first terminal of the first transistor, a second terminal connected to the first current source, and a control terminal connected to the positive input terminal; and
  a fourth transistor that includes a first terminal, a second terminal connected to the first terminal of the third transistor, and a control terminal connected to the second terminal of the third transistor, and
wherein the second voltage generating circuit includes:
  a second current source that supplies a predetermined current;
  a fifth transistor that includes a first terminal connected to the first terminal of the second transistor, a second terminal connected to the fifth current source, and a control terminal connected to the positive input terminal; and
  a sixth transistor that includes a first terminal, a second terminal connected to the first terminal of the fifth transistor, and a control terminal connected to the second terminal of the fifth transistor.

19. A waveform shaping filter comprising:
a first resistor that includes one end connected to a first reference voltage line and the other end to which a signal current is input;
a first amplifier that includes a first input terminal connected to the other end of the first resistor, a second input terminal, and an output terminal;
a first transistor that includes a first terminal connected to the second input terminal of the first amplifier, a second terminal, and a control terminal connected to the output terminal of the first amplifier;
a second resistor that includes one end connected to the first reference voltage line and the other end connected to the second input terminal of the first amplifier; and
a first capacitor that includes one end and the other end connected to the second input terminal of the first amplifier.

20. The filter according to claim 19, further comprising a current source connected to the first terminal of the first transistor.

21. The filter according to claim 19, further comprising a third resistor connected between the other end of the first capacitor and the second input terminal of the first amplifier.

22. The filter according to claim 19, further comprising a second capacitor connected between the first reference voltage line and the other end of the first resistor.

23. The filter according to claim 19, further comprising a first current mirror circuit that includes an input terminal connected to the one end of the first capacitor and an output terminal connected to the other end of the first capacitor,
wherein the first current mirror circuit inverts the polarity of a current flowing through the first capacitor and outputs the polarity-inverted current.

24. The filter according to claim 19, further comprising:
a second current mirror circuit that includes an input terminal connected to the second terminal of the first transistor and an output terminal connected to the one end of the first capacitor; and
a low input impedance circuit that includes an input terminal connected to the output terminal of the second current mirror circuit,
wherein the second current mirror circuit inverts the polarity of a current flowing through the first transistor and outputs the polarity-inverted current.

25. The filter according to claim 19, further comprising:
an fourth resistor that is connected between the other end of the second resistor and the first terminal of the first transistor;
a voltage buffer that includes an input terminal connected to the other end of the second resistor and an output terminal; and
a third capacitor that includes one end connected to the first terminal of the first transistor and the other end connected to the output terminal of the voltage buffer.

26. The filter according to claim 19, further comprising:
a fifth resistor that is connected between the other end of the second resistor and the second input terminal of the first amplifier;
a current buffer that includes an output terminal connected to the other end of the second resistor and an input terminal; and
a fourth capacitor that includes one end connected to the second input terminal of the first amplifier and the other end connected to the input terminal of the current buffer.

27. A radiation detection device comprising:
a photon detector that outputs a signal current corresponding to an energy level of incident radiation photons; and
a filter circuit that includes at least one stage of a waveform shaping filter, the waveform shaping filter comprising:
a first resistor that includes one end to which a signal current is input and the other end;
a first transistor that includes a first terminal connected to the other end of the first resistor, a second terminal, and a control terminal;
a first capacitor that includes one end connected to the other end of the first resistor and the other end; and
a first amplifier that includes an input terminal connected to the one end of the first resistor and an output terminal connected to the control terminal of the first transistor.

28. The radiation detection device according to claim 27, wherein the photon detector includes:
a scintillator that generates scintillation light corresponding to the energy level of the radiation photons; and
a photomultiplier that outputs the signal current corresponding to an energy level of the scintillation light,
wherein the filter circuit includes:
the filter that has a same time constant as a time constant of the scintillator; and
the filter that has a same time constant as a time constant of the photomultiplier.

29. The radiation detection device according to claim 27, wherein the filter circuit further includes N comparators respectively comparing an output of the filter with N ($\geq 1$) thresholds.

30. The radiation detection device according to claim 29, wherein the filter circuit further includes counters that count output results of the comparators.

31. The radiation detection device according to claim 30, wherein the filter circuit further includes an off-period generating circuit that stops counting using some of the counters during a predetermined off-period after an input signal is detected.

* * * * *